United States Patent
Abraham et al.

(10) Patent No.: US 10,190,230 B2
(45) Date of Patent: Jan. 29, 2019

(54) CROSS FLOW MANIFOLD FOR ELECTROPLATING APPARATUS

(71) Applicant: Novellus Systems, Inc., Fremont, CA (US)

(72) Inventors: Richard Abraham, Sherwood, OR (US); Steven T. Mayer, Aurora, OR (US); Bryan L. Buckalew, Tualatin, OR (US); Robert Rash, West Linn, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 15/448,472

(22) Filed: Mar. 2, 2017

(65) Prior Publication Data
US 2017/0175286 A1 Jun. 22, 2017

Related U.S. Application Data

(60) Division of application No. 13/893,242, filed on May 13, 2013, now Pat. No. 9,624,592, which is a
(Continued)

(51) Int. Cl.
*C25D 17/06* (2006.01)
*C25D 17/00* (2006.01)
(Continued)

(52) U.S. Cl.
CPC ............... *C25D 5/08* (2013.01); *C25D 7/12* (2013.01); *C25D 7/123* (2013.01); *C25D 17/001* (2013.01);
(Continued)

(58) Field of Classification Search
CPC ...... C25D 17/06; C25D 17/001; C25D 21/12; C25D 17/00; C25D 17/007; C25D 5/18; C25D 3/38; C25D 5/04; C25D 3/00
(Continued)

(56) References Cited

U.S. PATENT DOCUMENTS 3,652,442 A 3/1972 Powers et al.
3,706,651 A 12/1972 Leland
(Continued)

FOREIGN PATENT DOCUMENTS

CN 1353778 A 6/2002
CN 1551931 A 12/2004
(Continued)

OTHER PUBLICATIONS

US Office Action dated Oct. 26, 2007 issued in U.S. Appl. No. 11/040,359.
(Continued)

*Primary Examiner* — Zulmariam Mendez
(74) *Attorney, Agent, or Firm* — Weaver Austin Villenueve & Sampson LLP

(57) ABSTRACT

The embodiments herein relate to methods and apparatus for electroplating one or more materials onto a substrate. In many cases the material is a metal and the substrate is a semiconductor wafer, though the embodiments are no so limited. Typically, the embodiments herein utilize a channeled plate positioned near the substrate, creating a cross flow manifold defined on the bottom by the channeled plate, on the top by the substrate, and on the sides by a cross flow confinement ring. During plating, fluid enters the cross flow manifold both upward through the channels in the channeled plate, and laterally through a cross flow side inlet positioned on one side of the cross flow confinement ring. The flow paths combine in the cross flow manifold and exit at the cross flow exit, which is positioned opposite the cross flow inlet. These combined flow paths result in improved plating uniformity.

15 Claims, 28 Drawing Sheets

Related U.S. Application Data continuation-in-part of application No. 13/172,642, filed on Jun. 29, 2011, now Pat. No. 8,795,480.

(60) Provisional application No. 61/405,608, filed on Oct. 21, 2010, provisional application No. 61/374,911, filed on Aug. 18, 2010, provisional application No. 61/361,333, filed on Jul. 2, 2010, provisional application No. 61/646,597, filed on May 14, 2012, provisional application No. 61/736,499, filed on Dec. 12, 2012.

(51) Int. Cl.
*C25D 5/18* (2006.01)
*C25D 5/04* (2006.01)
*C25D 3/00* (2006.01)
*C25D 5/08* (2006.01)
*C25D 7/12* (2006.01)
*C25D 17/02* (2006.01)
*C25D 21/10* (2006.01)
*C25D 17/08* (2006.01)
*H01L 21/288* (2006.01)
*H01L 21/768* (2006.01)
*H01L 23/00* (2006.01)

(52) U.S. Cl.
CPC .............. *C25D 17/02* (2013.01); *C25D 17/08* (2013.01); *C25D 21/10* (2013.01); *H01L 21/2885* (2013.01); *H01L 21/76879* (2013.01); *H01L 21/76898* (2013.01); *H01L 24/11* (2013.01); *H01L 2224/11462* (2013.01); *H01L 2224/13111* (2013.01); *H01L 2224/13147* (2013.01); *H01L 2224/13155* (2013.01)

(58) Field of Classification Search
USPC .......................................................... 205/96
See application file for complete search history.

(56) References Cited

U.S. PATENT DOCUMENTS

| | | |
|---|---|---|
| 3,862,891 A | 1/1975 | Smith |
| 4,033,833 A | 7/1977 | Bestel et al. |
| 4,082,638 A | 4/1978 | Jumer |
| 4,240,886 A | 12/1980 | Hodges et al. |
| 4,272,335 A | 6/1981 | Combs |
| 4,304,641 A | 12/1981 | Grandia et al. |
| 4,427,520 A | 1/1984 | Bahnsen et al. |
| 4,469,564 A | 9/1984 | Okinaka et al. |
| 4,545,877 A | 10/1985 | Hillis |
| 4,604,177 A | 8/1986 | Sivilotti |
| 4,604,178 A | 8/1986 | Flegener et al. |
| 4,605,482 A | 8/1986 | Shirgami et al. |
| 4,633,893 A | 1/1987 | McConnell |
| 4,696,729 A | 9/1987 | Santini |
| 4,738,272 A | 4/1988 | McConnell |
| 4,828,654 A | 5/1989 | Reed |
| 4,856,544 A | 8/1989 | McConnell |
| 4,906,346 A | 3/1990 | Hadersbeck et al. |
| 4,931,149 A | 6/1990 | Stierman et al. |
| 4,933,061 A | 6/1990 | Kulkami et al. |
| 5,039,381 A | 8/1991 | Mullarkey |
| 5,078,852 A | 1/1992 | Yee et al. |
| 5,096,550 A | 3/1992 | Mayer et al. |
| 5,146,136 A | 9/1992 | Ogura et al. |
| 5,156,730 A | 10/1992 | Bhatt et al. |
| 5,162,079 A | 11/1992 | Brown |
| 5,217,586 A | 6/1993 | Datta et al. |
| 5,316,642 A | 5/1994 | Young, Jr. et al. |
| 5,368,711 A | 11/1994 | Poris |
| 5,391,285 A | 2/1995 | Lytle et al. |
| 5,421,987 A | 6/1995 | Tzanavaras et al. |
| 5,443,707 A | 8/1995 | Mori |
| 5,472,592 A | 12/1995 | Lowery |
| 5,476,578 A | 12/1995 | Forand |
| 5,498,325 A | 3/1996 | Nishimura et al. |
| 5,516,412 A | 5/1996 | Andricacos et al. |
| 5,567,300 A | 10/1996 | Datta et al. |
| 5,660,699 A | 8/1997 | Saito et al. |
| 5,723,028 A | 3/1998 | Poris |
| 5,744,019 A | 4/1998 | Ang |
| 5,935,402 A | 8/1999 | Fanti |
| 6,004,440 A | 12/1999 | Hanson et al. |
| 6,027,631 A | 2/2000 | Broadbent |
| 6,080,291 A | 6/2000 | Woodruff et al. |
| 6,106,687 A | 8/2000 | Edelstein |
| 6,126,798 A | 10/2000 | Reid et al. |
| 6,132,587 A | 10/2000 | Jorne et al. |
| 6,132,805 A | 10/2000 | Moslehi |
| 6,179,983 B1 | 1/2001 | Reid et al. |
| 6,193,860 B1 | 2/2001 | Weling |
| 6,228,231 B1 | 5/2001 | Uzoh |
| 6,251,255 B1 | 6/2001 | Copping et al. |
| 6,254,742 B1 | 7/2001 | Hanson et al. |
| 6,261,433 B1 | 7/2001 | Landau |
| 6,368,475 B1 | 4/2002 | Hanson et al. |
| 6,391,166 B1 | 5/2002 | Wang |
| 6,391,188 B1 | 5/2002 | Goosey |
| 6,395,152 B1 | 5/2002 | Wang |
| 6,398,926 B1 | 6/2002 | Mahneke |
| 6,402,923 B1 | 6/2002 | Mayer et al. |
| 6,431,908 B1 | 8/2002 | Beck et al. |
| 6,454,918 B1 | 9/2002 | Sakaki |
| 6,497,801 B1 | 12/2002 | Woodruff et al. |
| 6,514,570 B1 | 2/2003 | Matsuyama et al. |
| 6,521,102 B1 | 2/2003 | Dordi |
| 6,527,920 B1 | 3/2003 | Jackson et al. |
| 6,551,483 B1 | 4/2003 | Mayer et al. |
| 6,627,051 B2 | 9/2003 | Berner et al. |
| 6,632,335 B2 | 10/2003 | Kunisawa et al. |
| 6,755,954 B2 | 6/2004 | Mayer et al. |
| 6,773,571 B1 | 8/2004 | Mayer et al. |
| 6,800,187 B1 | 10/2004 | Reid et al. |
| 6,821,407 B1 | 11/2004 | Reid et al. |
| 6,843,855 B2 | 1/2005 | Verhaverbeke |
| 6,869,515 B2 | 3/2005 | Cohen |
| 6,890,416 B1 | 5/2005 | Mayer et al. |
| 6,919,010 B1 | 7/2005 | Mayer et al. |
| 6,921,468 B2 | 7/2005 | Graham et al. |
| 6,964,792 B1 | 11/2005 | Mayer et al. |
| 7,070,686 B2 | 7/2006 | Contolini et al. |
| 7,169,705 B2 | 1/2007 | Ide et al. |
| D544,452 S | 6/2007 | Nakamura et al. |
| D548,705 S | 8/2007 | Hayashi |
| D552,565 S | 10/2007 | Nakamura et al. |
| D553,104 S | 10/2007 | Oohashi et al. |
| 7,387,131 B2 | 6/2008 | Kuroda et al. |
| D587,222 S | 2/2009 | Sasaki et al. |
| 7,622,024 B1 | 11/2009 | Mayer et al. |
| 7,641,776 B2 | 1/2010 | Nagar et al. |
| D609,652 S | 2/2010 | Nagasaka et al. |
| D609,655 S | 2/2010 | Sugimoto |
| 7,670,465 B2 | 3/2010 | Yang et al. |
| D614,593 S | 4/2010 | Lee et al. |
| 7,837,841 B2 | 11/2010 | Chen et al. |
| 7,854,828 B2 | 12/2010 | Reid et al. |
| 7,935,240 B2 | 5/2011 | Singh et al. |
| 7,967,969 B2 | 6/2011 | Mayer et al. |
| D648,289 S | 11/2011 | Mayer et al. |
| 8,308,931 B2 | 11/2012 | Reid et al. |
| 8,623,193 B1 | 1/2014 | Mayer et al. |
| 8,795,480 B2 | 8/2014 | Mayer et al. |
| 9,394,620 B2 | 7/2016 | Mayer et al. |
| 9,449,808 B2 | 9/2016 | Buckalew et al. |
| 9,464,361 B2 | 10/2016 | Mayer et al. |
| 9,523,155 B2 | 12/2016 | Mayer et al. |
| 9,624,592 B2 | 4/2017 | Abraham et al. |
| 9,834,852 B2 | 12/2017 | Mayer et al. |
| 9,899,230 B2 | 2/2018 | Buckalew et al. |
| 10,094,034 B2 | 10/2018 | Graham et al. |
| 2002/0017456 A1 | 2/2002 | Graham et al. |

(56) References Cited

U.S. PATENT DOCUMENTS

| | | |
|---|---|---|
| 2002/0062839 A1 | 5/2002 | Verhaverbeke et al. |
| 2002/0066464 A1 | 6/2002 | Bergman |
| 2002/0084189 A1 | 7/2002 | Wang et al. |
| 2002/0088708 A1 | 7/2002 | Sakaki |
| 2002/0119671 A1 | 8/2002 | Lee |
| 2002/0125141 A1 | 9/2002 | Wilson et al. |
| 2002/0164840 A1 | 11/2002 | Lu et al. |
| 2002/0166773 A1 | 11/2002 | Cohen |
| 2003/0017647 A1 | 1/2003 | Kwon et al. |
| 2003/0019755 A1 | 1/2003 | Hey et al. |
| 2003/0029527 A1 | 2/2003 | Yajima et al. |
| 2003/0038035 A1 | 2/2003 | Wilson et al. |
| 2003/0102210 A1 | 6/2003 | Woodruff et al. |
| 2003/0201166 A1 | 10/2003 | Zheng et al. |
| 2004/0000487 A1 | 1/2004 | Bonkass et al. |
| 2004/0053147 A1 | 3/2004 | Ito |
| 2004/0118694 A1 | 6/2004 | Yang et al. |
| 2004/0149584 A1 | 8/2004 | Nagai et al. |
| 2004/0168926 A1 | 9/2004 | Basol et al. |
| 2004/0231989 A1 | 11/2004 | Kobata et al. |
| 2004/0256238 A1 | 12/2004 | Suzuki et al. |
| 2005/0003737 A1 | 1/2005 | Montierth et al. |
| 2005/0045488 A1 | 3/2005 | Paneccasio et al. |
| 2005/0053874 A1 | 3/2005 | Yoshihara et al. |
| 2005/0145482 A1 | 7/2005 | Suzuki et al. |
| 2005/0145499 A1 | 7/2005 | Kovarsky et al. |
| 2005/0161336 A1 | 7/2005 | Woodruff et al. |
| 2005/0181252 A1 | 8/2005 | Risen et al. |
| 2006/0038182 A1 | 2/2006 | Rogers et al. |
| 2006/0054181 A1 | 3/2006 | Rayandayan et al. |
| 2006/0243598 A1 | 11/2006 | Singh et al. |
| 2007/0015080 A1 | 1/2007 | Toukhy et al. |
| 2007/0029193 A1 | 2/2007 | Brcka |
| 2007/0068819 A1 | 3/2007 | Singh et al. |
| 2010/0032303 A1 | 2/2010 | Reid et al. |
| 2010/0032304 A1 | 2/2010 | Mayer et al. |
| 2010/0032310 A1 | 2/2010 | Reid et al. |
| 2010/0035192 A1 | 2/2010 | Ando et al. |
| 2010/0044236 A1 | 2/2010 | Mayer et al. |
| 2010/0116672 A1 | 5/2010 | Mayer et al. |
| 2010/0243462 A1 | 9/2010 | Cohen |
| 2011/0031112 A1 | 2/2011 | Birang et al. |
| 2012/0000786 A1 | 1/2012 | Mayer et al. |
| 2012/0258408 A1 | 10/2012 | Mayer et al. |
| 2012/0261254 A1 | 10/2012 | Reid et al. |
| 2013/0313123 A1 | 11/2013 | Abraham et al. |
| 2014/0183049 A1 | 7/2014 | Mayer et al. |
| 2014/0299477 A1 | 10/2014 | Mayer et al. |
| 2014/0299478 A1 | 10/2014 | Mayer et al. |
| 2014/0357089 A1 | 12/2014 | Buckalew et al. |
| 2016/0265132 A1 | 9/2016 | Graham et al. |
| 2016/0343582 A1 | 11/2016 | Buckalew et al. |
| 2016/0376722 A1 | 12/2016 | Mayer et al. |
| 2017/0029973 A1 | 2/2017 | Mayer et al. |
| 2017/0058417 A1 | 3/2017 | Graham et al. |
| 2017/0175286 A1 | 6/2017 | Abraham et al. |
| 2017/0342583 A1 | 11/2017 | Thorkelsson et al. |
| 2017/0342590 A1 | 11/2017 | Thorkelsson et al. |
| 2018/0105949 A1 | 4/2018 | Mayer et al. |
| 2018/0258546 A1 | 9/2018 | Graham et al. |

FOREIGN PATENT DOCUMENTS

| | | |
|---|---|---|
| CN | 101220500 A | 7/2008 |
| CN | 101736376 A | 6/2010 |
| CN | 102330140 A | 1/2012 |
| CN | 201130081716.6 | 4/2012 |
| CN | 102459717 A | 5/2012 |
| CN | 102732924 A | 10/2012 |
| CN | 103866374 A | 6/2014 |
| EP | 0 037 325 | 3/1981 |
| EP | 0 233 184 | 8/1987 |
| EP | 1 391 540 | 2/2004 |
| EP | 1 538 662 | 6/2005 |
| GB | 2 176 908 | 1/1987 |
| GB | 2 206 733 | 1/1989 |
| JP | 59-162298 | 9/1984 |
| JP | 09-53197 | 2/1997 |
| JP | 10-036997 A | 10/1998 |
| JP | 2000-87299 A | 3/2000 |
| JP | 2001-064795 A | 3/2001 |
| JP | 2001-316887 | 11/2001 |
| JP | 2002-289568 | 10/2002 |
| JP | 2003-268591 | 9/2003 |
| JP | 2004-068158 A | 3/2004 |
| JP | 2004-250785 A | 9/2004 |
| JP | 2005/344133 | 12/2015 |
| KR | 10-2006-0048645 A | 5/2006 |
| KR | 10-0707121 | 4/2007 |
| KR | 0657600 | 8/2012 |
| TW | 200302519 | 8/2003 |
| TW | 591122 B | 6/2004 |
| TW | 201204877 A1 | 2/2012 |
| TW | D148167 | 7/2012 |
| WO | WO 87/00094 | 1/1987 |
| WO | WO 1999/041434 | 8/1999 |
| WO | WO 00/61837 | 10/2000 |
| WO | WO 01/68952 A1 | 9/2001 |
| WO | WO 02/01609 | 1/2002 |
| WO | WO 2003/018879 | 6/2003 |
| WO | WO 2004/114372 | 12/2004 |
| WO | WO 2007/128659 | 11/2007 |
| WO | WO 2010/144330 | 12/2010 |

OTHER PUBLICATIONS

US Final Office Action dated Jul. 25, 2008 issued in U.S. Appl. No. 11/040,359.

US Office Action dated Jan. 8, 2009 issued in U.S. Appl. No. 11/040,359.

US Notice of Allowance dated Jul. 20, 2009 issued in U.S. Appl. No. 11/040,359.

US Office Action dated Oct. 6, 2010 issued in U.S. Appl. No. 12/578,310.

US Notice of Allowance dated Mar. 4, 2011 issued in U.S. Appl. No. 12/578,310.

US Office Action dated Oct. 5, 2012 issued in U.S. Appl. No. 13/110,759.

US Office Action dated Sep. 19, 2011 issued in U.S. Appl. No. 12/291,356.

US Final Office Action dated Feb. 27, 2012 issued in U.S. Appl. No. 12/291,356.

US Notice of Allowance dated Jul. 27, 2012 issued in U.S. Appl. No. 12/291,356.

US Office Action dated Jun. 24, 2011 issued in U.S. Appl. No. 12/481,503.

US Final Office Action dated Mar. 1, 2012 issued in U.S. Appl. No. 12/481,503.

US Office Action dated Jul. 9, 2012 issued in U.S. Appl. No. 12/481,503.

US Final Office Action dated Dec. 19, 2012 issued in U.S. Appl. No. 12/481,503.

US Office Action dated Jun. 24, 2011 issued in U.S. Appl. No. 12/606,030.

US Final Office Action dated Mar. 1, 2012 issued in U.S. Appl. No. 12/606,030.

US Office Action dated Jul. 13, 2012 issued in U.S. Appl. No. 12/606,030.

US Final Office Action dated Dec. 17, 2012 issued in U.S. Appl. No. 12/606,030.

US Notice of Allowance dated Aug. 10, 2011 issued in Design U.S. Appl. No. 29/377,521.

US Office Action dated Jun. 26, 2013 issued in U.S. Appl. No. 13/172,642.

US Final Office Action dated Jan. 15, 2014 issued in U.S. Appl. No. 13/172,642.

US Notice of Allowance dated Mar. 27, 2014 issued in U.S. Appl. No. 13/172,642.

(56) References Cited

OTHER PUBLICATIONS

US Office Action dated Jan. 14, 2016 issued in U.S. Appl. No. 14/309,723.
US Notice of Allowance dated Jun. 9, 2016 issued in U.S. Appl. No. 14/309,723.
US Notice of Allowability dated Sep. 13, 2016 issued in U.S. Appl. No. 14/309,723.
US Office Action dated Nov. 2, 2015 issued in U.S. Appl. No. 13/893,242.
US Office Action dated May 18, 2016 issued in U.S. Appl. No. 13/893,242.
US Notice of Allowance dated Dec. 8, 2016 issued in U.S. Appl. No. 13/893,242.
US Office Action dated Aug. 18, 2015 issued in U.S. Appl. No. 14/308,258.
US Notice of Allowance dated Jan. 12, 2016 issued in U.S. Appl. No. 14/308,258.
US Office Action dated Feb. 1, 2016 issued in U.S. Appl. No. 14/103,395.
US Notice of Allowance dated Jul. 15, 2016 issued in U.S. Appl. No. 14/103,395.
US Notice of Allowance (Corrected Notice of Allowability) dated Aug. 24, 2016 issued in U.S. Appl. No. 14/103,395.
US Notice of Allowance (Corrected Notice of Allowability) dated Nov. 16, 2016 issued in U.S. Appl. No. 14/103,395.
US Office Action dated Oct. 15, 2014 issued in U.S. Appl. No. 13/904,283.
US Notice of Allowance dated May 5, 2015 issued in U.S. Appl. No. 13/904,283.
US Notice of Allowance dated Feb. 1, 2016 issued in U.S. Appl. No. 13/904,283.
US Notice of Allowance dated Aug. 2, 2016 issued in U.S. Appl. No. 13/904,283.
PCT International Search Report and Written Opinion dated Jan. 12, 2011 issued in Application No. PCT/US2010/037520.
Chinese Office Action dated Jul. 19, 2011 issued in Application No. CN 201130081716.6.
Taiwan Office Action dated Nov. 28, 2011 issued in Application No. TW 100301923.
Korean Office Action dated Apr. 20, 2012 issued in Application No. KR 20110012881.
Chinese First Office Action dated Jan. 20, 2015 issued in Application No. CN 201110192296.8.
Chinese Second Office Action [no translation] dated Sep. 23, 2015 issued in Application No. CN 201110192296.8.
Chinese Third Office Action dated Jan. 15, 2016 issued in Application No. CN 201110192296.8.
Chinese Fourth Office Action dated May 5, 2016 issued in Application No. CN 201110192296.8.
Taiwan Office Action dated Apr. 8, 2015 issued in Application No. TW 100123415.
Taiwan Office Action and Search Report dated Mar. 4, 2016 issued in Application No. TW 104127539.
Taiwan Office Action and Search Report dated Aug. 5, 2016 issued in Application No. TW 102117113.
Austrian Office Action dated Aug. 14, 2014 issued in A50817/2013.
Austrian Search Report dated Dec. 5, 2014 issued in A50817/2013.
Chinese First Office Action dated Nov. 26, 2015 issued in CN 201310683415.9.
Chinese Second Office Action dated Aug. 3, 2016 issued in CN 201310683415.9.
*Electrochemical Methods: Fundamentals and Applications*, Bard & Faulkner eds. Chapter 8, Dec. 2000, pp. 280-292.
Fang et al. (2004) "Uniform Copper Electroplating on Resistive Substrates," Abs. 167, 205th Meeting, The Electrochemical Society, Inc., 1 page.
Lowenheim, (1978) "Electroplating," *Sponsored by the American Electroplaters' Society*, McGraw-Hill Book Company, New York, p. 139.
Malmstadt et al., (1994) "Microcomputers and Electronic Instrumentation: Making the Right Connections," American Chemical Society, p. 255.
"Release of Sabre™ electrofill tool with HRVA by Novellus Systems, Inc." dated prior to Jun. 2011 (3 pages).
Schwartz, Daniel T. et al., (1987) "Mass-Transfer Studies in a Plating Cell with a Reciprocating Paddle," *Journal of the Electrochemical Society*, 134(7):1639-1645.
Wilson, Gregory J. et al., (2005) "Unsteady Numerical Simulation of the Mass Transfer within a Reciprocating Paddle Electroplating Cell," *Journal of The Electrochemical Society*, 152(6):C356-C365.
U.S. Appl. No. 13/110,759, filed May 18, 2011, Mayer et al.
U.S. Appl. No. 14/924,124, filed Oct. 27, 2015, Graham et al.
U.S. Appl. No. 15/225,716, filed Aug. 1, 2016, Thorkelsson et al.
U.S. Appl. No. 15/413,252, filed Jan. 23, 2017, Thorkelsson et al.
US Office Action dated Apr. 6, 2017 issued in U.S. Appl. No. 15/291,543.
US Notice of Allowance dated Jul. 28, 2017 issued in U.S. Appl. No. 15/291,543.
US Office Action dated May 26, 2017 issued in U.S. Appl. No. 15/231,623.
Korean Office Action dated Mar. 14, 2017 issued in Application No. KR 10-2011-0066023.
Korean Office Action dated Aug. 11, 2017 issued in Application No. KR 10-2011-0066023.
Taiwan Examination and Search Report dated Apr. 14, 2017 issued in TW 102145866.
Akire et al., (Nov. 1982) "High-Speed Selective Electroplating with Single Circular Jets," *J. Electrochem. Soc.: Electrochemical Science and Technology*, 129(11):2424-2432.
US Office Action dated Apr. 13, 2018 issued in U.S. Appl. No. 15/261,244.
US Notice of Allowance dated Sep. 20, 2017 issued in U.S. Appl. No. 15/231,623.
US Office Action dated Feb. 9, 2018 issued in U.S. Appl. No. 14/924,124.
Chinese First Office Action dated Feb. 5, 2018 issued in Application No. CN 201610916461.2.
Korean First Office Action dated Mar. 5, 2018 issued in Application No. KR 10-2017-0168351.
Taiwan First Office Action dated Mar. 21, 2018 issued in Application No. TW 106132551.
Japanese First Office Action dated Dec. 21, 2017 issued in Application No. JP 2013-257021.
Taiwan Notice of Allowance and Search Report dated Oct. 31, 2017 issued in Application No. TW 103118470.
Chinese First Office Action dated Mar. 2, 2018 issued in Application No. CN 201610756695.5.
U.S. Appl. No. 15/455,011, filed Mar. 9, 2017, Graham et al.
U.S. Appl. No. 15/707,805, filed Sep. 18, 2017, Banik et al.
U.S. Appl. No. 15/846,029, filed Dec. 18, 2017, Buckalew et al.
U.S. Final Office Action dated Oct. 16, 2018 issued in U.S. Appl. No. 15/261,244.
U.S. Office Action dated Oct. 30, 2018 issued in U.S. Appl. No. 15/413,252.
U.S. Notice of Allowance dated Oct. 30, 2018 issued in U.S. Appl. No. 15/161,081.
Japanese Second Office Action dated Sep. 26, 2018 issued in Application No. JP 2013-257021.
Chinese First Office Action dated Oct. 8, 2018 issued in Application No. CN 201710374684.5.
Korean Decision for Grant of Patent dated Sep. 21, 2018 issued in Application No. KR 10-2017-0168351.

CROSS FLOW MANIFOLD FOR ELECTROPLATING APPARATUS

CROSS-REFERENCE TO RELATED APPLICATIONS

This application is a divisional of U.S. application Ser. No. 13/893,242, filed May 13, 2013, and titled "CROSS FLOW MANIFOLD FOR ELECTROPLATING APPARATUS," which is a continuation-in-part of U.S. patent application Ser. No. 13/172,642 (now U.S. Pat. No. 8,795,480), filed Jun. 29, 2011, and titled "CONTROL OF ELECTROLYTE HYDRODYNAMICS FOR EFFICIENT MASS TRANSFER DURING ELECTROPLATING," which claims benefit of prior to U.S. Provisional Application Nos. 61/405,608, filed Oct. 21, 2010, and titled "FLOW DIVERTERS AND FLOW SHAPING PLATES FOR ELECTROPLATING CELLS;" 61/374,911, filed Aug. 18, 2010, and titled "HIGH FLOW RATE PROCESSING FOR WAFER LEVEL PACKAGING;" and 61/361,333, filed Jul. 2, 2010, and titled "ANGLED HRVA," each of which is incorporated by reference herein in its entirety and for all purposes. Further, U.S. application Ser. No. 13/893,242 claims benefit of prior to U.S. Provisional Application Nos. 61/646,598, filed May 14, 2012, and titled "CROSS FLOW MANIFOLD FOR ELECTROPLATING APPARATUS;" and 61/736,499 filed Dec. 12, 2012, and titled "ENHANCEMENT OF ELECTROLYTE HYDRODYNAMICS FOR EFFICIENT MASS TRANSFER DURING ELECTROPLATING," each of which is incorporated herein in its entirety and for all purposes.

BACKGROUND

The disclosed embodiments relate to methods and apparatus for controlling electrolyte hydrodynamics during electroplating. More particularly, methods and apparatus described herein are particularly useful for plating metals onto semiconductor wafer substrates, such as through resist plating of small microbumping features (e.g., copper, nickel, tin and tin alloy solders) having widths less than, e.g., about 50 µm, and copper through silicon via (TSV) features.

Electrochemical deposition processes are well-established in modern integrated circuit fabrication. The transition from aluminum to copper metal line interconnections in the early years of the twenty-first century drove a need for increasingly sophisticated electrodeposition processes and plating tools. Much of the sophistication evolved in response to the need for ever smaller current carrying lines in device metallization layers. These copper lines are formed by electroplating the metal into very thin, high-aspect ratio trenches and vias in a methodology commonly referred to as "damascene" processing (pre-passivation metalization).

Electrochemical deposition is now poised to fill a commercial need for sophisticated packaging and multichip interconnection technologies known generally and colloquially as wafer level packaging (WLP) and through silicon via (TSV) electrical connection technology. These technologies present their own very significant challenges due in part to the generally larger feature sizes (compared to Front End of Line (FEOL) interconnects) and high aspect ratios.

Depending on the type and application of the packaging features (e.g., through chip connecting TSV, interconnection redistribution wiring, or chip to board or chip bonding, such as flip-chip pillars), plated features are usually, in current technology, greater than about 2 micrometers and are typically about 5-100 micrometers in their principal dimension (for example, copper pillars may be about 50 micrometers). For some on-chip structures such as power busses, the feature to be plated may be larger than 100 micrometers. The aspect ratios of the WLP features are typically about 1:1 (height to width) or lower, though they can range as high as perhaps about 2:1 or so, while TSV structures can have very high aspect ratios (e.g., in the neighborhood of about 20:1).

With the shrinking of WLP structure sizes from 100-200 um to less than 50 um comes a unique set of problems because at this scale, the hydrodynamic and mass transfer boundary layers are nearly equivalent. For prior generations with larger features, the transport of fluid and mass into a feature was carried by the general penetration of the flow fields into the features, but with smaller features, the formation of flow eddies and stagnation can inhibit both the rate and uniformity of mass transport within the growing feature. Therefore, new methods of creating uniform mass transfer within smaller "microbump" and TSV features are required.

Further, the time constant τ (the 1D diffusion equilibration time constant) for a purely diffusion process scales with feature depth L and the diffusion constant D as $$\tau = \frac{L^2}{2D} (\text{sec}).$$

Assuming an average-reasonable value for the diffusion coefficient of a metal ion (e.g., $5 \times 10^{-6}$ cm$^2$/sec), a relatively large FEOL 0.3 um deep damascene feature would have a time constant of only about 0.1 msec, but a 50 um deep TSV of WLP bump would have a time constant of several seconds.

Not only feature size, but also plating speed differentiates WLP and TSV applications from damascene applications. For many WLP applications, depending on the metal being plated (e.g., copper, nickel, gold, silver solders, etc.), there is a balance between the manufacturing and cost requirements on the one hand and the technical requirements and technical difficulty on the other hand (e.g., goals of capital productivity with wafer pattern variability and on wafer requirements like within die and within feature targets). For copper, this balance is usually achieved at a rate of at least about 2 micrometers/minute, and typically at least about 3-4 micrometers/minute or more. For tin plating, a plating rate of greater than about 3 um/min, and for some applications at least about 7 micrometers/minute may be required. For nickel and strike gold (e.g., low concentration gold flash film layers), the plating rates may be between about 0.1 to 1 um/min. At these metal-relative higher plating rate regimes, efficient mass transfer of metal ions in the electrolyte to the plating surface is important.

In certain embodiments, plating must be conducted in a highly uniform manner over the entire face of a wafer to achieve good plating uniformity WIthin a Wafer (WIW), WIthin and among all the features of a particular Die (WID), and also WIthin the individual Features themselves (WIF). The high plating rates of WLP and TSV applications present challenges with respect to uniformity of the electrodeposited layer. For various WLP applications, plating must exhibit at most about 5% half range variation radially along the wafer surface (referred to as WIW non-uniformity, measured on a single feature type in a die at multiple locations across the wafer's diameter). A similar equally challenging requirement is the uniform deposition (thickness and shape) of various features of either different sizes (e.g. feature diameters) or feature density (e.g. an isolated or embedded feature in the middle of an array of the chip die). This performance specification is generally referred to as the WID non-uniformity. WID non-uniformity is measured as the local variability (e.g. <5% half range) of the various features types as described above versus the average feature height or other dimension within a given wafer die at that particular die location on the wafer (e.g. at the mid radius, center or edge).

A final challenging requirement is the general control of the within feature shape. Without proper flow and mass transfer convection control, after plating a line or pillar can end up being sloped in either a convex, flat or concave fashion in two or three dimensions (e.g. a saddle or a domed shape), with a flat profile generally, though not always, preferred. While meeting these challenges, WLP applications must compete with conventional, potentially less expensive pick and place serial routing operations. Still further, electrochemical deposition for WLP applications may involve plating various non-copper metals such as solders like lead, tin, tin-silver, and other underbump metallization materials, such as nickel, gold, palladium, and various alloys of these, some of which include copper. Plating of tin-silver near eutectic alloys is an example of a plating technique for an alloy that is plated as a lead free solder alternative to lead-tin eutectic solder.

SUMMARY

Certain embodiments herein relate to methods and apparatus for electroplating one or more materials onto a substrate. In many cases the material is a metal and the substrate is a semiconductor wafer, though the embodiments are no so limited. Typically, the embodiments herein utilize a channeled plate positioned near the substrate, creating a cross flow manifold defined on the bottom by the channeled plate, on the top by the substrate, and on the sides by a cross flow confinement ring. During plating, fluid enters the cross flow manifold both upward through the channels in the channeled plate, and laterally through a cross flow side inlet positioned on one side of the cross flow confinement ring. The flow paths combine in the cross flow manifold and exit at the cross flow exit, which is positioned opposite the cross flow inlet. These combined flow paths result in improved plating uniformity.

In one aspect of the embodiments herein, an apparatus is provided. including (a) an electroplating chamber configured to contain an electrolyte and an anode while electroplating metal onto a substantially planar substrate, (b) a substrate holder configured to hold a substantially planar substrate such that a plating face of the substrate is separated from the anode during electroplating, (c) an ionically resistive element including a substrate-facing surface that is separated from the plating face of the substrate by a gap of about 10 mm or less, where the ionically resistive element is at least coextensive with the plating face of the substrate during electroplating, and where the ionically resistive element is adapted to provide ionic transport through the element during electroplating, (d) an inlet to the gap for introducing electrolyte to the gap, and (e) an outlet to the gap for receiving electrolyte flowing in the gap, where the inlet and outlet are positioned proximate azimuthally opposing perimeter locations on the plating face of the substrate during electroplating, and where the inlet and outlet are adapted to generate cross-flowing electrolyte in the gap to create or maintain a shearing force on the plating face of the substrate during electroplating. In some implementations, the inlet of the apparatus is separated into two or more azimuthally distinct sections, and the apparatus also includes a mechanism for independently controlling the amount of electrolyte flowing to the azimuthally distinct sections of the inlet.

In certain embodiments, the ionically resistive element has certain properties. For example, in some cases, the ionically resistive element has a porosity of between about 1-10% (e.g., between about 2-5%). The ionically resistive element may also include at least about 1,000 (e.g., at least about 3,000, at least about 5,000, at least about 6,000, or at least about 9,000) paths through which electrolyte may flow during electroplating. The paths may be configured to deliver electrolyte towards the substrate at a velocity of at least about 3 cm/s (e.g., at least about 5 cm/s, or at least about 10 cm/s) at the outlets of the paths through the ionically resistive element. In many cases the ionically resistive element is configured to shape an electric field and control electrolyte flow characteristics proximate the substrate during electroplating.

The apparatus may also include a lower manifold region positioned below a lower face of the ionically resistive element, where the lower face faces away from the substrate holder. In some embodiments, the apparatus includes a central electrolyte chamber and one or more feed channels configured to delivery electrolyte from the central electrolyte chamber to both the inlet and to the lower manifold region. A pump may be used in various cases for delivering electrolyte to and/or from the central electrolyte chamber. In some embodiments, the pump and inlet are adapted to deliver electrolyte in the gap at a cross flow velocity of at least about 3 cm/s (e.g., at least about 5 cm/s, or at least about 10 cm/s, or at least about 15 cm/s, or at least about 20 cm/s) across a center point on the plating face of the substrate.

In various implementations, the apparatus includes a cross flow injection manifold that is fluidically coupled to the inlet. The cross flow injection manifold may be at least partially defined by a cavity in the ionically resistive element. Flow directing elements may be positioned in the gap in certain embodiments, and the flow directing elements may be adapted to cause electrolyte to flow in a substantially linear flow path from the inlet to the outlet. In some cases the flow directing elements are partitions/fins located downstream from the inlet and configured to divide flowing electrolyte into adjacent streams in the gap.

Certain embodiments include a flow confinement ring, which may be positioned over a peripheral portion of the ionically resistive element. The flow confinement ring helps shape the cross flow across the face of the substrate. In cases where a cross flow confinement ring is used, a gasket may be positioned between the ionically resistive element and the flow confinement ring. The gasket helps provide a good seal. A membrane frame may be used in various embodiments to support a membrane. The membrane may separate the electroplating chamber into a cathode chamber and an anode chamber. In various implementations, a weir wall is positioned radially outside the gap, and is configured to receive electrolyte flowing through the outlet. The apparatus may also include a mechanism for rotating the substrate and/or substrate holder during plating. In some cases, the ionically resistive element is positioned parallel or substantially parallel to the substrate during electroplating.

The inlet may span an arc proximate the perimeter of the plating face of the substrate in various embodiments. In some implementations, the inlet spans an arc between about 90-180° (e.g., between about 120-170°, between about 140-150°). In a particular embodiment, the inlet spans an arc of about 90°. In another embodiment, the inlet spans an arc of about 120°. In some embodiments, the inlet is separated into a plurality of azimuthally distinct segments. These azimuthally distinct segments may also be fluidically separated. The azimuthally distinct segments of the inlets may be fed by a plurality of electrolyte feeds and feed inlets. In some implementations, the apparatus may include one or more flow control elements that are designed or configured to independently control the volumetric flow rates of electrolyte to the different electrolyte feed inlets. The flow control elements may include constricting elements positioned in one or more electrolyte flow paths. In some cases, the constricting elements are rods.

In another aspect of the embodiments herein, a method for electroplating a substrate is provided. The method may include (a) receiving a substantially planar substrate in a substrate holder, where a plating face of the substrate is exposed, and where the substrate holder is configured to hold the substrate such that the plating face of the substrate is separated from the anode during electroplating, (b) immersing the substrate in electrolyte, where a gap of about 10 mm or less is formed between the plating face of the substrate and an upper surface of an ionically resistive element, where the ionically resistive element is at least coextensive with the plating face of the substrate, and where the ionically resistive element is adapted to provide ionic transport through the ionically resistive element during electroplating, (c) flowing electrolyte in contact with the substrate in the substrate holder (i) from a side inlet, into the gap, and out a side outlet, and (ii) from below the ionically resistive element, through the ionically resistive element, into the gap, and out the side outlet, where the inlet and outlet are positioned proximate azimuthally opposed perimeter locations on the plating face of the substrate, and where the inlet and outlet are designed or configured to generate cross-flowing electrolyte in the gap during electroplating, (d) rotating the substrate holder, and (e) electroplating material onto the plating face of the substrate while flowing the electrolyte as in (c). The inlet may be separated into two or more azimuthally distinct and fluidically separated sections, and the flow of electrolyte to the azimuthally distinct sections may be independently controlled. In some cases, at least two of the sections of the inlet receive different electrolyte flow rates.

In some embodiments, flowing electrolyte in operation (c) includes flowing electrolyte at a cross flow velocity of at least about 3 cm/s (e.g., at least about 5 cm/s, at least about 10 cm/s, or at least about 20 cm/s) across a center point on or proximate the plating face of the substrate. In these or other embodiments, electrolyte may exit the ionically resistive element at a velocity of at least about 3 cm/s (e.g., at least about 5 cm/s, or at least about 10 cm/s).

The side outlet in some embodiments may be separated into two or more azimuthally distinct side outlet sections. The method may also include flowing electrolyte at different flow rates through at least two of the azimuthally distinct outlet sections. In certain implementations, flowing electrolyte in operation (c)(ii) includes flowing electrolyte such that it impinges upon the plating face of the substrate. In some cases, flow directing elements may be positioned in the gap. The flow directing elements may cause electrolyte to flow in a substantially linear flow path from the side inlet to the side outlet. In some cases, these flow directing elements are partitions/fins. The fins may be located downstream or at least partially downstream of the side inlet. The total flow rate of electrolyte into the gap may be between about 1-60 L/min in some cases (e.g., between about 6-60 L/min, or between about 5-25 L/min, or between about 15-25 L/min). In one embodiment, the overall flow rate of electrolyte into the gap is about 12 L/min. In another embodiment, this flow rate is about 20 L/min.

These and other features will be described below with reference to the associated drawings.

DETAILED DESCRIPTION

Figure 1A:
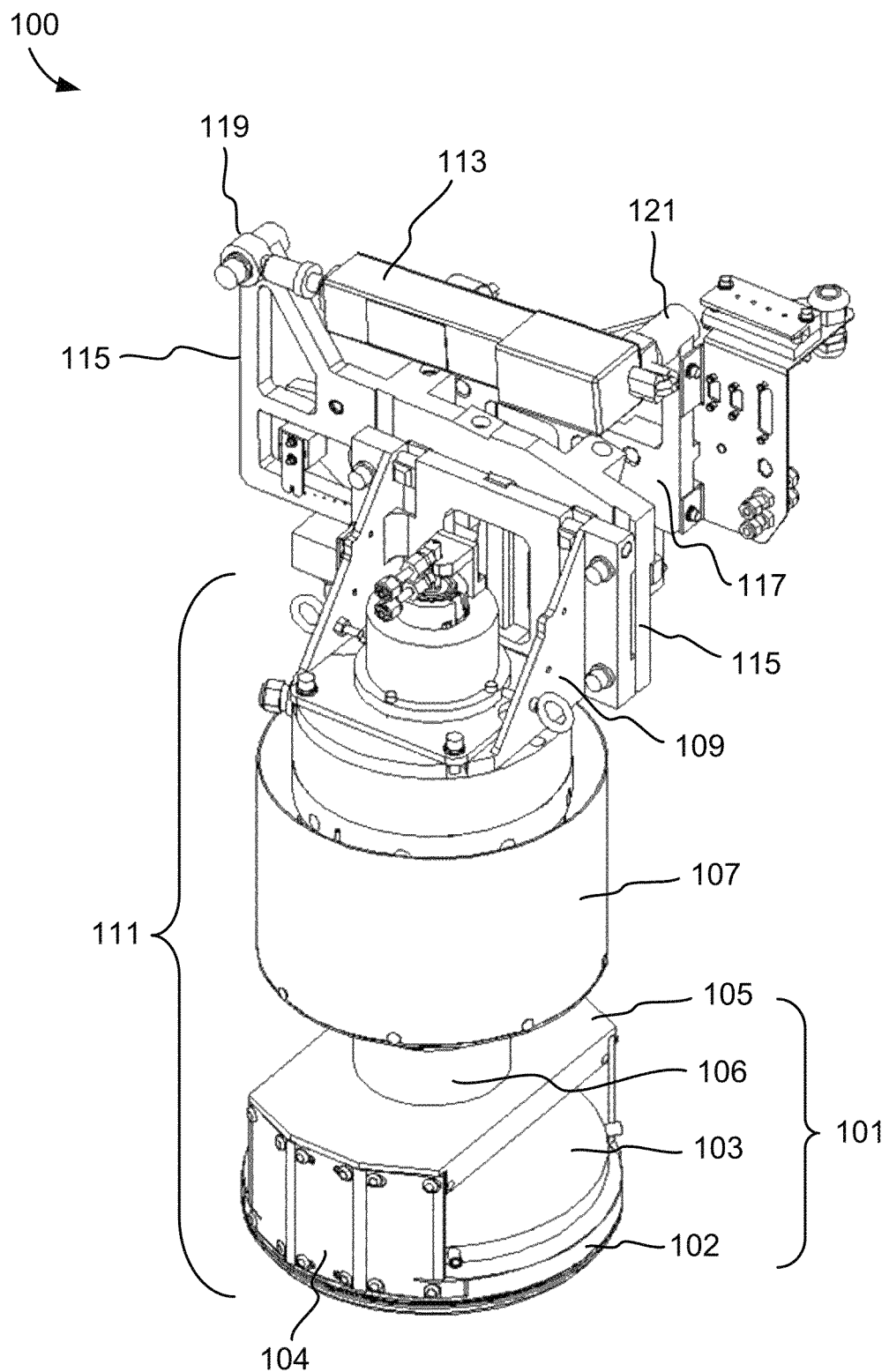
FIG. 1A shows a perspective view of a substrate holding and positioning apparatus for electrochemically treating semiconductor wafers.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. The following detailed description assumes the invention is implemented on a wafer. Oftentimes, semiconductor wafers have a diameter of 200, 300 or 450 mm. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Described herein are apparatus and methods for electroplating one or more metals onto a substrate. Embodiments are described generally where the substrate is a semiconductor wafer; however the invention is not so limited.

Disclosed embodiments include electroplating apparatus configured for, and methods including, control of electrolyte hydrodynamics during plating so that highly uniform plating layers are obtained. In specific implementations, the disclosed embodiments employ methods and apparatus that create combinations of impinging flow (flow directed at or perpendicular to the work piece surface) and shear flow (sometimes referred to as "cross flow" or flow with velocity parallel to the work piece surface).

One embodiment is an electroplating apparatus including the following features: (a) a plating chamber configured to contain an electrolyte and an anode while electroplating metal onto a substantially planar substrate; (b) a substrate holder configured to hold the substantially planar substrate such that a plating face of the substrate is separated from the anode during electroplating; (c) a channeled ionically resistive element including a substrate-facing surface that is substantially parallel to and separated from a plating face of the substrate during electroplating, the channeled ionically resistive element including a plurality of non-communicating channels, where the non-communicating channels allow for transport of the electrolyte through the element during electroplating; and (d) a mechanism for creating and/or applying a shearing force (cross flow) to the electrolyte flowing at the plating face of the substrate. Though the wafer is substantially planar, it also typically has one or more microscopic trenches and may have one or more portions of the surface masked from electrolyte exposure. In various embodiments, the apparatus also includes a mechanism for rotating the substrate and/or the channeled ionically resistive element while flowing electrolyte in the electroplating cell in the direction of the substrate plating face.

In certain implementations, the mechanism for applying cross flow is an inlet with, for example, appropriate flow directing and distributing means on or proximate to the periphery of the channeled ionically resistive element. The inlet directs cross flowing catholyte along the substrate-facing surface of the channeled ionically resistive element. The inlet is azimuthally asymmetric, partially following the circumference of the channeled ionically resistive element, and having one or more gaps, and defining a cross flow injection manifold between the channeled ionically resistive element and the substantially planar substrate during electroplating. Other elements are optionally provided for working in concert with the cross flow injection manifold. These may include a cross flow injection flow distribution showerhead and a cross flow confinement ring, which are further described below in conjunction with the figures.

In certain embodiments, the apparatus is configured to enable flow of electrolyte in the direction towards or perpendicular to a substrate plating face to produce an average flow velocity of at least about 3 cm/s (e.g., at least about 5 cm/s or at least about 10 cm/s) exiting the holes of the channeled ionically resistive element during electroplating. In certain embodiments, the apparatus is configured to operate under conditions that produce an average transverse electrolyte velocity of about 3 cm/sec or greater (e.g., about 5 cm/s or greater, about 10 cm/s or greater, about 15 cm/s or greater, or about 20 cm/s or greater) across the center point of the plating face of the substrate. These flow rates (i.e., the flow rate exiting the holes of the ionically resistive element and the flow rate across the plating face of the substrate) are in certain embodiments appropriate in an electroplating cell employing an overall electrolyte flow rate of about 20 L/min and an approximately 12 inch diameter substrate. The embodiments herein may be practiced with various substrate sizes. In some cases, the substrate has a diameter of about 200 mm, about 300 mm, or about 450 mm. Further, the embodiments herein may be practiced at a wide variety of overall flow rates. In certain implementations, the overall electrolyte flow rate is between about 1-60 L/min, between about 6-60 L/min, between about 5-25 L/min, or between about 15-25 L/min. The flow rates achieved during plating may be limited by certain hardware constraints, such as the size and capacity of the pump being used. One of skill in the art would understand that the flow rates cited herein may be higher when the disclosed techniques are practiced with larger pumps.

In some embodiments, the electroplating apparatus contains separated anode and cathode chambers in which there are different electrolyte compositions, electrolyte circulation loops, and/or hydrodynamics in each of two chambers. An ionically permeable membrane may be employed to inhibit direct convective transport (movement of mass by flow) of one or more components between the chambers and maintain a desired separation between the chambers. The membrane may block bulk electrolyte flow and exclude transport of certain species such as organic additives while permitting transport of ions such as cations. In some embodiments, the membrane contains DuPont's NAFION™ or a related ionically selective polymer. In other cases, the membrane does not include an ion exchange material, and instead includes a micro-porous material. Conventionally, the electrolyte in the cathode chamber is referred to as "catholyte" and the electrolyte in the anode chamber is referred to as "anolyte." Frequently, the anolyte and catholyte have different compositions, with the anolyte containing little or no plating additives (e.g., accelerator, suppressor, and/or leveler) and the catholyte containing significant concentrations of such additives. The concentration of metal ions and acids also often differs between the two chambers. An example of an electroplating apparatus containing a separated anode chamber is described in U.S. Pat. No. 6,527,920, filed Nov. 3, 2000; U.S. Pat. No. 6,821,407, filed Aug. 27, 2002, and U.S. Pat. No. 8,262,871, filed Dec. 17, 2009 each of which is incorporated herein by reference in its entirety.

In some embodiments, the anode membrane need not include an ion exchange material. In some examples, the membrane is made from a micro-porous material such as polyethersulfone manufactured by Koch Membrane of Wilmington, Mass. This membrane type is most notably applicable for inert anode applications such as tin-silver plating and gold plating, but may also be used for soluble anode applications such as nickel plating.

In certain embodiments, and as described more fully elsewhere herein, catholyte is injected into a manifold region, referred to hereafter as the "CIRP manifold region", in which electrolyte is fed, accumulates, and then is distributed and passes substantially uniformly through the various non-communication channels of the CIRP directly towards the wafer surface.

In the following discussion, when referring to top and bottom features (or similar terms such as upper and lower features, etc.) or elements of the disclosed embodiments, the terms top and bottom are simply used for convenience and represent only a single frame of reference or implementation of the invention. Other configurations are possible, such as those in which the top and bottom components are reversed with respect to gravity and/or the top and bottom components become the left and right or right and left components.

While some aspects described herein may be employed in various types of plating apparatus, for simplicity and clarity, most of the examples will concern wafer-face-down, "fountain" plating apparatus. In such apparatus, the work piece to plated (typically a semiconductor wafer in the examples presented herein) generally has a substantially horizontal orientation (which may in some cases vary by a few degrees from true horizontal for some part of, or during the entire plating process) and may be powered to rotate during plating, yielding a generally vertically upward electrolyte convection pattern. Integration of the impinging flow mass from the center to the edge of the wafer, as well as the inherent higher angular velocity of a rotating wafer at its edge relative to its center, creates a radially increasing sheering (wafer parallel) flow velocity. One example of a member of the fountain plating class of cells/apparatus is the Sabre® Electroplating System produced by and available from Novellus Systems, Inc. of San Jose, Calif. Additionally, fountain electroplating systems are described in, e.g., U.S. Pat. No. 6,800,187, filed Aug. 10, 2001 and U.S. Pat. No. 8,308,931, filed Nov. 7, 2008, which are incorporated herein by reference in their entireties.

The substrate to be plated is generally planar or substantially planar. As used herein, a substrate having features such as trenches, vias, photoresist patterns and the like is considered to be substantially planar. Often these features are on the microscopic scale, though this is not necessarily always the case. In many embodiments, one or more portions of the surface of the substrate may be masked from exposure to the electrolyte.

Figure 1B:
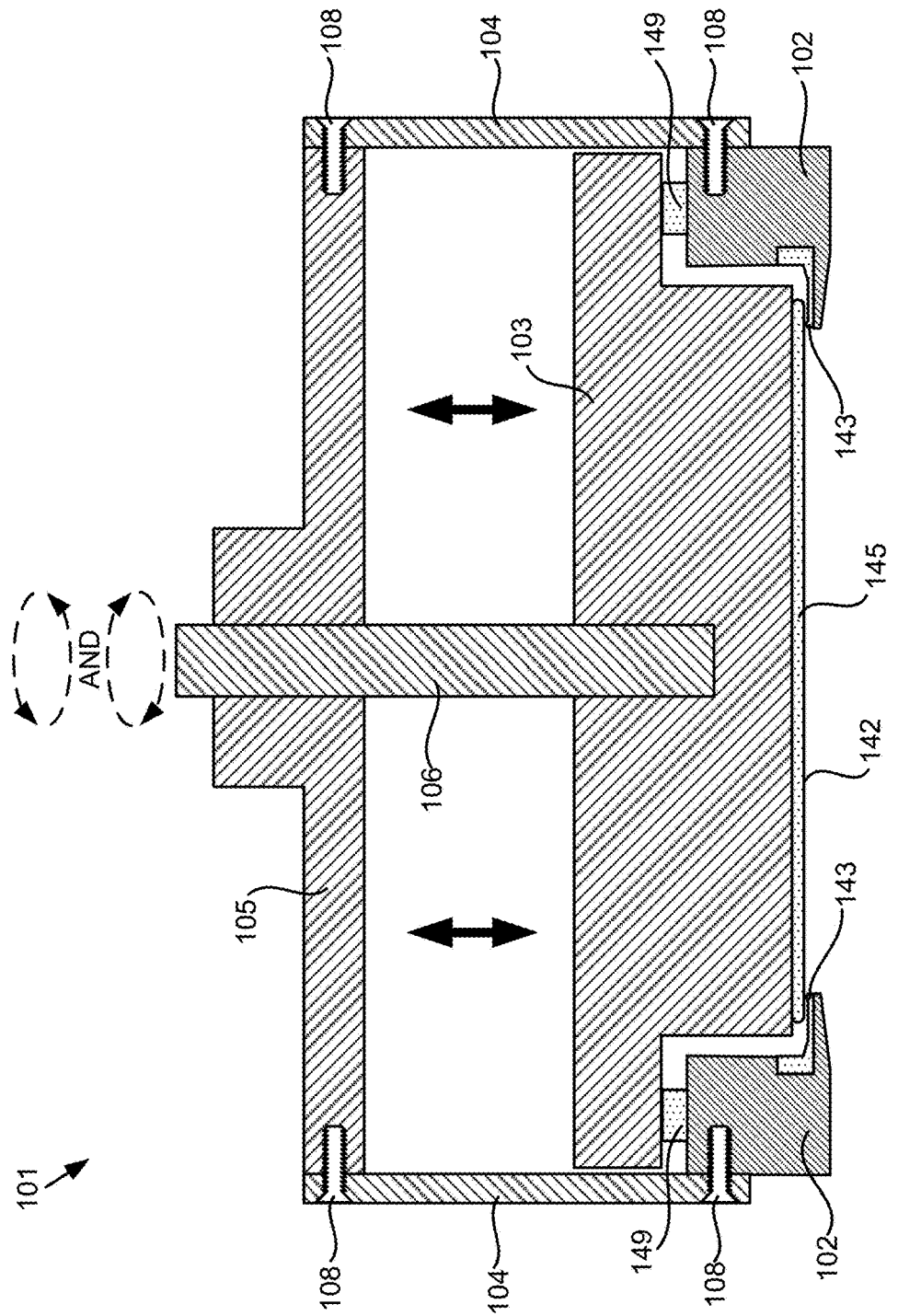
FIG. 1B depicts a cross-sectional view of a portion of a substrate holding assembly including a cone and cup.

The following description of FIGS. 1A and 1B provides a general non-limiting context to assist in understanding the apparatus and methods described herein. FIG. 1A provides a perspective view of a wafer holding and positioning apparatus 100 for electrochemically treating semiconductor wafers. Apparatus 100 includes wafer engaging components (sometimes referred to herein as "clamshell" components). The actual clamshell includes a cup 102 and a cone 103 that enables pressure to be applied between the wafer and the seal, thereby securing the wafer in the cup.

Cup 102 is supported by struts 104, which are connected to a top plate 105. This assembly (102-105), collectively assembly 101, is driven by a motor 107, via a spindle 106. Motor 107 is attached to a mounting bracket 109. Spindle 106 transmits torque to a wafer (not shown in this figure) to allow rotation during plating. An air cylinder (not shown) within spindle 106 also provides vertical force between the cup and cone 103 to create a seal between the wafer and a sealing member (lipseal) housed within the cup. For the purposes of this discussion, the assembly including components 102-109 is collectively referred to as a wafer holder 111. Note however, that the concept of a "wafer holder" extends generally to various combinations and sub-combinations of components that engage a wafer and allow its movement and positioning.

A tilting assembly including a first plate 115, that is slidably connected to a second plate 117, is connected to mounting bracket 109. A drive cylinder 113 is connected both to plate 115 and plate 117 at pivot joints 119 and 121, respectively. Thus, drive cylinder 113 provides force for sliding plate 115 (and thus wafer holder 111) across plate 117. The distal end of wafer holder 111 (i.e. mounting bracket 109) is moved along an arced path (not shown) which defines the contact region between plates 115 and 117, and thus the proximal end of wafer holder 111 (i.e. cup and cone assembly) is tilted upon a virtual pivot. This allows for angled entry of a wafer into a plating bath.

The entire apparatus 100 is lifted vertically either up or down to immerse the proximal end of wafer holder 111 into a plating solution via another actuator (not shown). Thus, a two-component positioning mechanism provides both vertical movement along a trajectory perpendicular to an electrolyte and a tilting movement allowing deviation from a horizontal orientation (parallel to electrolyte surface) for the wafer (angled-wafer immersion capability). A more detailed description of the movement capabilities and associated hardware of apparatus 100 is described in U.S. Pat. No. 6,551,487 filed May 31, 2001 and issued Apr. 22, 2003, which is herein incorporated by reference in its entirety.

Note that apparatus 100 is typically used with a particular plating cell having a plating chamber which houses an anode (e.g., a copper anode or a non-metal inert anode) and electrolyte. The plating cell may also include plumbing or plumbing connections for circulating electrolyte through the plating cell—and against the work piece being plated. It may also include membranes or other separators designed to maintain different electrolyte chemistries in an anode compartment and a cathode compartment. In one embodiment, one membrane is employed to define an anode chamber, which contains electrolyte that is substantially free of suppressors, accelerators, or other organic plating additives, or in another embodiment, where the inorganic plating composition of the anolyte and catholyte are substantially different. Means of transferring anolyte to the catholyte or to the main plating bath by physical means (e.g. direct pumping including values, or an overflow trough) may optionally also be supplied.

The following description provides more detail of the cup and cone assembly of the clamshell. FIG. 1B depicts a portion, 101, of assembly 100, including cone 103 and cup 102 in cross-section format. Note that this figure is not meant to be a true depiction of a cup and cone product assembly, but rather a stylized depiction for discussion purposes. Cup 102 is supported by top plate 105 via struts 104, which are attached via screws 108. Generally, cup 102 provides a support upon which wafer 145 rests. It includes an opening through which electrolyte from a plating cell can contact the wafer. Note that wafer 145 has a front side 142, which is where plating occurs. The periphery of wafer 145 rests on the cup 102. The cone 103 presses down on the back side of the wafer to hold it in place during plating.

To load a wafer into 101, cone 103 is lifted from its depicted position via spindle 106 until cone 103 touches top plate 105. From this position, a gap is created between the cup and the cone into which wafer 145 can be inserted, and thus loaded into the cup. Then cone 103 is lowered to engage the wafer against the periphery of cup 102 as depicted, and mate to a set of electrical contacts (not shown in 1B) radially beyond the lip seal 143 along the wafer's outer periphery.

Spindle 106 transmits both vertical force for causing cone 103 to engage a wafer 145 and torque for rotating assembly 101. These transmitted forces are indicated by the arrows in FIG. 1B. Note that wafer plating typically occurs while the wafer is rotating (as indicated by the dashed arrows at the top of FIG. 1B).

Cup 102 has a compressible lip seal 143, which forms a fluid-tight seal when cone 103 engages wafer 145. The vertical force from the cone and wafer compresses lip seal 143 to form the fluid tight seal. The lip seal prevents electrolyte from contacting the backside of wafer 145 (where it could introduce contaminating species such as copper or tin ions directly into silicon) and from contacting sensitive components of apparatus 101. There may also be seals located between the interface of the cup and the wafer which form fluid-tight seals to further protect the backside of wafer 145 (not shown).

Cone 103 also includes a seal 149. As shown, seal 149 is located near the edge of cone 103 and an upper region of the cup when engaged. This also protects the backside of wafer 145 from any electrolyte that might enter the clamshell from above the cup. Seal 149 may be affixed to the cone or the cup, and may be a single seal or a multi-component seal.

Upon initiation of plating, cone 103 is raised above cup 102 and wafer 145 is introduced to assembly 102. When the wafer is initially introduced into cup 102—typically by a robot arm—its front side, 142, rests lightly on lip seal 143. During plating the assembly 101 rotates in order to aid in achieving uniform plating. In subsequent figures, assembly 101 is depicted in a more simplistic format and in relation to components for controlling the hydrodynamics of electrolyte at the wafer plating surface 142 during plating. Thus, an overview of mass transfer and fluid shear at the work piece follows.

Figure 1C:
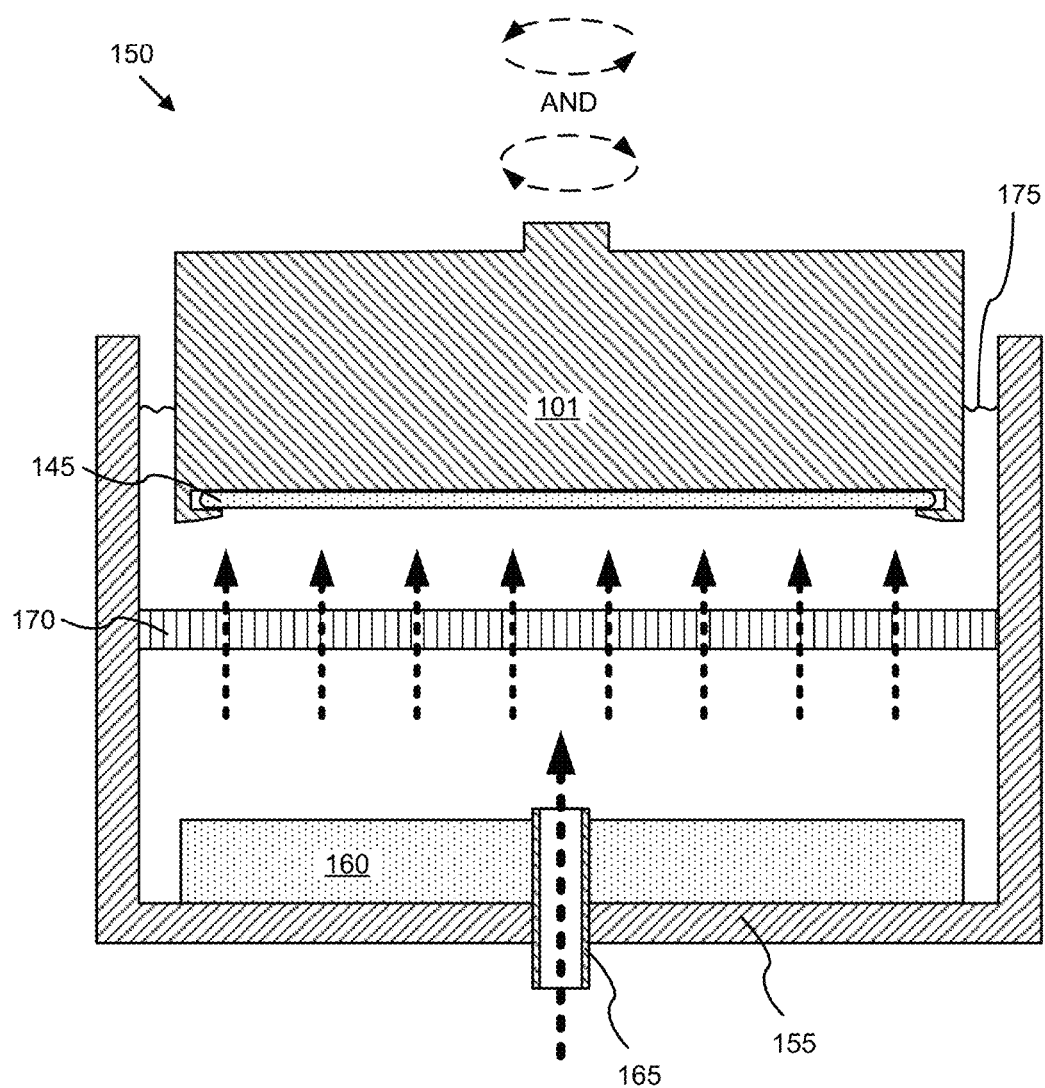
FIG. 1C depicts a simplified view of an electroplating cell that may be used in practicing the embodiments herein.

As depicted in FIG. 1C, a plating apparatus 150 includes a plating cell 155 which houses anode 160. In this example, electrolyte 175 is flowed into cell 155 centrally through an opening in anode 160, and the electrolyte passes through a channeled ionically resistive element 170 having vertically oriented (non-intersecting) through holes through which electrolyte flows and then impinges on wafer 145, which is held in, positioned and moved by, wafer holder 101. Channeled ionically resistive elements such as 170 provide uniform impinging flow upon the wafer plating surface. In accordance with certain embodiments described herein, apparatus utilizing such channeled ionically resistive elements are configured and/or operated in a manner that facilitates high rate and high uniformity plating across the face of the wafer, including plating under high deposition rate regimes such as for WLP and TSV applications. Any or all of the various embodiments described can be implemented in the context of Damascene as well as TSV and WLP applications.

FIGS. 1D-1J relate to certain techniques that may be used to encourage cross flow across the face of a substrate being plated. Various techniques described in relation to these figures present alternative strategies for encouraging cross flow. As such, certain elements described in these figures are optional, and are not present in all embodiments.

Figure 1D:
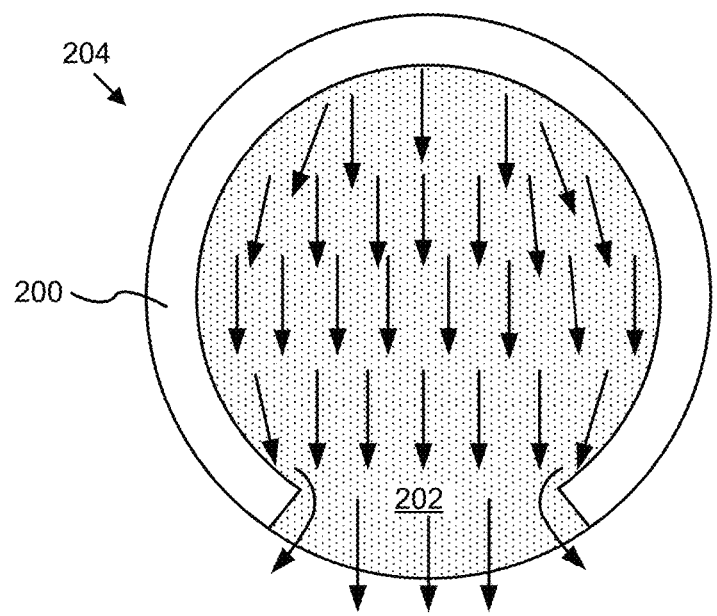
FIG. 1D-1J illustrate various electroplating apparatus embodiments that may be used to enhance cross flow across the face of a substrate, along with top views of the flow dynamics achieved when practicing these embodiments.

In some embodiments, electrolyte flow ports are configured to aid transverse flow, alone or in combination with a flow shaping plate and a flow diverter as described herein. Various embodiments are described below in relation to a combination with a flow shaping plate and a flow diverter, but the invention is not so limited. Note that in certain embodiments it is believed that the magnitude of the electrolyte flow vectors across the wafer surface are larger proximate the vent or gap and progressively smaller across the wafer surface, being smallest at the interior of the pseudo chamber furthest from the vent or gap. As depicted in FIG. 1D, by using appropriately configured electrolyte flow ports, the magnitude of these transverse flow vectors is more uniform across the wafer surface.

Figure 1E:
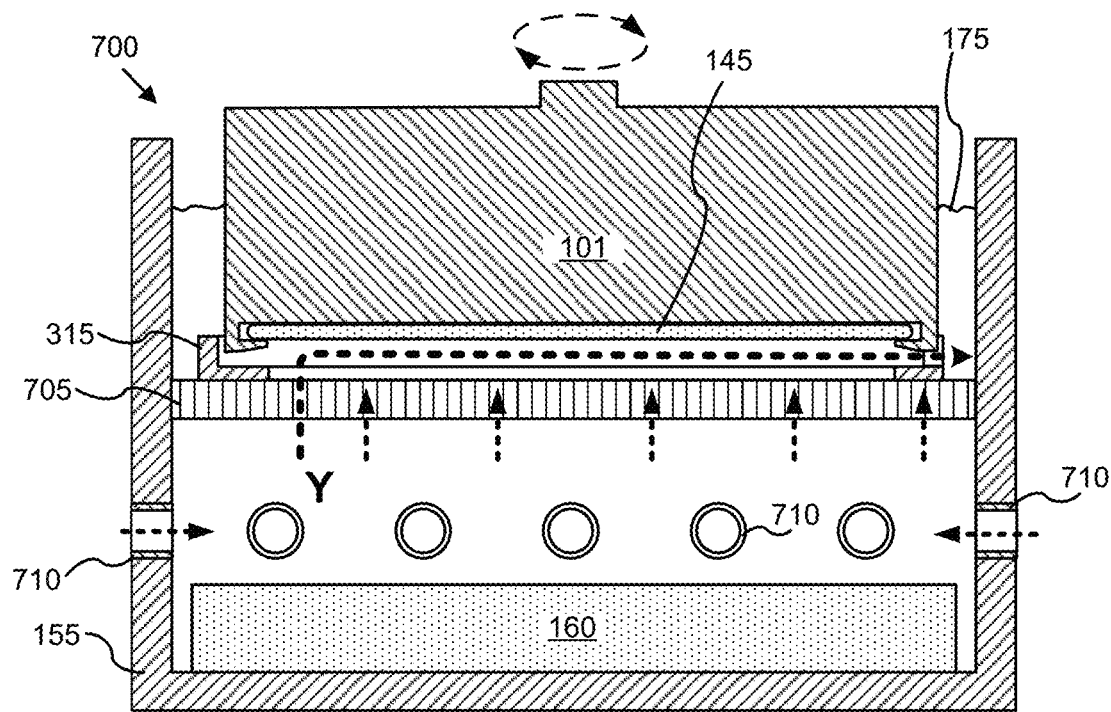
Figure 1F:
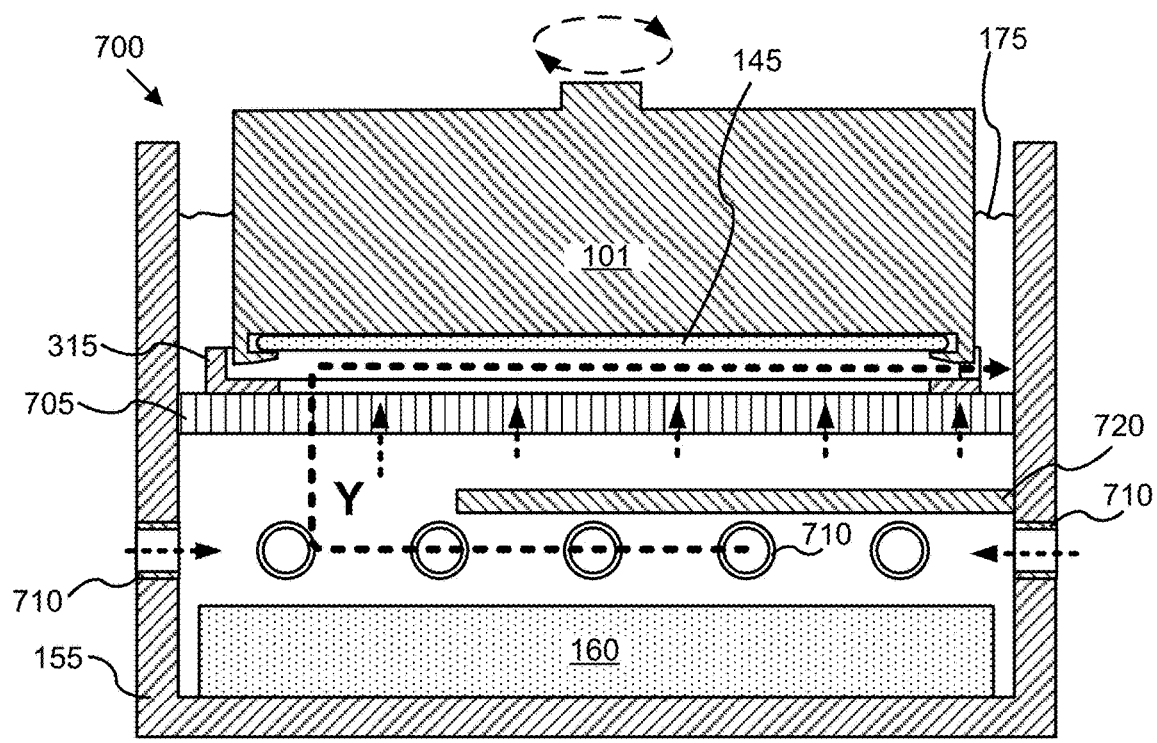

FIG. 1E depicts a simplified cross-section of a plating cell, 700, having a wafer holder, 101, which is partially immersed in an electrolyte, 175, in plating bath 155. Plating cell 700 includes a flow shaping plate, 705, such as those described herein. An anode, 160, resides below plate 705. On top of plate 705 is a flow diverter, 315. In this figure, the vent or gap (outlet) in the flow diverter is on the right side of the diagram and thus imparts transverse flow from left to right as indicated by the largest dotted arrow. A series of smaller vertical arrows indicate flow through the vertically oriented through holes in plate 705. Also below plate 705 are a series of electrolyte inlet flow ports, 710, that introduce electrolyte into the chamber below plate 705. In this figure, there is no membrane separating an anolyte and catholyte chamber, but this can also be included in such plating cells without departing from the scope of this description.

In this example, flow ports 710 are distributed radially about the interior wall of cell 155. In certain embodiments, in order to enhance the transverse flow across the wafer plating surface, one or more of these flow ports is blocked, for example, flow ports on the right hand side (as drawn), proximate the vent or gap in the pseudo chamber formed between the wafer, plate 705 and flow diverter 315. In this way, although impinging flow is permitted through all the through holes in plate 705, the pressure at the left side, distal of the gap or vent in the pseudo chamber, is higher and thus the transverse flow across the wafer surface (in this example shown as left to right flow) is enhanced. In certain embodiments, the blocked flow ports are positioned about an azimuth that is at least equal to the azimuth of the segmented portion of the flow diverter. In a specific embodiment, the electrolyte flow ports on a 90° azimuthal section of the circumference of the electrolyte chamber below the flow shaping plate are blocked. In one embodiment, this 90° azimuthal section is registered with the open segment (outlet) of the flow diverter annulus.

In other embodiments, the electrolyte inlet flow port or ports are configured to favor higher pressure in the area below the portion of the flow diverter distal of the vent or gap (indicated by Y in FIG. 1E). In some instances, simply physically blocking (e.g., via one or more shut off valves) selected inlet ports is more convenient and flexible than designing a cell with particularly configured electrolyte inlet ports. This is true because the configuration of the flow shaping plate and the associated flow diverter can change with different desired plating results and thus it is more flexible to be able to vary the electrolyte inlet configuration on a single plating cell.

Figure 1G:
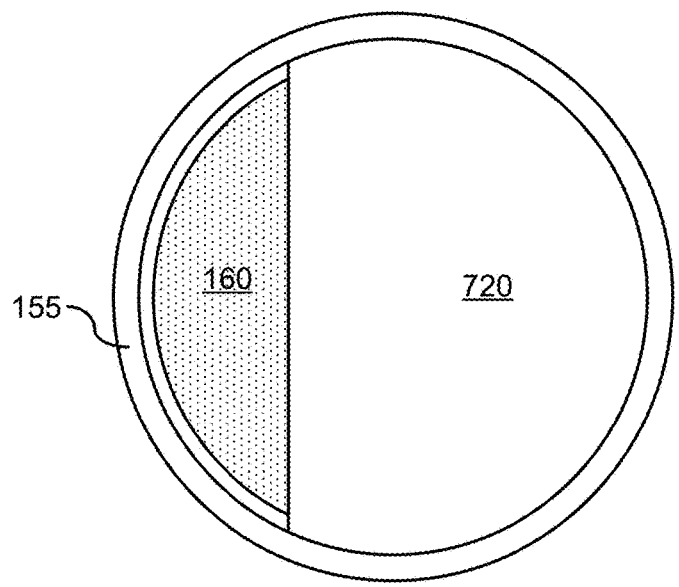
Figure 7:
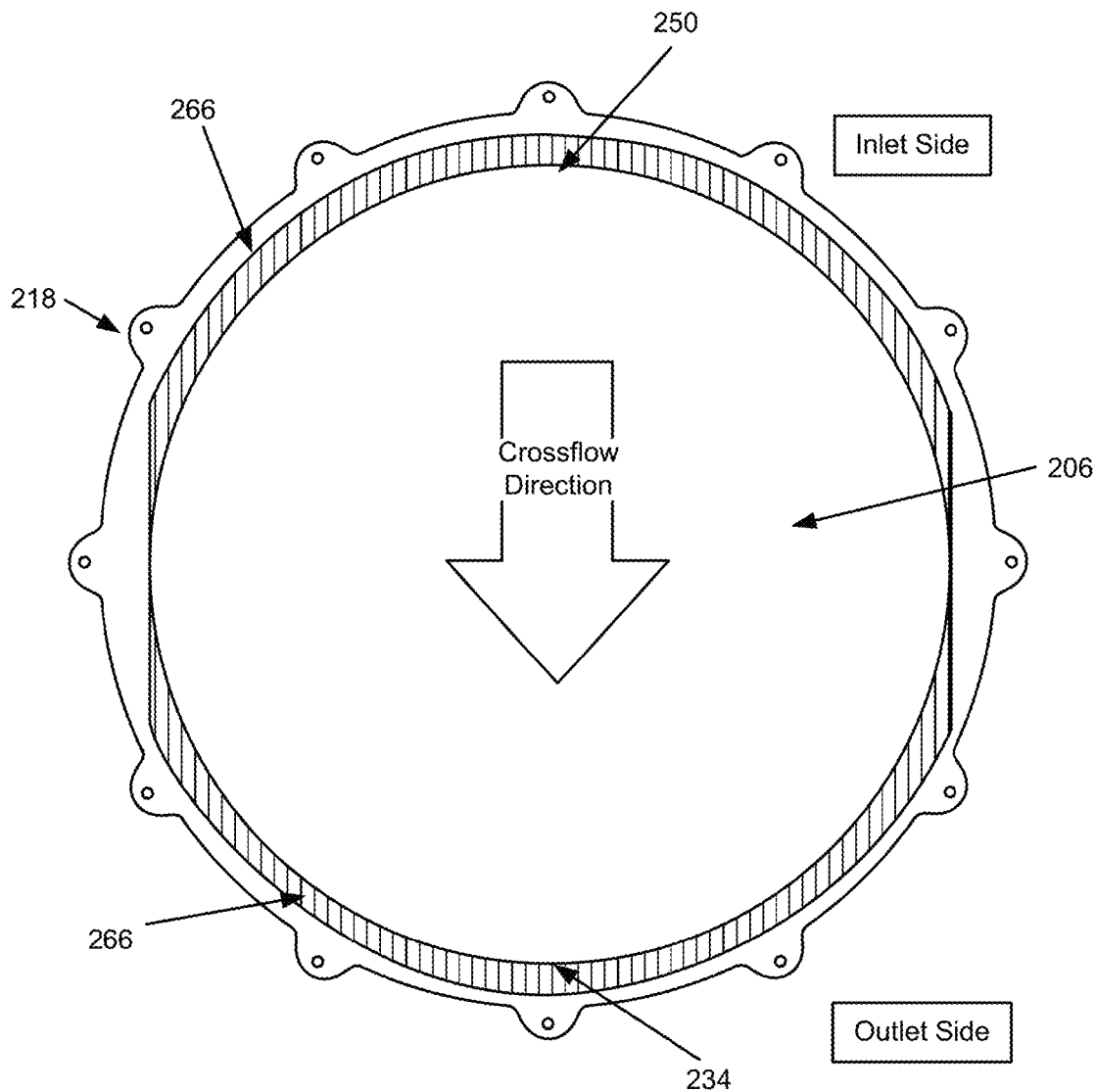
FIG. 7 illustrates a simplified top view of a CIRP and associated hardware showing both the inlet and outlet sides of the cross flow manifold according to various disclosed embodiments.

In other embodiments, with or without blocking one or more electrolyte inlet ports, a dam, baffle or other physical structure is configured to favor higher pressure in the area below the portion of the flow diverter distal of the vent or gap. For example, referring to FIG. 1F, a baffle, 720, is configured to favor higher pressure in the area below the portion of the flow diverter distal of the vent or gap (indicated by Y in FIG. 7C). FIG. 1G is a top view of plating cell 155, without wafer holder 101, flow diverter 315 or flow shaping plate 705, showing that baffle 720 promotes electrolyte flow emanating from ports 720 to confluence at area Y and thus increase pressure in that area (supra). One of ordinary skill in the art would appreciate that a physical structure may be oriented in a number of different ways, e.g. having horizontal, vertical, sloped or other elements in order to channel flow of the electrolyte in order to create a higher pressure region as described and thus promote transverse flow across the wafer surface in the pseudo chamber where the shear flow vectors are substantially uniform.

Figure 1H:
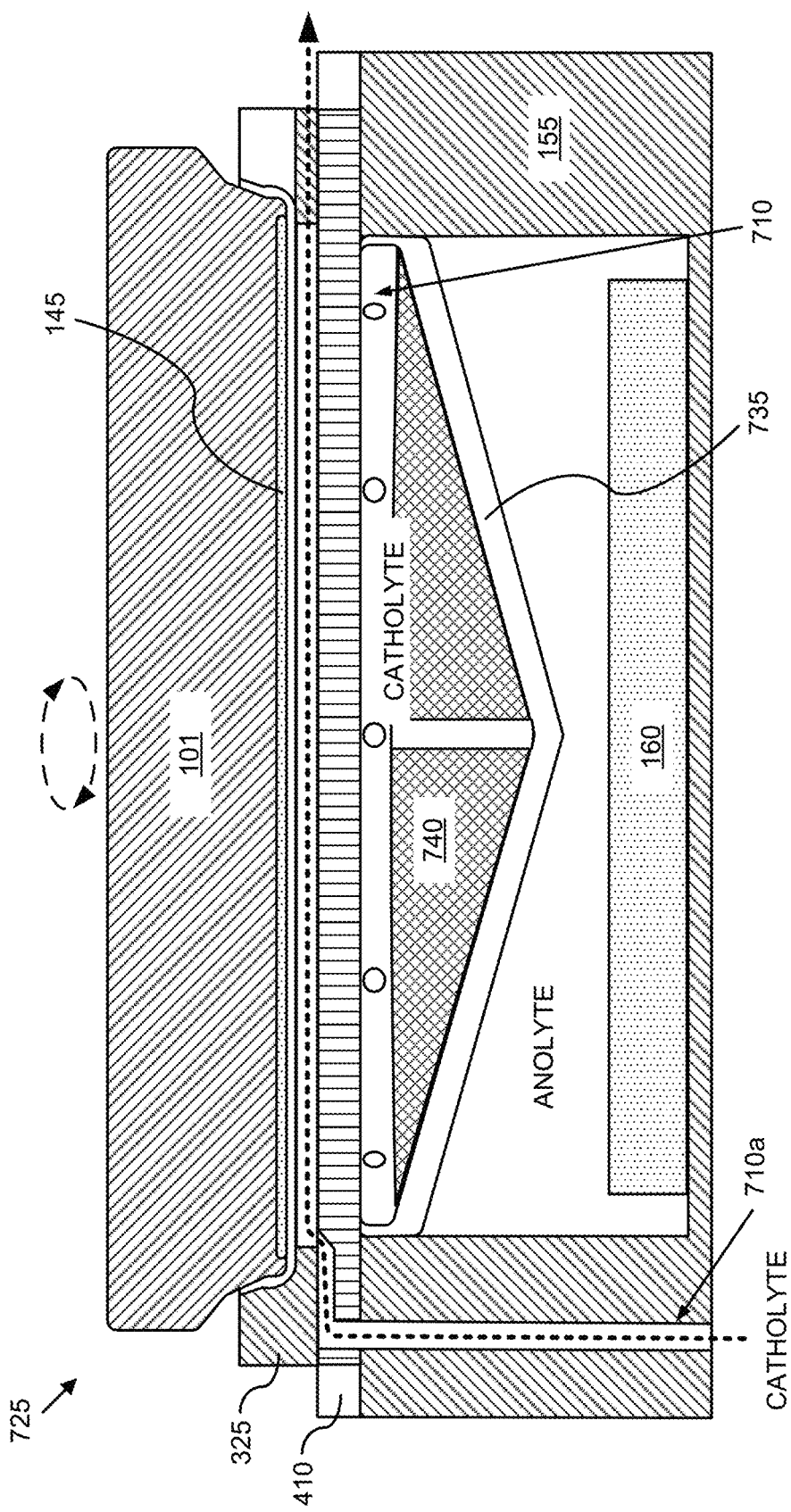

Some embodiments do include electrolyte inlet flow ports configured for transverse flow enhancement in conjunction with flow shaping plate and flow diverter assemblies. FIG. 1H depicts a cross-section of components of a plating apparatus, 725, for plating copper onto a wafer, 145, which is held, positioned and rotated by wafer holder 101. Apparatus 725 includes a plating cell, 155, which is dual chamber cell, having an anode chamber with a copper anode, 160, and anolyte. The anode chamber and cathode chamber are separated by a cationic membrane 740 which is supported by a support member 735. Plating apparatus 725 includes a flow shaping plate, 410, as described herein. A flow diverter, 325, is on top of flow shaping plate 410, and aides in creating transverse shear flow as described herein. Catholyte is introduced into the cathode chamber (above membrane 740) via flow ports 710. From flow ports 710, catholyte passes through flow plate 410 as described herein and produces impinging flow onto the plating surface of wafer 145. In addition to catholyte flow ports 710, an additional flow port, 710a, introduces catholyte at its exit at a position distal to the vent or gap of flow diverter 325. In this example, flow port 710a's exit is formed as a channel in flow shaping plate 410. The functional result is that catholyte flow is introduced directly into the pseudo chamber formed between the flow plate and the wafer plating surface in order to enhance transverse flow across the wafer surface and thereby normalize the flow vectors across the wafer (and flow plate 410).

Figure 1I:
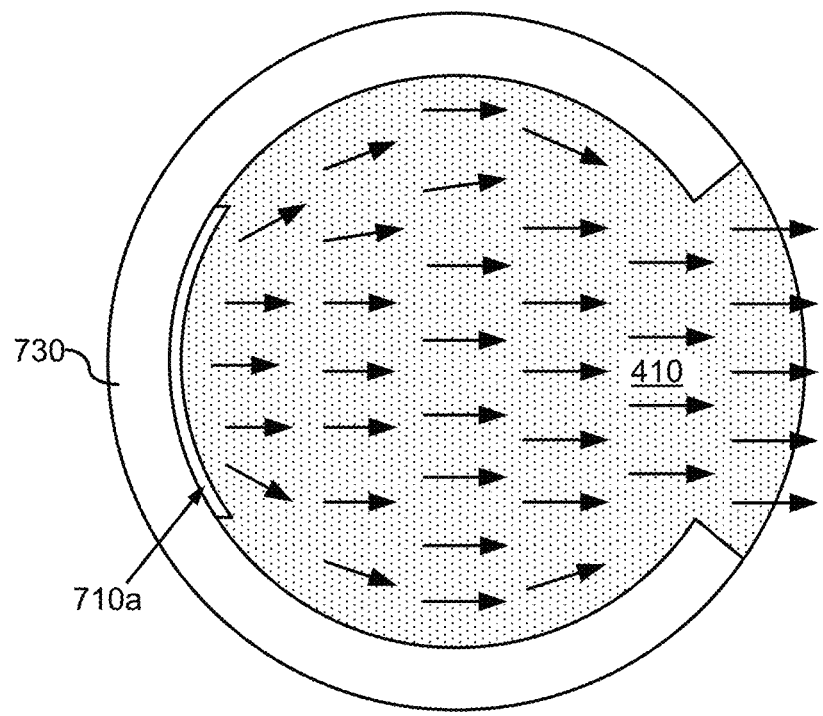
Figure 1J:
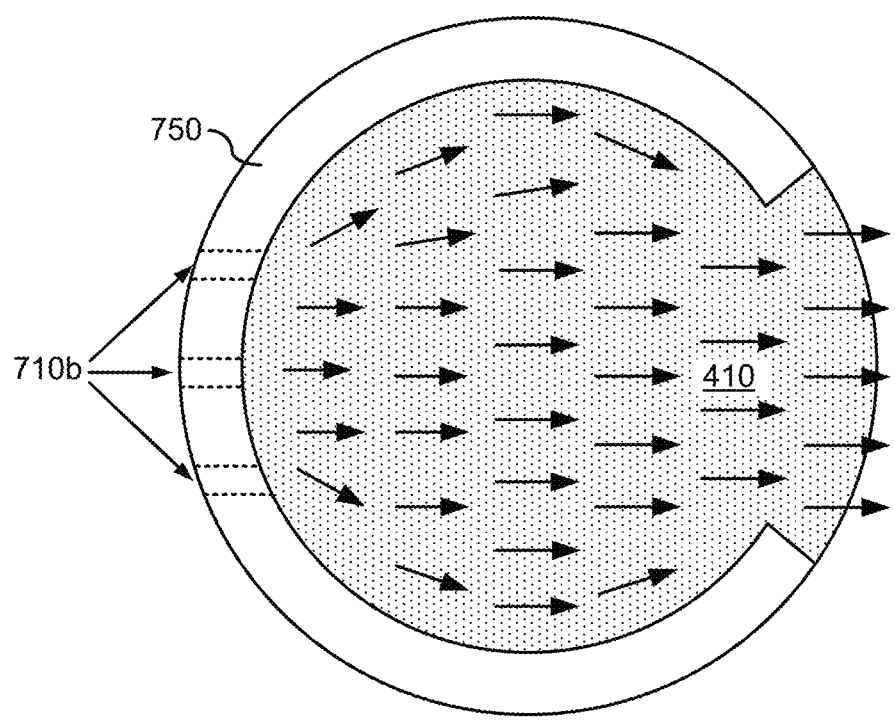

FIG. 1I depicts a flow diagram depicting the flow port 710a (from FIG. 1H). As seen in FIG. 1I, flow port 710a's exit spans 90 degrees of the inner circumference of flow diverter 325. One of ordinary skill in the art would appreciate that the dimensions, configuration and location of port 710a may vary without escaping the scope of the invention. One of skill in the art would also appreciate that equivalent configurations would include having the catholyte exit from a port or channel in flow diverter 325 and/or in combination with a channel such as depicted in FIG. 1H (in flow plate 410). Other embodiments include one or more ports in the (lower) side wall of a flow diverter, i.e. that side wall nearest the flow shaping plate top surface, where the one or more ports are located in a portion of the flow diverter opposite the vent or gap. FIG. 1J depicts a flow diverter, 750, assembled with a flow shaping plate 410, where flow diverter 750 has catholyte flow ports, 710b, that supply electrolyte from the flow diverter opposite the gap of the flow diverter. Flow ports such as 710a and 710b may supply electrolyte at any angle relative to the wafer plating surface or the flow shaping plate top surface. The one or more flow ports can deliver impinging flow to the wafer surface and/or transverse (shear) flow.

In one embodiment, for example as described in relation to FIGS. 1H-J, a flow shaping plate as described herein is used in conjunction with a flow diverter, where a flow port configured for enhanced transverse flow (as described herein) is also used with the flow plate/flow diverter assembly. In one embodiment the flow shaping plate has non-uniform hole distribution, in one embodiment, a spiral hole pattern.

Terminology and Flow Paths

Numerous figures are provided to further illustrate and explain the embodiments disclosed herein. The figures include, among other things, various drawings of the structural elements and flow paths associated with a disclosed electroplating apparatus. These elements are given certain names/reference numbers, which are used consistently in describing FIGS. 2 through 22A-22B.

The following embodiments assume, for the most part, that electroplating apparatus includes a separate anode chamber. The described features are contained in a cathode chamber, which includes a membrane frame 274 and membrane 202 that separate the anode chamber from the cathode chamber. Any number of possible anode and anode chamber configurations may be employed. In the following embodiments, the catholyte contained in the cathode chamber is largely located either in a cross flow manifold 226 or in the channeled ionically resistive plate manifold 208 or in channels 258 and 262 for delivering catholyte to these two separate manifolds.

Much of the focus in the following description is on controlling the catholyte in the cross flow manifold 226. The catholyte enters the cross flow manifold 226 through two separate entry points: (1) the channels in the channeled ionically resistive plate 206 and (2) cross flow initiating structure 250. The catholyte arriving in the cross flow manifold 226 via the channels in the CIRP 206 is directed toward the face of the work piece, typically in a substantially perpendicular direction. Such channel delivered catholyte may form small jets that impinge on the face of the work piece, which is typically rotating slowly (e.g., between about 1 to 30 rpm) with respect to the channeled plate. The catholyte arriving in the cross flow manifold 226 via the cross flow initiating structure 250 is, in contrast, directed substantially parallel to the face of the work piece.

As indicated in the discussion above, a "channeled ionically resistive plate" 206 (or "channeled ionically resistive element" or "CIRP") is positioned between the working electrode (the wafer or substrate) and the counter electrode (the anode) during plating, in order to shape the electric field and control electrolyte flow characteristics. Various figures herein show the relative position of the channeled ionically resistive plate 206 with respect to other structural features of the disclosed apparatus. One example of such an ionically resistive element 206 is described in U.S. Pat. No. 8,308,931, filed Nov. 7, 2008, which was previously incorporated by reference herein in its entirety. The channeled ionically resistive plate described therein is suitable to improve radial plating uniformity on wafer surfaces such as those containing relatively low conductivity or those containing very thin resistive seed layers. Further aspects of certain embodiments of the channeled element are described below.

A "membrane frame" 274 (sometimes referred to as an anode membrane frame in other documents) is a structural element employed in some embodiments to support a membrane 202 that separates an anode chamber from a cathode chamber. It may have other features relevant to certain embodiments disclosed herein. Particularly, with reference to the embodiments of the figures, it may include flow channels 258 and 262 for delivering catholyte toward a cross flow manifold 226 and showerhead 242 configured to deliver cross flowing catholyte to the cross flow manifold 226. The membrane frame 274 may also contain a cell weir wall 282, which is useful in determining and regulating the uppermost level of the catholyte. Various figures herein depict the membrane frame 274 in the context of other structural features associated with the disclosed cross flow apparatus.

Figure 2:
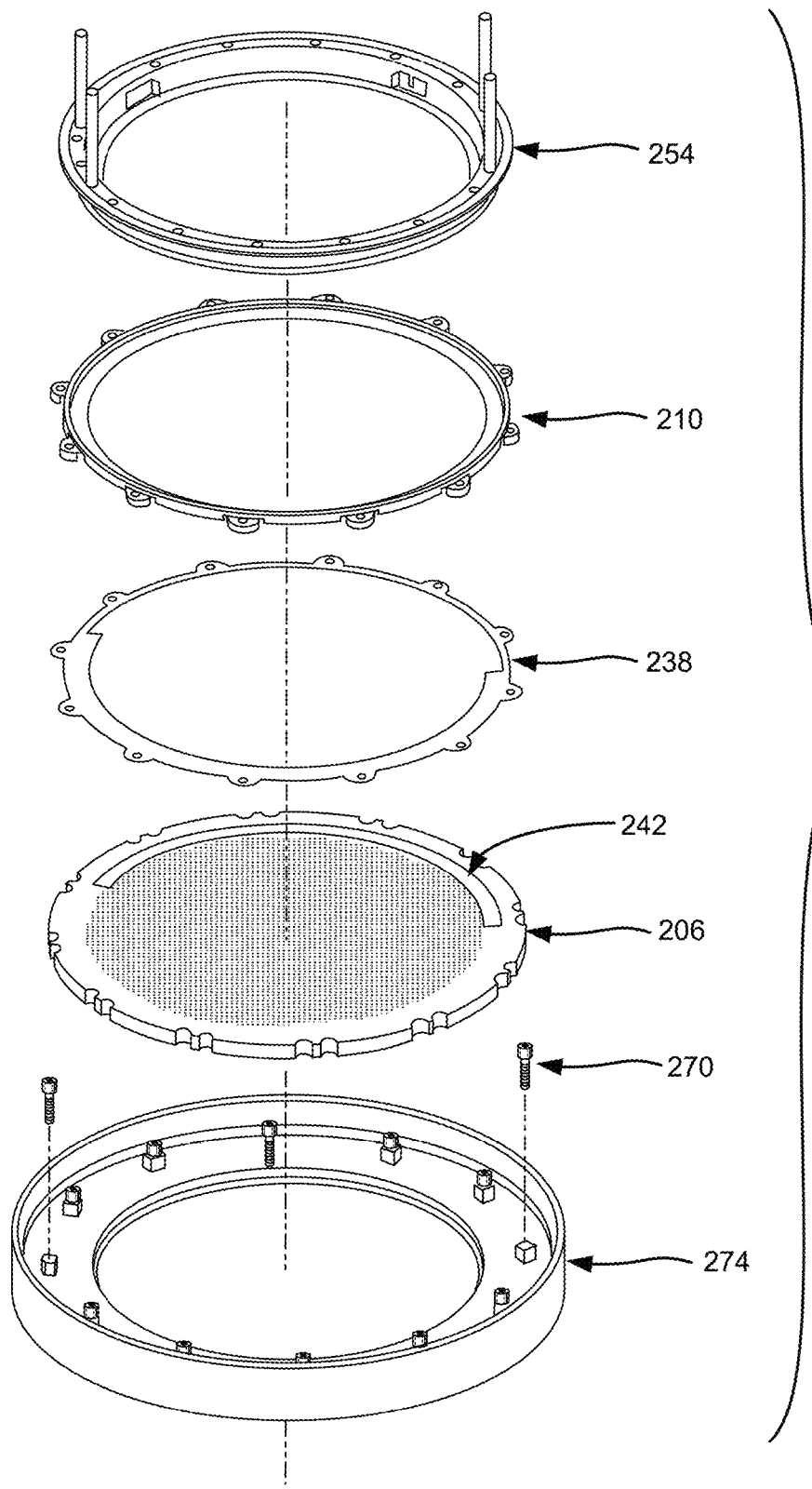
FIG. 2 illustrates an exploded view of various parts of an electroplating apparatus typically present in the cathode chamber in accordance with certain embodiments disclosed herein.

Turning to FIG. 2, the membrane frame 274 is a rigid structural member for holding a membrane 202 that is typically an ion exchange membrane responsible for separating an anode chamber from a cathode chamber. As explained, the anode chamber may contain electrolyte of a first composition while the cathode chamber contains electrolyte of a second composition. The membrane frame 274 may also include a plurality of fluidic adjustment rods 270 (sometimes referred to as flow constricting elements) which may be used to help control fluid delivery to the channeled ionically resistive element 206. The membrane frame 274 defines the bottom-most portion of the cathode chamber and the uppermost portion of the anode chamber. The described components are all located on the work piece side of an electrochemical plating cell above the anode chamber and the anode chamber membrane 202. They can all be viewed as being part of a cathode chamber. It should be understood, however, that certain implementations of a cross flow injection apparatus do not employ a separated anode chamber, and hence a membrane frame 274 is not essential.

Located generally between the work piece and the membrane frame 274 is the channeled ionically resistive plate 206, as well as a cross flow ring gasket 238 and wafer cross flow confinement ring 210, which may each be affixed to the channeled ionically resistive plate 206. More specifically, the cross flow ring gasket 238 may be positioned directly atop the CIRP 206, and the wafer cross flow confinement ring 210 may be positioned over the cross flow ring gasket 238 and affixed to a top surface of the channeled ionically resistive plate 206, effectively sandwiching the gasket 238. Various figures herein show the cross flow confinement ring 210 arranged with respect to the channeled ionically resistive plate 206.

Figure 8A:
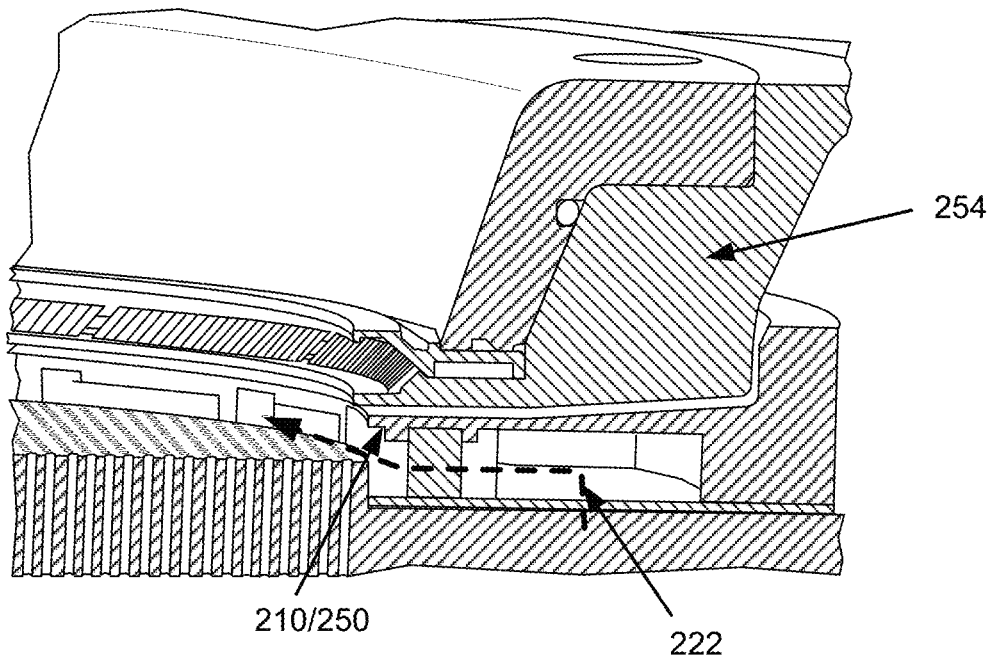
FIGS. 8A-8B depict an initial (8A) and revised (8B) design of a cross flow inlet region according to certain embodiments.
Figure 8B:
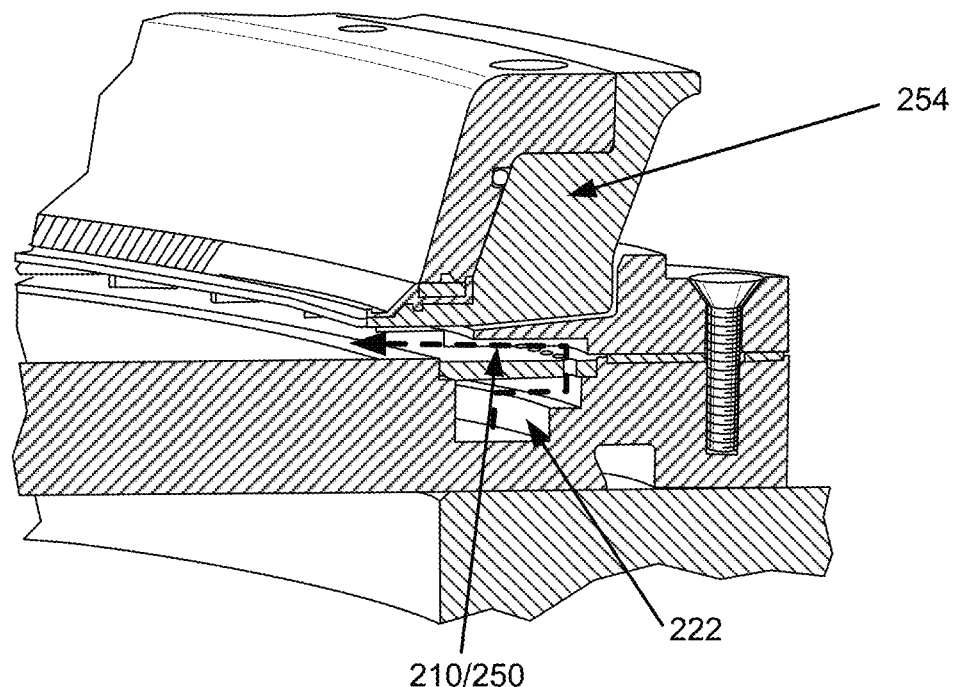

The upper most relevant structural feature of the present disclosure, as shown in FIG. 2, is a work piece or wafer holder. In certain embodiments, the work piece holder may be a cup 254, which is commonly used in cone and cup clamshell type designs such as the design embodied in Novellus Systems' Sabre® electroplating tool mentioned above. FIGS. 2 and 8A-8B, for example, show the relative orientation of the cup 254 with respect to other elements of the apparatus.

Figure 3A:
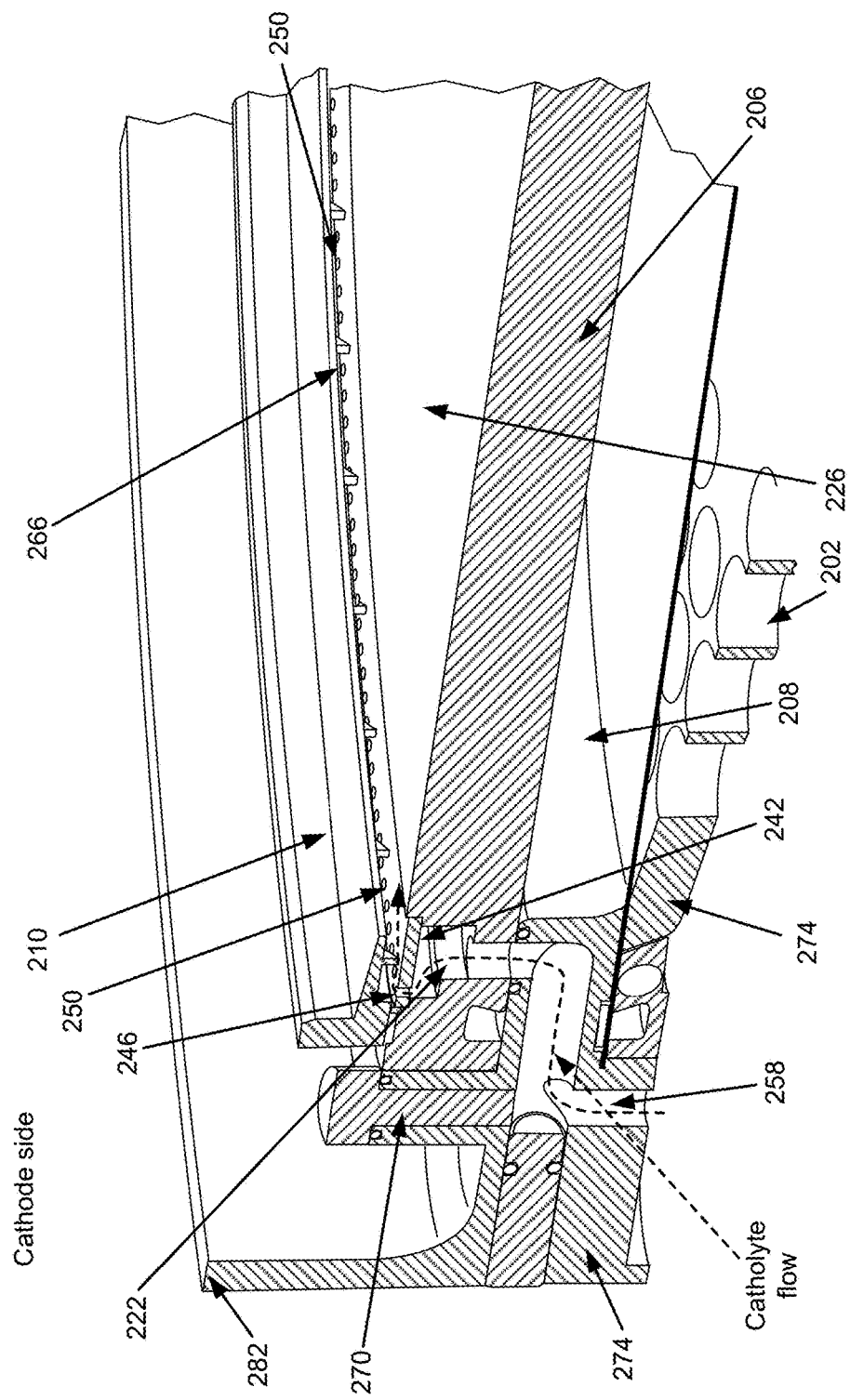
FIG. 3A shows a close-up view of a cross flow side inlet and surrounding hardware in accordance with certain embodiments herein.
Figure 3B:
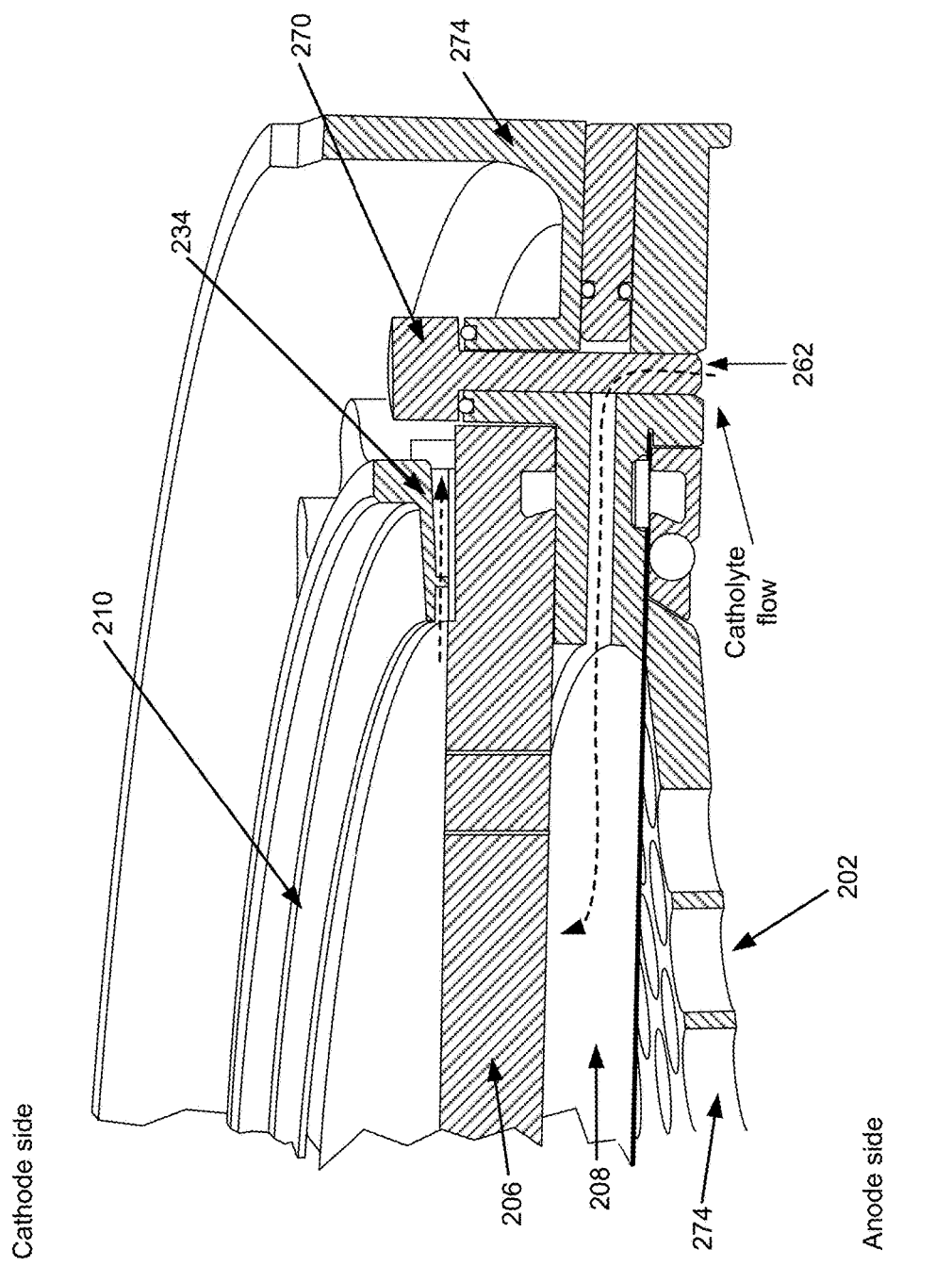
FIG. 3B shows a close-up view of a cross flow outlet, a CIRP manifold inlet, and surrounding hardware in accordance with various disclosed embodiments.
Figure 4:
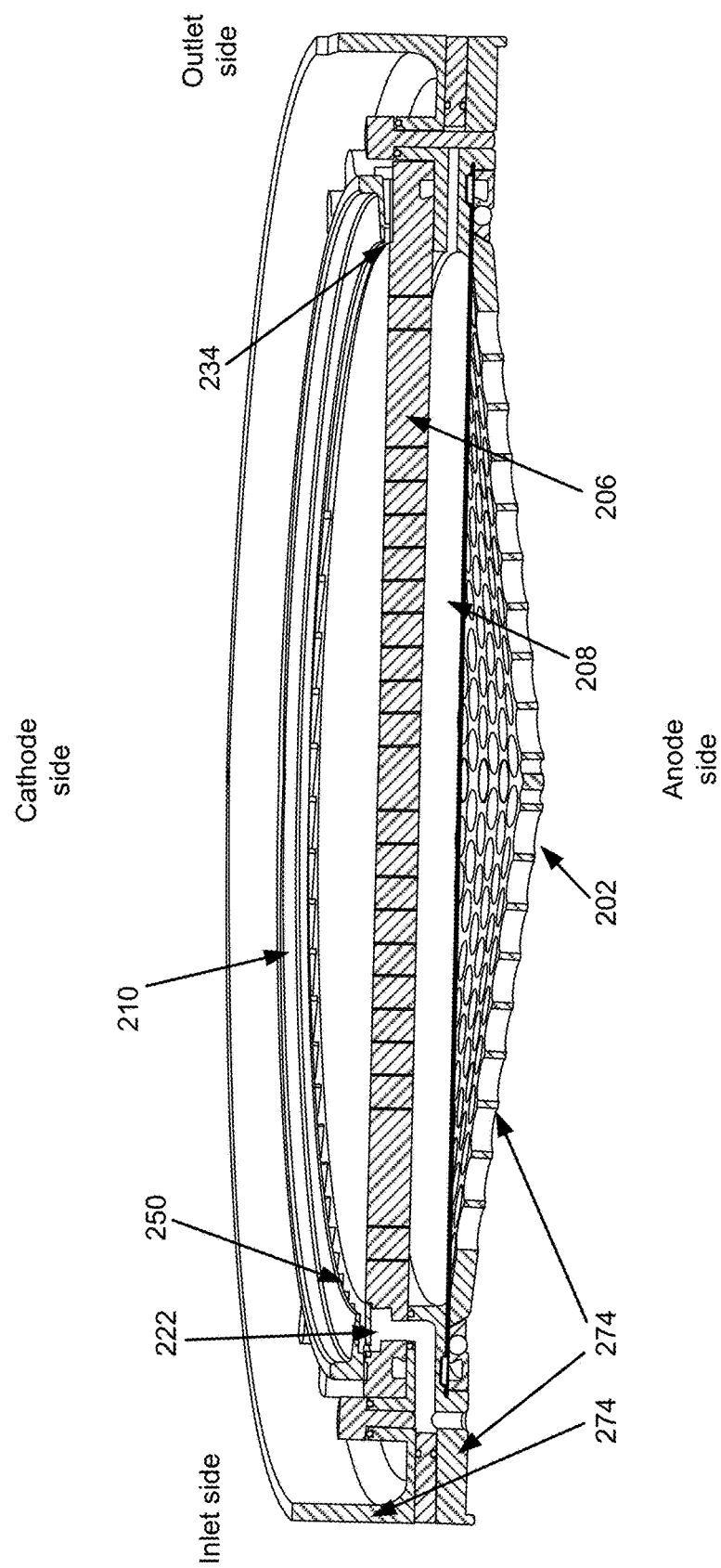
FIG. 4 depicts a cross-sectional view of various parts of the electroplating apparatus shown in FIGS. 3A-3B.

FIG. 3A shows a close-up cross sectional view of a cross flow inlet side according to an embodiment disclosed herein. FIG. 3B shows a close-up cross sectional view of the cross flow outlet side according to an embodiment herein. FIG. 4 shows a cross-sectional view of a plating apparatus showing both the inlet and outlet sides, in accordance with certain embodiments herein. During a plating process, catholyte fills and occupies the region between the top of the membrane 202 on the membrane frame 274 and the membrane frame weir wall 282. This catholyte region can be subdivided into three sub-regions: 1) a channeled ionically resistive plate manifold region 208 below the CIRP 206 and (for designs employing an anode chamber cationic membrane) above the separated-anode-chambers cationic-membrane 202 (this element is also sometimes referred to as a lower manifold region 208), 2) the cross flow manifold region 226, between the wafer and the upper surface of the CIRP 206, and 3) an upper cell region or "electrolyte containment region", outside of the clamshell/cup 254 and inside the cell weir wall 282 (which is a physical part of the membrane frame 274). When the wafer is not immersed and the clamshell/cup 254 is not in the down position, the second region and third region are combined into one region.

Region (2) above, between the top of the channeled ionically resistive plate 206 and the bottom of the workpiece when installed in the workpiece holder 254 contains catholyte and is referred to as the "cross flow manifold" 226. In some embodiments, catholyte enters the cathode chamber via a single inlet port. In other embodiments, catholyte enters the cathode chamber through one or more ports located elsewhere in the plating cell. In some cases, there is a single inlet for the bath of the cell, peripheral to the anode chamber and cut out of the anode chamber cell walls. This inlet connects to a central catholyte inlet manifold at the base of the cell and anode chamber. In certain disclosed embodiments, that main catholyte manifold chamber feeds a plurality of catholyte chamber inlet holes (e.g., 12 catholyte chamber inlet holes). In various cases, these catholyte chamber inlet holes are divided into two groups: one group which feeds catholyte to a cross flow injection manifold 222, and a second group which feeds catholyte to the CIRP manifold 208. FIG. 3B shows a cross section of a single inlet hole feeding the CIRP manifold 208 through channel 262. The dotted line indicates the path of fluid flow.

The separation of catholyte into two different flow paths or streams occurs at the base of the cell in the central catholyte inlet manifold (not shown). That manifold is fed by a single pipe connected to the base of the cell. From the main catholyte manifold, the flow of catholyte separates into two streams: 6 of the 12 feeder holes, located on one side of the cell, lead to source the CIRP manifold region 208 and eventually supply the impinging catholyte flow through the CIRP's various microchannels. The other 6 holes also feed from the central catholyte inlet manifold, but then lead to the cross flow injection manifold 222, which then feeds the cross flow shower head's 242 distribution holes 246 (which may number more than 100). After leaving the cross flow shower head holes 246, the catholyte's flow direction changes from (a) normal to the wafer to (b) parallel to the wafer. This change in flow occurs as the flow impinges upon and is confined by a surface in the cross flow confinement ring 210 inlet cavity 250. Finally, upon entering the cross flow manifold region 226, the two catholyte flows, initially separated at the base of the cell in the central catholyte inlet manifold, are rejoined.

In the embodiments shown in the figures, a fraction of the catholyte entering the cathode chamber is provided directly to the channeled ionically resistive plate manifold 208 and a portion is provided directly to the cross flow injection manifold 222. At least some, and often but not always all of the catholyte delivered to the channeled ionically resistive plate manifold 208 and then to the CIRP lower surface passes through the various microchannels in the plate 206 and reaches the cross flow manifold 226. The catholyte entering the cross flow manifold 226 through the channels in the channeled ionically resistive plate 206 enters the cross flow manifold as substantially vertically directed jets (in some embodiments the channels are made at an angle, so they are not perfectly normal to the surface of the wafer, e.g., the angle of the jet may be up to about 45 degrees with respect to the wafer surface normal). The portion of the catholyte that enters the cross flow injection manifold 222 is delivered directly to the cross flow manifold 226 where it enters as a horizontally oriented cross flow below the wafer. On its way to the cross flow manifold 226, the cross flowing catholyte passes through the cross flow injection manifold 222 and the cross flow shower head plate 242 (which, e.g., contains about 139 distributed holes 246 having a diameter of about 0.048"), and is then redirected from a vertically upwards flow to a flow parallel to the wafer surface by the actions/geometry of the cross-flow-confinement-ring's 210 entrance cavity 250.

The absolute angles of the cross flow and the jets need not be exactly horizontal or exactly vertical or even oriented at exactly 90° with one another. In general, however, the cross flow of catholyte in the cross flow manifold 226 is generally along the direction of the work piece surface and the direction of the jets of catholyte emanating from the top surface of the microchanneled ionically resistive plate 206 generally flow towards/perpendicular to the surface of the work piece.

As mentioned, the catholyte entering the cathode chamber is divided between (i) catholyte that flows from the channeled ionically resistive plate manifold 208, through the channels in the CIRP 206 and then into the cross flow manifold 226 and (ii) catholyte that flows into the cross flow injection manifold 222, through the holes 246 in the showerhead 242, and then into the cross flow manifold 226. The flow directly entering from the cross flow injection manifold region 222 may enter via the cross flow confinement ring entrance ports, sometimes referred to as cross flow side inlets 250, and emanate parallel to the wafer and from one side of the cell. In contrast, the jets of fluid entering the cross flow manifold region 226 via the microchannels of the CIRP 206 enter from below the wafer and below the cross flow manifold 226, and the jetting fluid is diverted (redirected) within the cross flow manifold 226 to flow parallel to the wafer and towards the cross flow confinement ring exit port 234, sometimes also referred to as the cross flow outlet or outlet.

In some embodiments, the fluid entering the cathode chamber is directed into multiple channels 258 and 262 distributed around the periphery of the cathode chamber portion of the electroplating cell chamber (often a peripheral wall). In a specific embodiment, there are 12 such channels contained in the wall of the cathode chamber.

The channels in the cathode chamber walls may connect to corresponding "cross flow feed channels" in the membrane frame. Some of these feed channels 262 deliver catholyte directly to the channeled ionically resistive plate manifold 208. As mentioned, the catholyte provided to this manifold subsequently passes through the small vertically oriented channels of the channeled ionically resistive plate 206 and enters the cross flow manifold 226 as jets of catholyte.

As mentioned, in an embodiment depicted in the figures, catholyte feeds the "CIRP manifold chamber" 208 through 6 of the 12 catholyte feeder lines/tubes. Those 6 main tubes or lines 262 feeding the CIRP manifold 208 reside below the cross flow confinement ring's exit cavity 234 (where the fluid passes out of the cross flow manifold region 226 below the wafer), and opposite all the cross flow manifold components (cross flow injection manifold 222, showerhead 242, and confinement ring entrance cavity 250).

As depicted in various figures, some cross flow feed channels 258 in the membrane frame lead directly to the cross flow injection manifold 222 (e.g., 6 of 12). These cross flow feed channels 258 start at the base of the anode chamber of the cell and then pass through matching channels of the membrane frame 274 and then connect with corresponding cross flow feed channels 258 on the lower portion of the channeled ionically resistive plate 206. See FIG. 3A, for example.

In a specific embodiment, there are six separate feed channels 258 for delivering catholyte directly to the cross flow injection manifold 222 and then to the cross flow manifold 226. In order to effect cross flow in the cross flow manifold 226, these channels 258 exit into the cross flow manifold 226 in an azimuthally non-uniform manner. Specifically, they enter the cross flow manifold 226 at a particular side or azimuthal region of the cross flow manifold 226. In a specific embodiment depicted in FIG. 3A, the fluid paths 258 for directly delivering catholyte to the cross flow injection manifold 222 pass through four separate elements before reaching the cross flow injection manifold 222: (1) dedicated channels in the cell's anode chamber wall, (2) dedicated channels in the membrane frame 274, (3) dedicated channels the channeled ionically resistive element 206 (i.e., not the 1-D channels used for delivering catholyte from the CIRP manifold 208 to the cross flow manifold 226), and finally, (4) fluid paths in the wafer cross flow confinement ring 210.

As mentioned, the portions of the flow paths passing through the membrane frame 274 and feeding the cross flow injection manifold 222 are referred to as cross flow feed channels 258 in the membrane frame. The portions of the flow paths passing through the microchanneled ionically resistive plate 206 and feeding the CIRP manifold are referred to as cross flow feed channels 262 feeding the channeled ionically resistive plate manifold 208, or CIRP manifold feed channels 262. In other words, the term "cross flow feed channel" includes both the catholyte feed channels 258 feeding the cross flow injection manifold 222 and the catholyte feed channels 262 feeding the CIRP manifold 208. One difference between these flows 258 and 262 was noted above: the direction of the flow through the CIRP 206 is initially directed at the wafer and is then turned parallel to the wafer due to the presence of the wafer and the cross flow confinement ring 210, whereas the cross flow portion coming from the cross flow injection manifold 222 and out through the cross flow confinement ring entrance ports 250 starts substantially parallel to the wafer. While not wishing to be held to any particular model or theory, this combination and mixing of impinging and parallel flow is believed to facilitate substantially improved flow penetration within a recessed/embedded feature and thereby improve the mass transfer. By creating a spatially uniform convective flow field under the wafer and rotating the wafer, each feature, and each die, exhibits a nearly identical flow pattern over the course of the rotation and the plating process.

The flow path within the channeled ionically resistive plate 206 that does not pass through the plate's microchannels (instead entering the cross flow manifold 226 as flow parallel to the face of the wafer) begins in a vertically upward direction as it passes through the cross flow feed channel 258 in the plate 206, and then enters a cross flow injection manifold 222 formed within the body of the channeled ionically resistive plate 206. The cross flow injection manifold 222 is an azimuthal cavity which may be a dug out channel within the plate 206 that can distribute the fluid from the various individual feed channels 258 (e.g., from each of the individual 6 cross flow feed channels) to the various multiple flow distribution holes 246 of the cross flow shower head plate 242. This cross flow injection manifold 222 is located along an angular section of the peripheral or edge region of the channeled ionically resistive plate 206. See for example FIGS. 3A and 4-6. In certain embodiments, the cross flow injection manifold 222 forms a C-shaped structure over an angle of about 90 to 180° of the plate's perimeter region. In certain embodiments, the angular extent of the cross flow injection manifold 222 is about 120 to about 170°, and in a more specific embodiment is between about 140 and 150°. In these or other embodiments, the angular extent of the cross flow injection manifold 222 is at least about 90°. In many implementations, the showerhead 242 spans approximately the same angular extent as the cross flow injection manifold 222. Further, the overall inlet structure 250 (which in many cases includes one or more of the cross flow injection manifold 222, the showerhead 242, the showerhead holes 246, and an opening in the cross flow confinement ring) may span these same angular extents.

Figure 5:
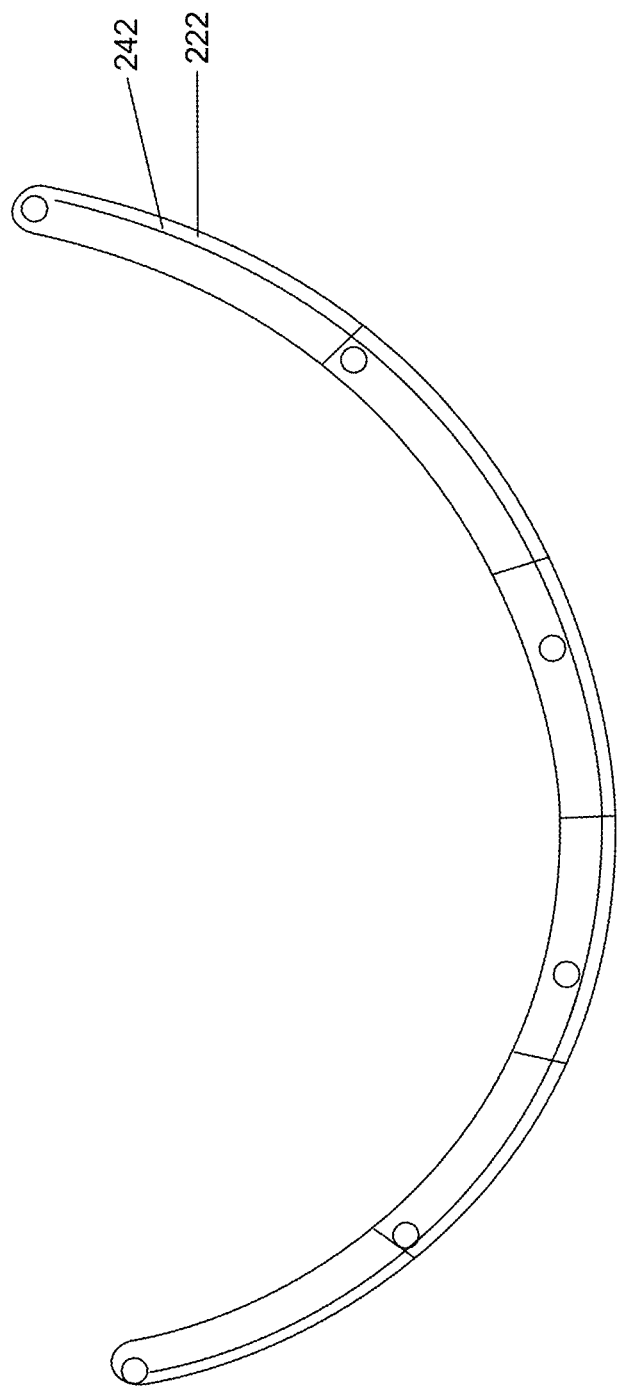
FIG. 5 shows a cross flow injection manifold and showerhead split into 6 individual segments according to certain embodiments.

In some embodiments, the cross flow in the injection manifold 222 forms a continuous fluidically coupled cavity within the channeled ionically resistive plate 206. In this case all of the cross flow feed channels 258 feeding the cross flow injection manifold (e.g., all 6) exit into one continuous and connected cross flow injection manifold chamber. In other embodiments, the cross flow injection manifold 222 and/or the cross flow showerhead 242 are divided into two or more angularly distinct and completely or partially separated segments, as shown in FIG. 5 (which shows 6 separated segments). In some embodiments, the number of angularly separated segments is between about 1-12, or between about 4-6. In a specific embodiment, each of these angularly distinct segments is fluidically coupled to a separate cross flow feed channel 258 disposed in the channeled ionically resistive plate 206. Thus, for example, there may be six angularly distinct and separated subregions within the cross flow injection manifold 222. In certain embodiments, each of these distinct subregions of the cross flow injection manifold 222 has the same volume and/or the same angular extent.

Figure 6:
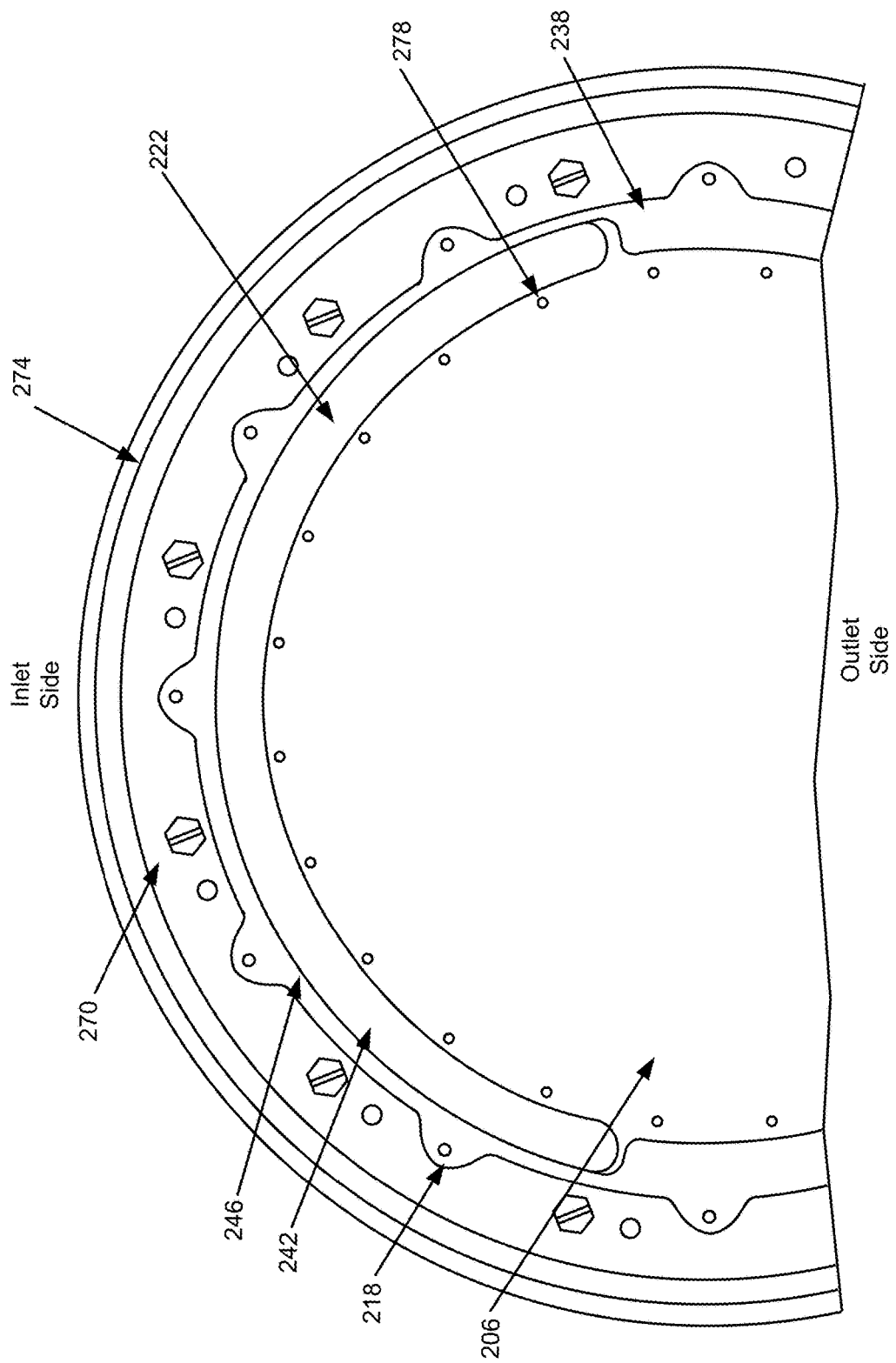
FIG. 6 shows a top view of a CIRP and associated hardware according to an embodiment herein, focusing especially on the inlet side of the cross flow.

In many cases, catholyte exits the cross flow injection manifold 222 and passes through a cross flow showerhead plate 242 having many angularly separated catholyte outlet ports (holes) 246. See for example FIGS. 2, 3A-3B and 6.=. In certain embodiments, the cross flow showerhead plate 242 is integrated into the channeled ionically resistive plate 206, as shown in FIG. 6 for example. In some embodiments the showerhead plate 242 is glued, bolted, or otherwise affixed to the top of the cross flow injection manifold 222 of the channeled ionically resistive plate 206. In certain embodiments, the top surface of the cross flow showerhead 242 is flush with or slightly elevated above a plane or top surface of the channeled ionically resistive plate 206. In this manner, catholyte flowing through the cross flow injection manifold 222 may initially travel vertically upward through the showerhead holes 246 and then laterally under the cross flow confinement ring 210 and into the cross flow manifold 226 such that the catholyte enters the cross flow manifold 226 in a direction that is substantially parallel with the top face of the channeled ionically resistive plate. In other embodiments, the showerhead 242 may be oriented such that catholyte exiting the showerhead holes 246 is already traveling in a wafer-parallel direction.

In a specific embodiment, the cross flow showerhead 242 has 139 angularly separated catholyte outlet holes 246. More generally, any number of holes that reasonably establish uniform cross flow within the cross flow manifold 226 may be employed. In certain embodiments, there are between about 50 and about 300 such catholyte outlet holes 246 in the cross flow showerhead 242. In certain embodiments, there are between about 100 and 200 such holes. In certain embodiments, there are between about 120 and 160 such holes. Generally, the size of the individual ports or holes 246 can range from about 0.020" to 0.10", more specifically from about 0.03" to 0.06" in diameter.

In certain embodiments, these holes 246 are disposed along the entire angular extent of the cross flow showerhead 242 in an angularly uniform manner (i.e. the spacing between the holes 246 is determined by a fixed angle between the cell center and two adjacent holes). See for example FIGS. 3A and 7. In other embodiments, the holes 246 are distributed along the angular extent in an angularly non-uniform manner. In further embodiments, the angularly non-uniform hole distribution is nevertheless a linearly ("x" direction") uniform distribution. Put another way, in this latter case, the hole distribution is such that the holes are spaced equally far apart if projected onto an axis perpendicular to the direction of cross flow (this axis is the "x" direction). Each hole 246 is positioned at the same radial distance from the cell center, and is spaced the same distance in the "x" direction from adjacent holes. The net effect of having these angularly non-uniform holes 246 is that the overall cross flow pattern is much more uniform. These two types of arrangements for the cross flow shower head holes 246 are examined further in the Experimental section, below. See FIG. 22B and the associated discussion below.

In certain embodiments, the direction of the catholyte exiting the cross flow showerhead 242 is further controlled by a wafer cross flow confinement ring 210. In certain embodiments, this ring 210 extends over the full circumference of the channeled ionically resistive plate 206. In certain embodiments, a cross section of the cross flow confinement ring 210 has an L-shape, as shown in FIGS. 3A and 4. In certain embodiments, the wafer cross flow confinement ring 210 contains a series of flow directing elements such as directional fins 266 in fluidic communication with the outlet holes 246 of the cross flow showerhead 242. More specifically, the directional fins 266 define largely segregated fluid passages under an upper surface of the wafer cross flow confinement ring 210 and between adjacent directional fins 266. In some cases, the purpose of the fins 266 is to redirect and confine flow exiting from the cross flow showerhead holes 246 from an otherwise radially inward direction to a "left to right" flow trajectory (left being the inlet side 250 of the cross flow, right being the outlet side 234). This helps to establish a substantially linear cross flow pattern. The catholyte exiting the holes 246 of the cross flow showerhead 242 is directed by the directional fins 266 along a flow streamline caused by the orientation of the directional fins 266. In certain embodiments, all the directional fins 266 of the wafer cross flow confinement ring 210 are parallel to one another. This parallel arrangement helps to establish a uniform cross flow direction within the cross flow manifold 226. In various embodiments, the directional fins 226 of the wafer cross flow confinement ring 210 are disposed both along the inlet 250 and outlet 234 side of the cross flow manifold 226. This is illustrated in the top view of FIG. 7, for example.

As indicated, catholyte flowing in the cross flow manifold 226 passes from an inlet region 250 of the wafer cross flow confinement ring 210 to an outlet side 234 of the ring 210, as shown in FIGS. 3B and 4. At the outlet side 234, in certain embodiments, there are multiple directional fins 266 that may be parallel to and may align with the directional fins 266 on the inlet side. The cross flow passes through channels created by the directional fins 266 on the outlet side 234 and then ultimately and directly out of the cross flow manifold 226. The flow then passes into another region of the cathode chamber generally radially outwards and beyond the wafer holder 254 and cross flow confinement ring 210, with fluid collected and temporarily retained by the upper weir wall 282 of the membrane frame before flowing over the weir 282 for collection and recirculation. It should therefore be understood that the figures (e.g., FIGS. 3A, 3B and 4) show only a partial path of the entire circuit of catholyte entering and exiting the cross flow manifold. Note that, in the embodiment depicted in FIGS. 3B and 4, for example, fluid exiting from the cross flow manifold 226 does not pass through small holes or back through channels analogous to the feed channels 258 on the inlet side, but rather passes outward in a generally parallel-to-the wafer direction as it is accumulated in the aforementioned accumulation region.

FIG. 6 shows a top view of the cross flow manifold 226 depicting an embedded cross flow injection manifold 222 within the channeled ionically resistive plate 206, along with the showerhead 242 and 139 outlet holes 246. All six fluidic adjustment rods 270 for the cross flow injection manifold flow are also shown. The cross flow confinement ring 210 is not installed in this depiction, but the outline of the cross flow confinement ring sealing gasket 238, which seals between the cross flow confinement ring 210 and the upper surface of the CIRP 206, is shown. Other elements which are shown in FIG. 6 include the cross flow confinement ring fasteners 218, membrane frame 274, and screw holes 278 on the anode side of the CIRP 206 (which may be used for a cathodic shielding insert, for example).

In some embodiments, the geometry of the cross flow confinement ring outlet 234 may be tuned in order to further optimize the cross flow pattern. For example, a case in which the cross flow pattern diverges to the edge of the confinement ring 210 may be corrected by reducing the open area in the outer regions of the cross flow confinement ring outlet 234. In certain embodiments, the outlet manifold 234 may include separated sections or ports, much like the cross flow injection manifold 222. In some embodiments, the number of outlet sections is between about 1-12, or between about 4-6. The ports are azimuthally separated, occupying different (usually adjacent) positions along the outlet manifold 234. The relative flow rates through each of the ports may be independently controlled in some cases. This control may be achieved, for example, by using control rods 270 similar to the control rods described in relation to the inlet flow. In another embodiment, the flow through the different sections of the outlet can be controlled by the geometry of the outlet manifold. For example, an outlet manifold that has less open area near each side edge and more open area near the center would result in a solution flow pattern where more flow exits near the center of the outlet and less flow exits near the edges of the outlet. Other methods of controlling the relative flow rates through the ports in the outlet manifold 234 may be used as well (e.g., pumps, etc.).

As mentioned, bulk catholyte entering the catholyte chamber is directed separately into the cross flow injection manifold 222 and the channeled ionically resistive plate manifold 208 through multiple channels 258 and 262, e.g., 12 separate channels. In certain embodiments, the flows through these individual channels 258 and 262 are independently controlled from one another by an appropriate mechanism. In some embodiments, this mechanism involves separate pumps for delivering fluid into the individual channels. In other embodiments, a single pump is used to feed a main catholyte manifold, and various flow restriction elements that are adjustable may be provided in one or more of the channels feeding the flow path provided so as to modulate the relative flows between the various channels 258 and 262 and between the cross flow injection manifold 222 and CIRP manifold 208 regions and/or along the angular periphery of the cell. In various embodiments depicted in the figures, one or more fluidic adjustment rods 270 (sometimes also referred to as flow control elements) are deployed in the channels where independent control is provided. In the depicted embodiments, the fluidic adjustment rod 270 provides an annular space in which catholyte is constricted during its flow toward the cross flow injection manifold 222 or the channeled ionically resistive plate manifold 208. In a fully retracted state, the fluidic adjustment rod 270 provides essentially no resistance to flow. In a fully engaged state, the fluidic adjustment rod 270 provides maximal resistance to flow, and in some implementations stops all flow through the channel. In intermediate states or positions, the rod 270 allows intermediate levels of constriction of the flow as fluid flows through a restricted annular space between the channel's inner diameter and the fluid adjustment rod's outer diameter.

In some embodiments, the adjustment of the fluidic adjustment rods 270 allows the operator or controller of the electroplating cell to favor flow to either the cross flow injection manifold 222 or to the channeled ionically resistive plate manifold 208. In certain embodiments, independent adjustment of the fluidics adjustment rods 270 in the channels 258 that deliver catholyte directly to the cross flow injection manifold 222 allows the operator or controller to control the azimuthal component of fluid flow into the cross flow manifold 226. The effect of these adjustments are discussed further in the Experimental section below.

FIGS. 8A-8B show cross sectional views of a cross flow injection manifold 222 and corresponding cross flow inlet 250 relative to a plating cup 254. The position of the cross flow inlet 250 is defined, at least in part, by the position of the cross flow confinement ring 210. Specifically, the inlet 250 may be considered to begin where the cross flow confinement ring 210 terminates. Note that in the case of an initial design, seen in FIG. 8A, the confinement ring 210 termination point (and inlet 250 commencement point) was under the edge of the wafer, whereas in a revised design, seen in FIG. 8B, the termination/commencement point is under the plating cup and further radially outward from the wafer edge, as compared to the initial design. Also, the cross flow injection manifold 222 in the earlier design had a step in the cross flow ring cavity (where the generally leftward arrow begins rising upwards) which potentially formed some unwanted turbulence near that point of fluid entry into the cross flow manifold region 226. On wafer data as well as modeling results confirmed these beliefs, as discussed in the Experimental section below. Therefore, it is beneficial to minimize the expansion of the fluid trajectories near the wafer edge and allow the plating solution to transition from the cross flow injection manifold region 222 and enter the increased cross sectional area of the cross flow manifold region 226 by providing some distance (e.g., about 10-15 mm) for the solution flow to become more uniform before flowing across the wafer surface.

The disclosed apparatus may be configured to perform the methods described herein. A suitable apparatus includes hardware as described and shown herein and one or more controllers having instructions for controlling process operations in accordance with the present invention. The apparatus will include one or more controllers for controlling, inter alia, the positioning of the wafer in the cup 254 and cone, the positioning of the wafer with respect to the channeled ionically resistive plate 206, the rotation of the wafer, the delivery of catholyte into the cross flow manifold 226, delivery of catholyte into the CIRP manifold 208, delivery of catholyte into the cross flow injection manifold 222, the resistance/position of the fluidic adjustment rods 270, the delivery of current to the anode and wafer and any other electrodes, the mixing of electrolyte components, the timing of electrolyte delivery, inlet pressure, plating cell pressure, plating cell temperature, wafer temperature, and other parameters of a particular process performed by a process tool.

A system controller will typically include one or more memory devices and one or more processors configured to execute the instructions so that the apparatus will perform a method in accordance with the present invention. The processor may include a central processing unit (CPU) or computer, analog and/or digital input/output connections, stepper motor controller boards, and other like components. Machine-readable media containing instructions for controlling process operations in accordance with the present invention may be coupled to the system controller. Instructions for implementing appropriate control operations are executed on the processor. These instructions may be stored on the memory devices associated with the controller or they may be provided over a network. In certain embodiments, the system controller executes system control software . . . .

System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of an electroplating process may include one or more instructions for execution by the system controller. The instructions for setting process conditions for an immersion process phase may be included in a corresponding immersion recipe phase. In some embodiments, the electroplating recipe phases may be sequentially arranged, so that all instructions for an electroplating process phase are executed concurrently with that process phase.

Other computer software and/or programs may be employed in some embodiments. Examples of programs or sections of programs for this purpose include a substrate positioning program, an electrolyte composition control program, a pressure control program, a heater control program, and a potential/current power supply control program.

In some cases, the controllers control one or more of the following functions: wafer immersion (translation, tilt, rotation), fluid transfer between tanks, etc. The wafer immersion may be controlled by, for example, directing the wafer lift assembly, wafer tilt assembly and wafer rotation assembly to move as desired. The controller may control the fluid transfer between tanks by, for example, directing certain valves to be opened or closed and certain pumps to turn on and off. The controllers may control these aspects based on sensor output (e.g., when current, current density, potential, pressure, etc. reach a certain threshold), the timing of an operation (e.g., opening valves at certain times in a process) or based on received instructions from a user.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Features of a Channeled Ionically Resistive Element
Electrical Function

In certain embodiments, the channeled ionically resistive element 206 approximates a nearly constant and uniform current source in the proximity of the substrate (cathode) and, as such, may be referred to as a high resistance virtual anode (HRVA) in some contexts. Normally, the CIRP 206 is placed in close proximity with respect to the wafer. In contrast, an anode in the same close-proximity to the substrate would be significantly less apt to supply a nearly constant current to the wafer, but would merely support a constant potential plane at the anode metal surface, thereby allowing the current to be greatest where the net resistance from the anode plane to the terminus (e.g., to peripheral contact points on the wafer) is smaller. So while the channeled ionically resistive element 206 has been referred to as a high-resistance virtual anode (HRVA), this does not imply that electrochemically the two are interchangeable. Under the best operational conditions, the CIRP 206 would more closely approximate and perhaps be better described as a virtual uniform current source, with nearly constant current being sourced from across the upper plane of the CIRP 206. While the HRVA is certainly viewable as a "virtual current source", i.e. it is a plane from which the current is emanating, and therefore can be considered a "virtual anode" because it can be viewed as a location or source from which anodic current emanates, it is the relatively high-ionic-resistance of the CIRP 206 (with respect to the electrolyte) that leads the nearly uniform current across its face and to further advantageous, generally superior wafer uniformity when compared to having a metallic anode located at the same physical location. The plate's resistance to ionic current flow increases with increasing specific resistance of electrolyte contained within the various channels of the plate 206 (often but not always having the same or nearly similar resistance of the catholyte), increased plate thickness, and reduced porosity (less fractional cross sectional area for current passage, for example, by having fewer holes of the same diameter, or the same number of holes with smaller diameters, etc.).

Structure

The CIRP 206 contains micro size (typically less than 0.04") through-holes that are spatially and ionically isolated from each other and do not form interconnecting channels within the body of CIRP, in many but not all implementations. Such through-holes are often referred to as non-communicating through-holes. They typically extend in one dimension, often, but not necessarily, normal to the plated surface of the wafer (in some embodiments the non-communicating holes are at an angle with respect to the wafer which is generally parallel to the CIRP front surface). Often the through-holes are parallel to one another. Often the holes are arranged in a square array. Other times the layout is in an offset spiral pattern. These through-holes are distinct from 3-D porous networks, where the channels extend in three dimensions and form interconnecting pore structures, because the through-holes restructure both ionic current flow and fluid flow parallel to the surface therein, and straighten the path of both current and fluid flow towards the wafer surface. However, in certain embodiments, such a porous plate, having an interconnected network of pores, may be used in place of the 1-D channeled element (CIRP). When the distance from the plate's top surface to the wafer is small (e.g., a gap of about 1/10 the size of the wafer radius, for example less than about 5 mm), divergence of both current flow and fluid flow is locally restricted, imparted and aligned with the CIRP channels.

One example CIRP 206 is a disc made of a solid, non-porous dielectric material that is ionically and electrically resistive. The material is also chemically stable in the plating solution of use. In certain cases the CIRP 206 is made of a ceramic material (e.g., aluminum oxide, stannic oxide, titanium oxide, or mixtures of metal oxides) or a plastic material (e.g., polyethylene, polypropylene, polyvinylidene difluoride (PVDF), polytetrafluoroethylene, polysulphone, polyvinyl chloride (PVC), polycarbonate, and the like), having between about 6,000-12,000 non-communicating through-holes. The disc 206, in many embodiments, is substantially coextensive with the wafer (e.g., the CIRP disc 206 has a diameter of about 300 mm when used with a 300 mm wafer) and resides in close proximity to the wafer, e.g., just below the wafer in a wafer-facing-down electroplating apparatus. Preferably, the plated surface of the wafer resides within about 10 mm, more preferably within about 5 mm of the closest CIRP surface. To this end, the top surface of the channeled ionically resistive plate 206 may be flat or substantially flat. Often, both the top and bottom surfaces of the channeled ionically resistive plate 206 are flat or substantially flat.

Another feature of the CIRP 206 is the diameter or principal dimension of the through-holes and its relation to the distance between the CIRP 206 and the substrate. In certain embodiments, the diameter of each through-hole (or of a majority of through-holes, or the average diameter of the through-holes) is no more than about the distance from the plated wafer surface to the closest surface of the CIRP 206. Thus, in such embodiments, the diameter or principal dimension of the through holes should not exceed about 5 mm, when the CIRP 206 is placed within about 5 mm of the plated wafer surface.

As above, the overall ionic and flow resistance of the plate 206 is dependent on the thickness of the plate and both the overall porosity (fraction of area available for flow through the plate) and the size/diameter of the holes. Plates of lower porosities will have higher impinging flow velocities and ionic resistances. Comparing plates of the same porosity, one having smaller diameter 1-D holes (and therefore a larger number of 1-D holes) will have a more micro-uniform distribution of current on the wafer because there are more individual current sources, which act more as point sources that can spread over the same gap, and will also have a higher total pressure drop (high viscous flow resistance).

In certain cases, however, the ionically resistive plate 206 is porous, as mentioned above. The pores in the plate 206 may not form independent 1-D channels, but may instead form a mesh of through holes which may or may not interconnect. It should be understood that as used herein, the terms channeled ionically resistive plate and channeled ionically resistive element (CIRP) are intended to include this embodiment, unless otherwise noted.

Vertical Flow Through the Through-Holes

The presence of an ionically resistive but ionically permeable element (CIRP) 206 close to the wafer substantially reduces the terminal effect and improves radial plating uniformity in certain applications where terminal effects are operative/relevant, such as when the resistance of electrical current in the wafer seed layer is large relative to that in the catholyte of the cell. The CIRP 206 also simultaneously provides the ability to have a substantially spatially-uniform impinging flow of electrolyte directed upwards at the wafer surface by acting as a flow diffusing manifold plate. Importantly, if the same element 206 is placed farther from the wafer, the uniformity of ionic current and flow improvements become significantly less pronounced or non-existent.

Figure 9:
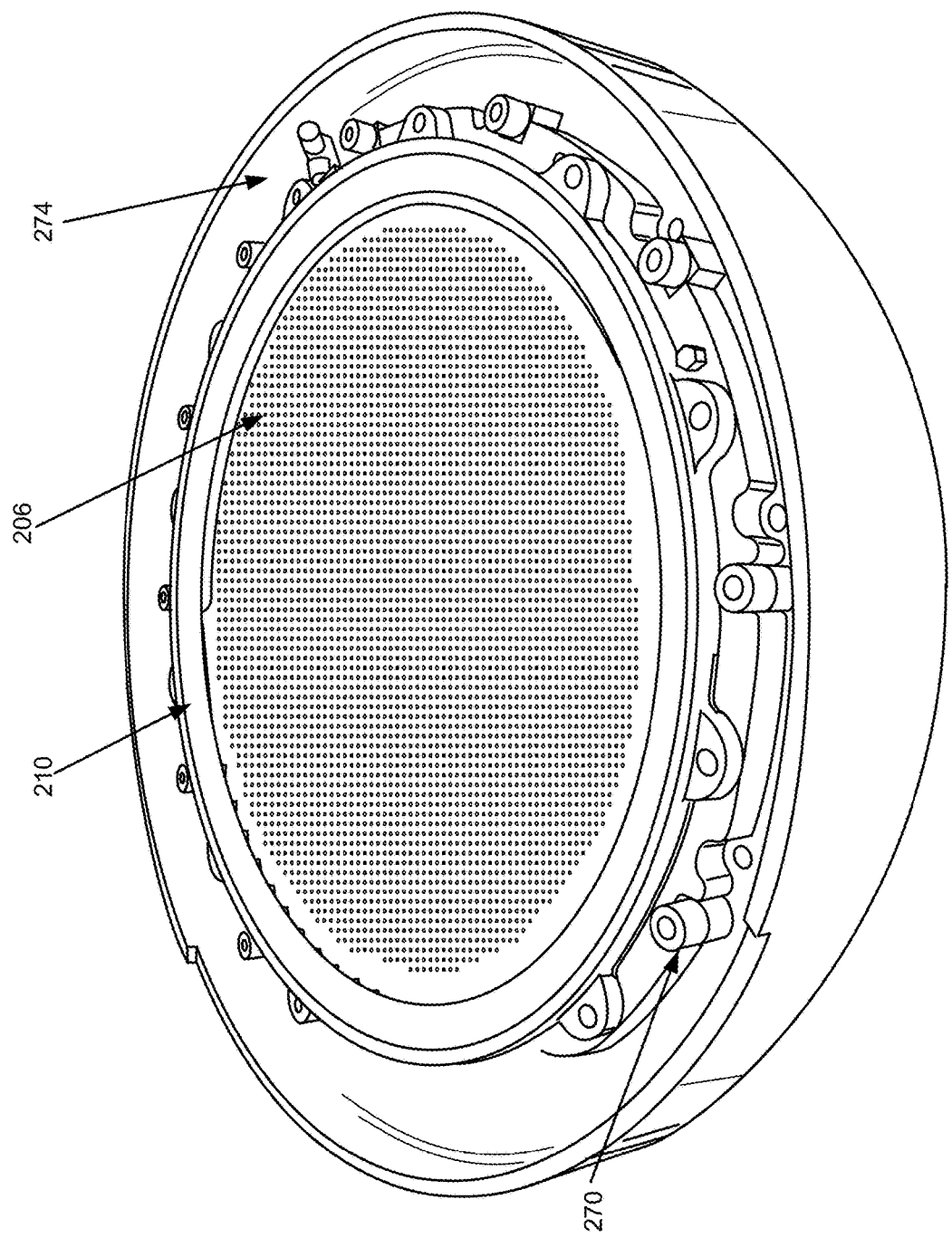
FIG. 9 shows an embodiment of a CIRP partially covered by a flow confinement ring and supported by a frame.

Further, because non-communicating through-holes do not allow for lateral movement of ionic current or fluid motion within the CIRP, the center-to-edge current and flow movements are blocked within the CIRP 206, leading to further improvement in radial plating uniformity. In the embodiment shown in FIG. 9, the CIRP 206 is a perforated plate having approximately 9000 uniformly spaced one-dimensional holes acting as microchannels and arranged in a square array (i.e., the holes are arranged in columns and rows) over the face of the plate (e.g., over a substantially circular area having a diameter of about 300 mm in the case of plating a 300 mm wafer) and with an effective average porosity of about 4.5%, and an individual microchannel hole size of about 0.67 mm (0.026 inches) in diameter. Also shown in FIG. 9 are the flow distribution adjustment rods 270, which may be used to preferentially direct flow to enter the cross flow manifold 226 either through the CIRP manifold 208 and up through the holes in the CIRP 206, or in through the cross flow injection manifold 222 and cross flow showerhead 242. The cross flow confinement ring 210 is fitted on top of the CIRP, which is supported by the membrane frame 274.

It is noted that in some embodiments, the CIRP plate 206 can be used primarily or exclusively as an intra-cell electrolyte flow resistive, flow controlling and thereby flow shaping element, sometimes referred to as a turboplate. This designation may be used regardless of whether or not the plate 206 tailors radial deposition uniformity by, for example, balancing terminal effects and/or modulating the electric field or kinetic resistances of plating additives coupled with the flow within the cell. Thus, for example, in TSV and WLP electroplating, where the seed metal thickness is generally large (e.g. >1000 Å thick) and metal is being deposited at very high rates, uniform distribution of electrolyte flow is very important, while radial non-uniformity control arising from ohmic voltage drop within the wafer seed may be less necessary to compensate for (at least in part because the center-to-edge non-uniformities are less severe where thicker seed layers are used). Therefore the CIRP plate 206 can be referred to as both an ionically resistive ionically permeable element, and as a flow shaping element, and can serve a deposition-rate corrective function by either altering the flow of ionic current, altering the convective flow of material, or both.

Distance Between Wafer and Channeled Plate

In certain embodiments, a wafer holder 254 and associated positioning mechanism hold a rotating wafer very close to the parallel upper surface of the channeled ionically resistive element 206. During plating, the substrate is generally positioned such that it is parallel or substantially parallel to the ionically resistive element (e.g., within about 10°). Though the substrate may have certain features thereon, only the generally planar shape of the substrate is considered in determining whether the substrate and ionically resistive element are substantially parallel.

In typical cases, the separation distance is about 1-10 millimeters, or about 2-8 millimeters. This small plate to wafer distance can create a plating pattern on the wafer associated with proximity "imaging" of individual holes of the pattern, particularly near the center of wafer rotation. In such circumstances, a pattern of plating rings (in thickness or plated texture) may result near the wafer center. To avoid this phenomenon, in some embodiments, the individual holes in the CIRP 206 (particularly at and near the wafer center) can be constructed to have a particularly small size, for example less than about ⅕$^{th}$ the plate to wafer gap. When coupled with wafer rotation, the small pore size allows for time averaging of the flow velocity of impinging fluid coming up as a jet from the plate 206 and reduces or avoids small scale non-uniformities (e.g., those on the order of micrometers). Despite the above precaution, and depending on the properties of the plating bath used (e.g. particular metal deposited, conductivities, and bath additives employed), in some cases deposition may be prone to occur in a micro-non-uniform pattern (e.g., forming center rings) as the time average exposure and proximity-imaging-pattern of varying thickness (for example, in the shape of a "bulls eye" around the wafer center) and corresponding to the individual hole pattern used. This can occur if the finite hole pattern creates an impinging flow pattern that is non-uniform and influences the deposition. In this case, introducing lateral flow across the wafer center, and/or modifying the regular pattern of holes right at and/or near the center, have both been found to largely eliminate any sign of micro-non-uniformities otherwise found there.

Porosity of Channeled Plate

In various embodiments, the channeled ionically resistive plate 206 has a sufficiently low porosity and pore size to provide a viscous flow resistance backpressure and high vertical impinging flow rates at normal operating volumetric flow rates. In some cases, about 1-10% of the channeled ionically resistive plate 206 is open area allowing fluid to reach the wafer surface. In particular embodiments, about 2-5% the plate 206 is open area. In a specific example, the open area of the plate 206 is about 3.2% and the effective total open cross sectional area is about 23 cm$^2$.

Hole Size of Channeled Plate

The porosity of the channeled ionically resistive plate 206 can be implemented in many different ways. In various embodiments, it is implemented with many vertical holes of small diameter. In some cases the plate 206 does not consist of individual "drilled" holes, but is created by a sintered plate of continuously porous material. Examples of such sintered plates are described in U.S. Pat. No. 6,964,792, which is herein incorporated by reference in its entirety. In some embodiments, drilled non-communicating holes have a diameter of about 0.01 to 0.05 inches. In some cases, the holes have a diameter of about 0.02 to 0.03 inches. As mentioned above, in various embodiments the holes have a diameter that is at most about 0.2 times the gap distance between the channeled ionically resistive plate 206 and the wafer. The holes are generally circular in cross section, but need not be. Further, to ease construction, all holes in the plate 206 may have the same diameter. However this need not be the case, and both the individual size and local density of holes may vary over the plate surface as specific requirements may dictate.

As an example, a solid plate 206 made of a suitable ceramic or plastic material (generally a dielectric insulating and mechanically robust material), having a large number of small holes provided therein, e.g. at least about 1000 or at least about 3000 or at least about 5000 or at least about 6000 (9465 holes of 0.026 inches diameter has been found useful). As mentioned, some designs have about 9000 holes. The porosity of the plate 206 is typically less than about 5 percent so that the total flow rate necessary to create a high impinging velocity is not too great. Using smaller holes helps to create a large pressure drop across the plate as compared to larger holes, aiding in creating a more uniform upward velocity through the plate.

Generally, the distribution of holes over the channeled ionically resistive plate 206 is of uniform density and non-random. In some cases, however, the density of holes may vary, particularly in the radial direction. In a specific embodiment, as described more fully below, there is a greater density and/or diameter of holes in the region of the plate that directs flow toward the center of the rotating substrate. Further, in some embodiments, the holes directing electrolyte at or near the center of the rotating wafer may induce flow at a non-right angle with respect to the wafer surface. Further, the hole patterns in this region may have a random or partially random distribution of non-uniform plating "rings" to address possible interaction between a limited number of holes and the wafer rotation. In some embodiments, the hole density proximate an open segment of a flow diverter or confinement ring 210 is lower than on regions of the channeled ionically resistive plate 206 that are farther from the open segment of the attached flow diverter or confinement ring 210.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

Examples and Experimental

A few observations that suggest that improved cross flow through the cross flow manifold 226 is desirable are presented in this section. Throughout this section, two basic plating cell designs are tested. Both designs contain a confinement ring 210, sometimes referred to as a flow diverter, defining a cross flow manifold 226 on top of the channeled ionically resistive plate 206. The first design, sometimes referred to as the control design and/or the TC1 design, does not include a side inlet to this cross flow manifold 226. Instead, in the control design, all flow into the cross flow manifold 226 originates below the CIRP 206 and travels up through the holes in the CIRP 206 before impinging on the wafer and flowing across the face of the substrate. The second design, sometimes referred to as the current design and/or the TC2 design, includes a cross flow injection manifold 222 and all associated hardware for injecting fluid directly into the cross flow manifold 226 without passing through the channels or pores in the CIRP 206 (note that in some cases, however, the flow delivered to the cross flow injection manifold passes through dedicated channels near the periphery of the CIRP 206, such channels being distinct/separate from the channels used to direct fluid from the CIRP manifold 208 to the cross flow manifold 226).

Thickness Distribution Non Uniformity.

Figure 10:
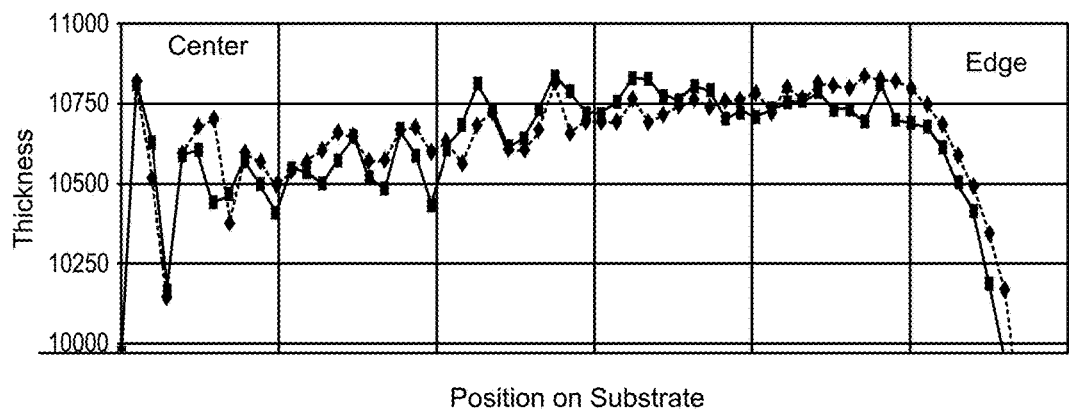
FIG. 10 is a graph of thickness vs. wafer position, illustrating the center-to-edge non-uniformity that arises when no cross flow side inlet is used.

When utilizing previous plating cell designs that lack a cross flow injection manifold, flow conditions often arise such that in certain regions of the wafer (e.g., a region near (but typically offset from) the center of the wafer) the vertical fluid jetting velocity dominates over the horizontal cross flow velocity. In such cases, the individual jets are amplified and result in a non-uniform thickness distribution. FIG. 10 shows a graph of film thickness vs. position on the wafer for a substrate plated with copper in a control plating cell lacking a side inlet to the cross flow manifold. As seen in FIG. 10, the film was thicker towards the edge of the substrate and thinner towards the center of the substrate. This radial thickness difference is not optimal.

Figure 11:
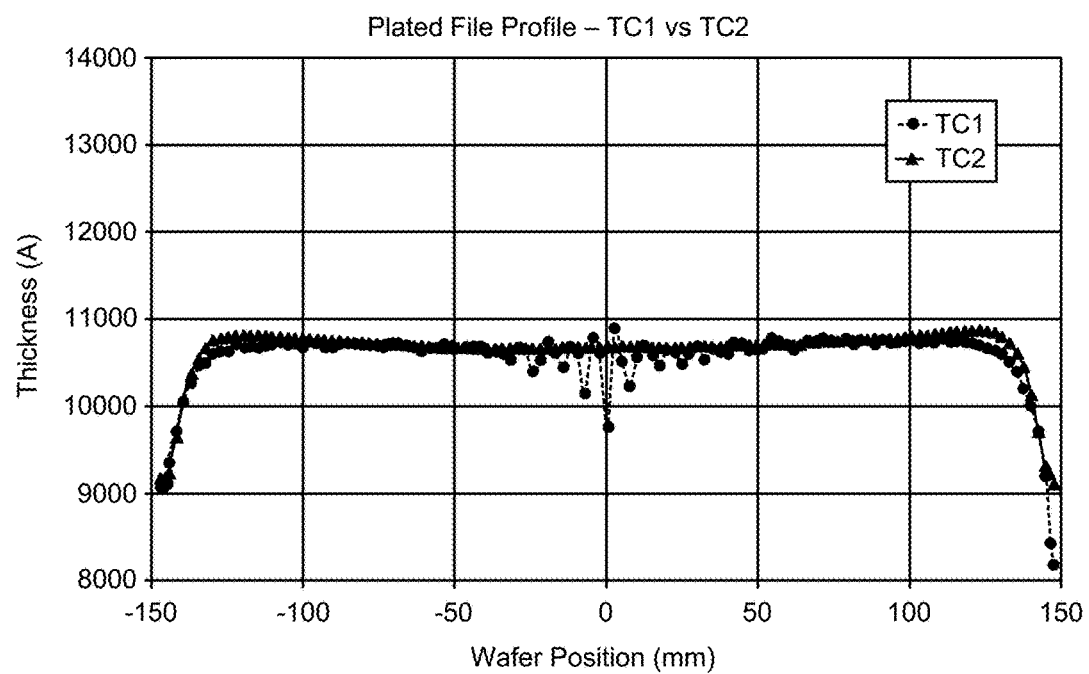
FIG. 11 is a graph of thickness vs. wafer position, showing the improvement in center-to-edge uniformity that may be achieved when using a cross flow side inlet.

FIG. 11 shows a graph of film thickness vs. position on the wafer for two substrates: one substrate plated in a control design plating cell (shown with round dots and designated here as TC1), and one substrate plated in a current design plating cell having a cross flow injection manifold 222 (shown with triangles and designated here as TC2). The data was generated by blanket deposition of copper on a wafer with plating chemistry that employed a leveler. FIG. 11 shows that wafer center non-uniformity (or ringing) is observed in the control apparatus, but is dramatically improved when using the current apparatus (with a side inlet to the cross flow manifold).

Feature Shape Variation.

The fundamental cross flow imbalance between the azimuthally opposite positions on a wafer plated in a control apparatus having an outlet 234 at one azimuthal location, but no inlet 250 at an opposite azimuthal position in a cross flow manifold 226, results in non-uniform within-feature convection. The net result is a bump shape which shows some thickness non uniformity (e.g., tilt in one direction).

Figure 12:
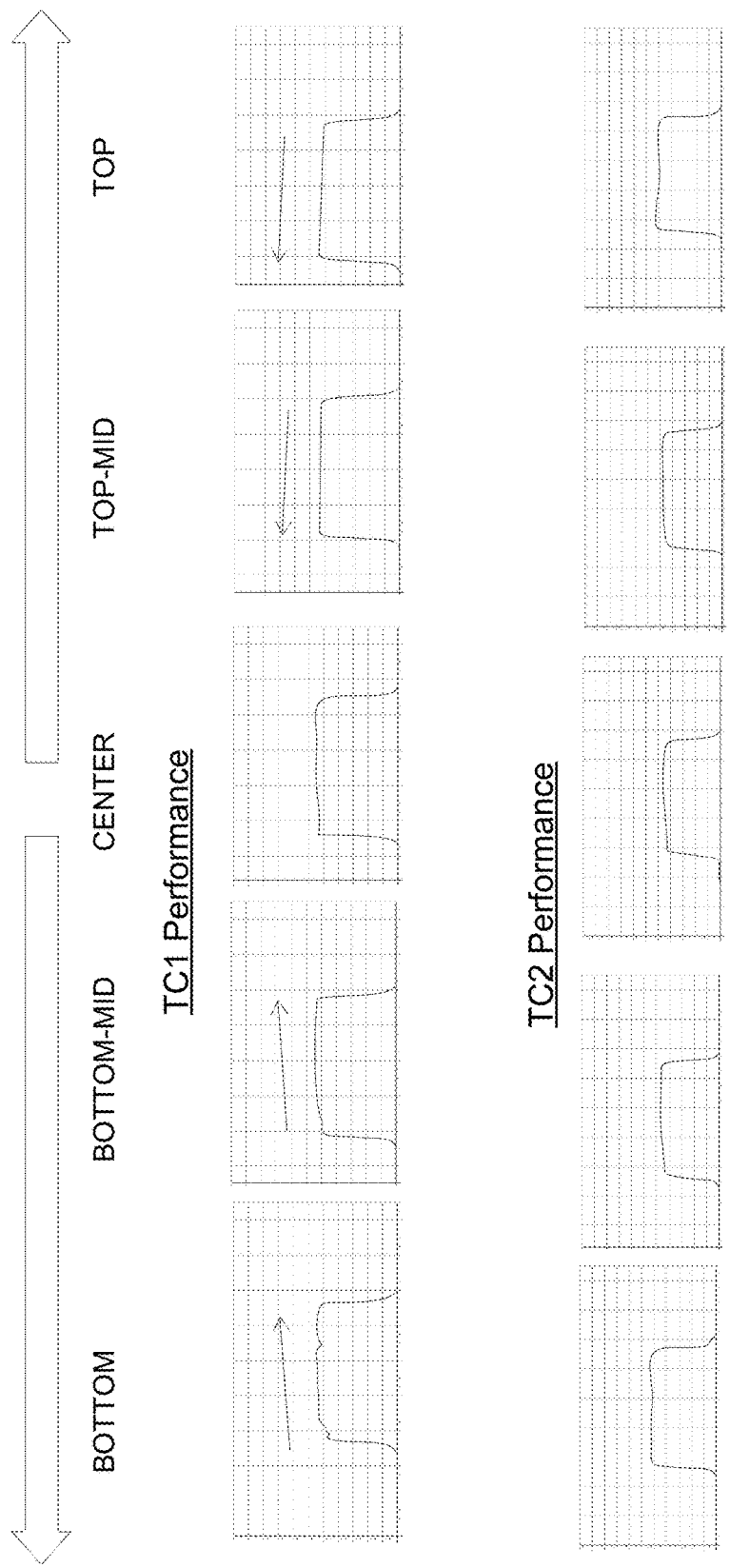
FIG. 12 shows various graphs of thickness vs. wafer position, illustrating the improvement in feature shape uniformity that may be achieved using a cross flow side inlet.

FIG. 12 shows the within-feature shape of various microbumps located at different positions on a substrate for microbumps plated in a control design plating cell (upper panels, designated as TC1) and for microbumps plated in a current design plating cell according to various embodiments herein (lower panels, designated as TC2). For each graph in FIG. 12, the x-axis corresponds to the position on the wafer, as indicated by the large arrows at the top of the figure, and the y-axis corresponds to the height of the given microbump at that position. Thus, each graph shows the outline shape of the microbump plated at a particular location on the substrate.

For context, the "bottom" region of the wafer is where a notch on the wafer exists. The "top" of the wafer is the side of the wafer opposite that of where the notch occurs. The four smaller arrows in the upper panels of FIG. 12 correspond to the tilt of the plated feature (i.e., the arrow points towards the taller side of the feature). Ideally, these arrows would be horizontal, meaning that there is no tilt to the feature. It should be noted that due to the rotation of the substrate during plating, there is a center-to-edge component of the electrolyte flow pattern. The small arrows in the upper panels of FIG. 12 point in the direction opposite this flow.

In generating the data shown in FIG. 12, copper bumps were deposited in 20×20 µm features in photoresist. For the control design, the cross flow reached its maximum velocity, and convection driven mass transfer dominated, at the outlet 234 of the cross flow manifold 226. As a consequence, the inner "upstream" sides of the bumps experienced greater deposition rates, as illustrated in the data profiles shown in the upper panels of FIG. 12. A notable improvement is observed in the bump profiles generated using forced cross flow in accordance with the embodiments disclosed herein, as shown in the lower panels of FIG. 12. Overall, FIG. 12 shows that there was very little feature tilt for the current design as compared to the control design.

Silver Composition Non Uniformity.

Figure 13:
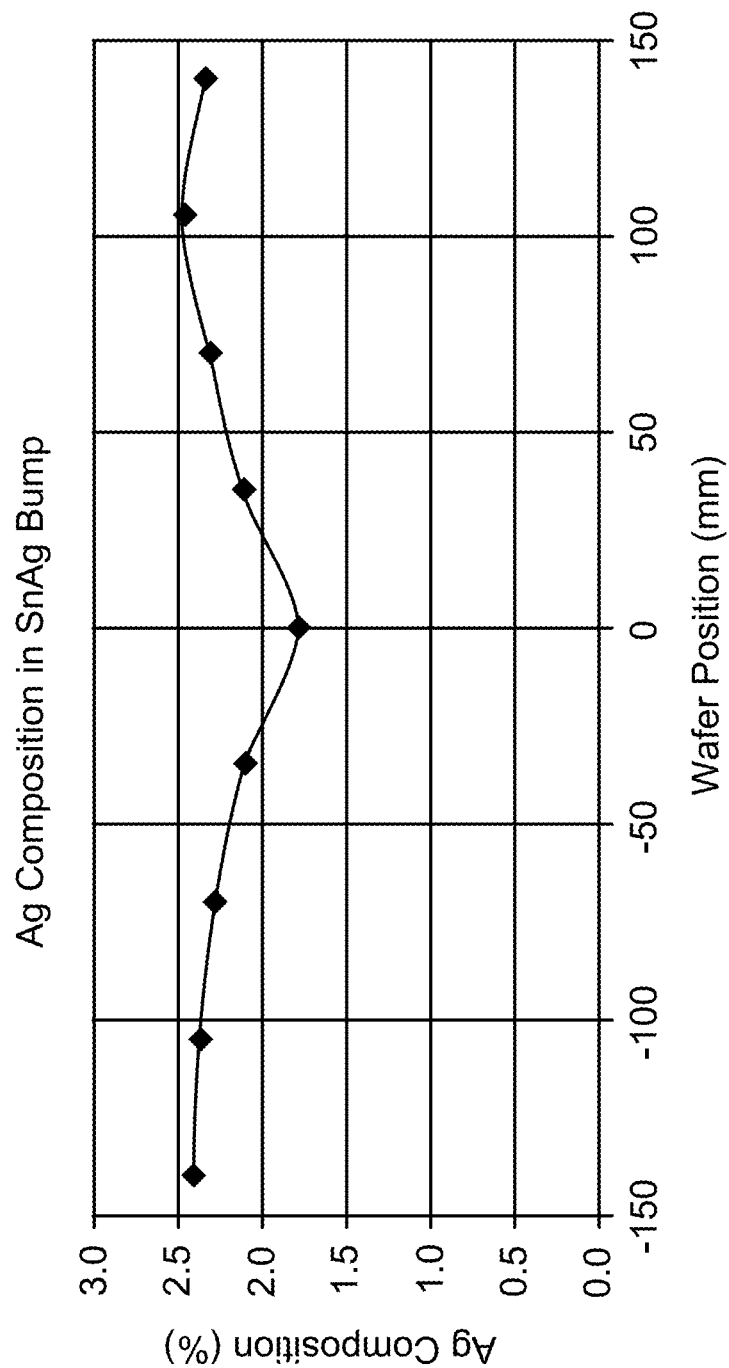
FIG. 13 is a graph of bump composition (percent silver) vs. wafer position for the case where no cross flow side inlet is used.

A control apparatus with no side inlet to the cross flow manifold results in significantly less cross flow over certain areas of the wafer surface as compared to other areas of the wafer surface. When using such an apparatus to plate an alloy, the composition of the alloy may not be uniform across the face of the wafer. For example, when using such an apparatus to plate tin-silver solder bumps, the concentration of silver may be lower near the center of the wafer and higher near the edges of the wafer. This non-uniform alloy composition highlights the non-uniform cross flow pattern of the plating solution. FIG. 13 shows the silver composition vs. on wafer position for tin-silver bumps plated in a control design plating cell. The x-axis represents the position of the bump on the wafer, while the y-axis represents the percentage of silver in the bump. Notably, the percentage of silver is lower for bumps plated at/near the center, as compared to bumps plated closer to the edge of the wafer. In the case of SnAg solder plating, silver is a diffusion limited species. The uniform composition of the SnAg plated material is a parameter in maintaining good solder welds. The composition uniformity of the SnAg plated material may be improved by enhancing the diffusion of species in the system, for example by introducing cross flow from a side inlet 250 according to the embodiments herein.

FIGS. 14A-14B through FIGS. 18A-18B compare the flow patterns achieved using the control plating cell (14A, 15A, 16A, 17A and 18A) vs. the current plating cell having a side inlet to the cross flow manifold (14B, 15B, 16B, 17B and 18B). The results were generated using numerical models of the cross flow manifold.

Figure 14A:
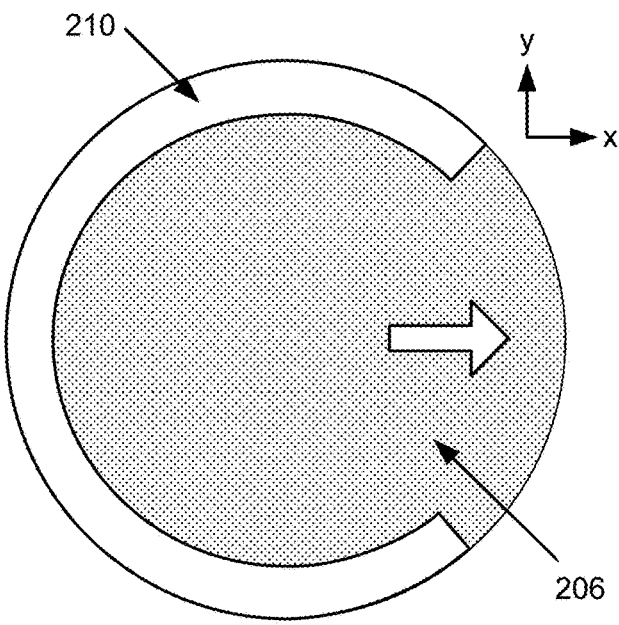
FIG. 14A shows a simplified top view of a CIRP and flow confinement ring where no side inlet is used.
Figure 14B:
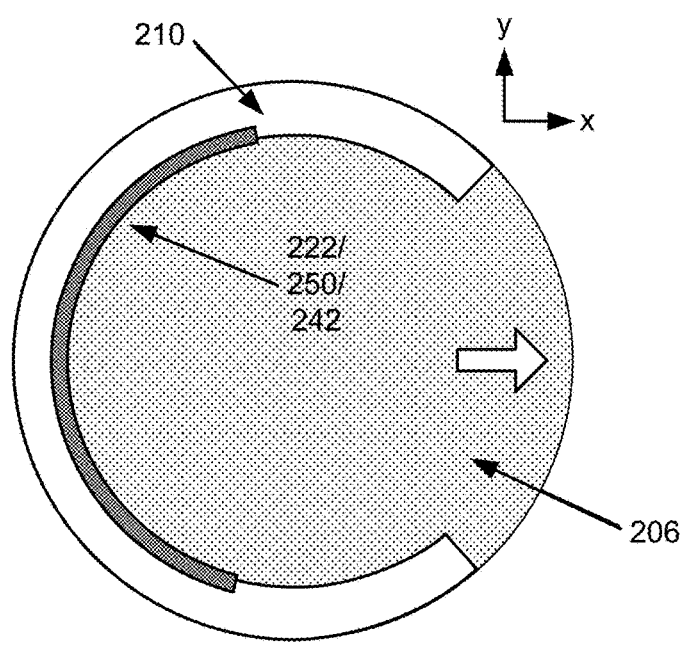
FIG. 14B shows a simplified top view of a CIRP, flow confinement ring, and cross flow side inlet according to various embodiments disclosed herein.

FIG. 14A shows a top-down view of part of a control design plating apparatus. Specifically, the figure shows a CIRP 206 with a flow diverter 210. FIG. 14B shows a top-down view of part of a current design plating apparatus, specifically showing the CIRP 206, flow diverter 210 and cross flow injection manifold 222/cross flow manifold inlet 250/cross flow showerhead 242. The direction of flow in FIGS. 14A-14B is generally left to right, towards the outlet 234 on the flow diverter 210. The designs shown in FIGS. 14A-14B correspond to the designs modeled in FIGS. 15A-15B through 17A-17B.

Figure 15A:
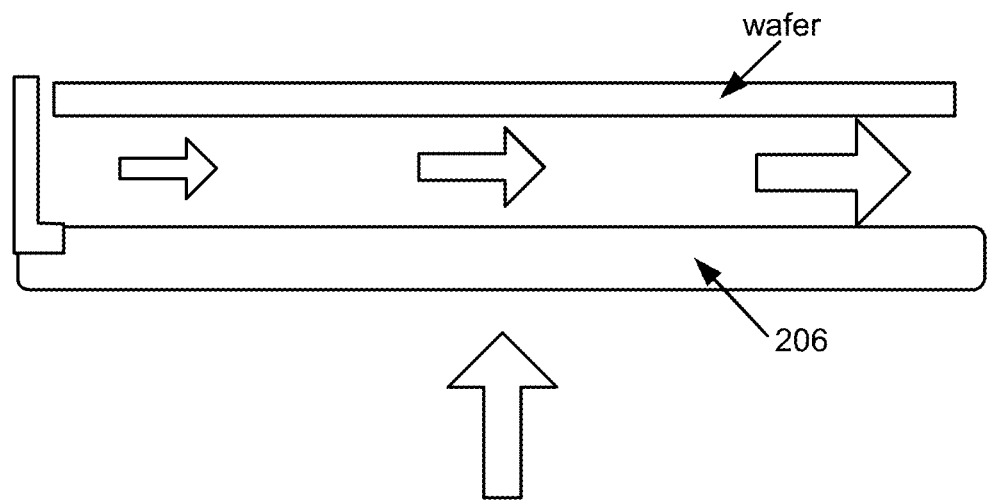
FIGS. 15A-15B illustrate the cross flow through the cross flow manifold for the apparatus shown in FIGS. 14A-14B, respectively.
Figure 15B:
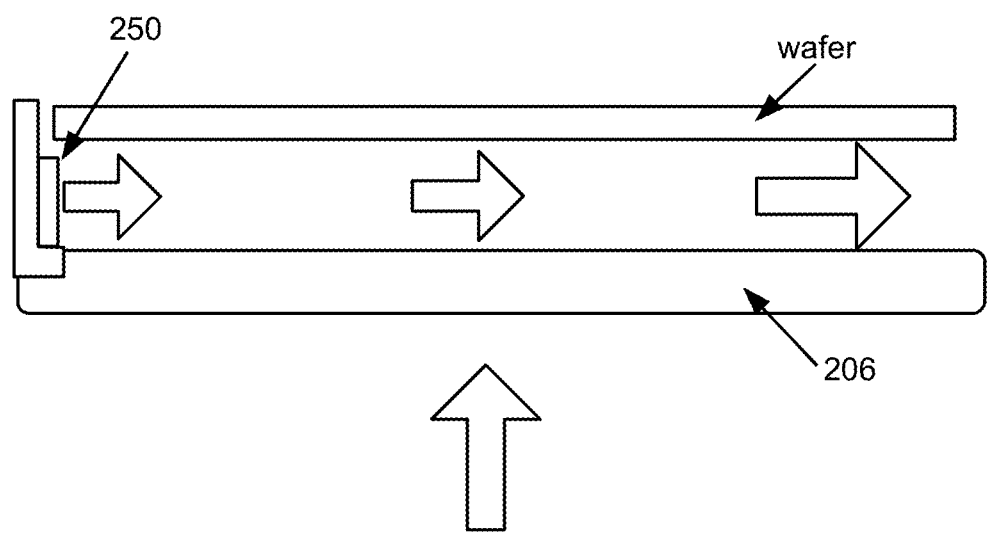

FIG. 15A shows the flow through the cross flow manifold 226 for the control design. In this case, all the flow in the cross flow manifold 226 originates from below the CIRP 206. The magnitude of the flow at a particular point is indicated by the size of the arrows. In the control design of FIG. 15A, the magnitude of the flow increases substantially throughout the cross flow manifold 226 as additional fluid passes through the CIRP 206, impinges upon the wafer, and joins the cross flow. In the current design of FIG. 15B, however, this increase in flow is much less substantial. The increase is not as great because a certain amount of fluid is delivered directly into the cross flow manifold 226 through the cross flow injection manifold 222 and associated hardware.

Figure 16A:
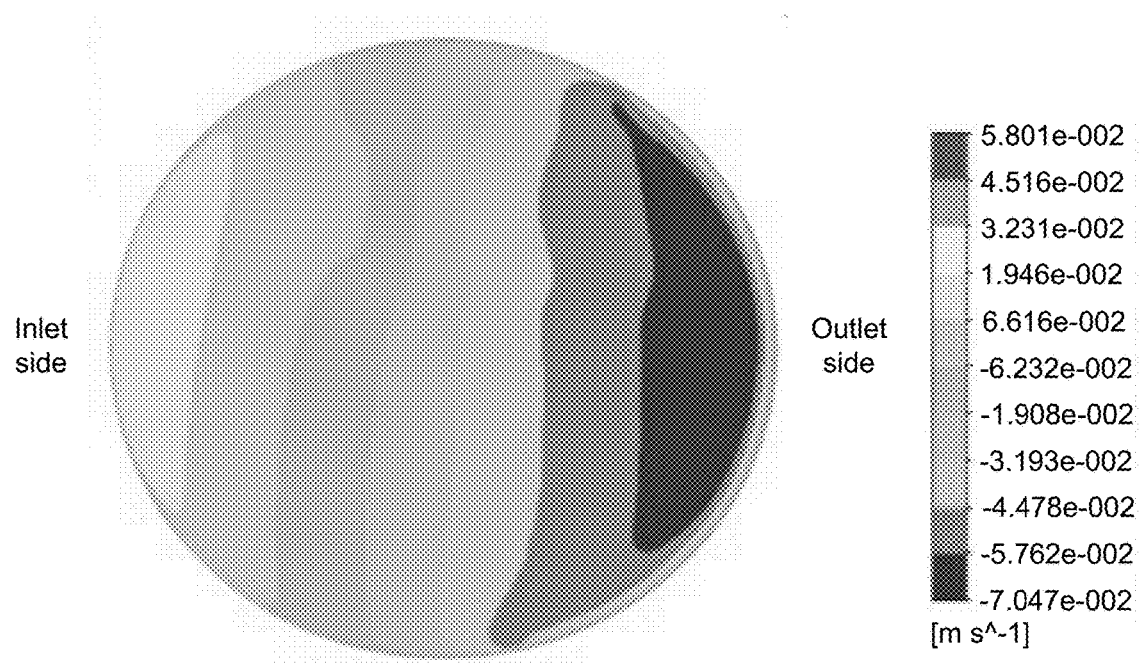
FIGS. 16A-16B show modeling results illustrating the cross flow velocity during plating at a plane near the substrate for the apparatus shown in FIGS. 14A-14B, respectively.
Figure 16B:
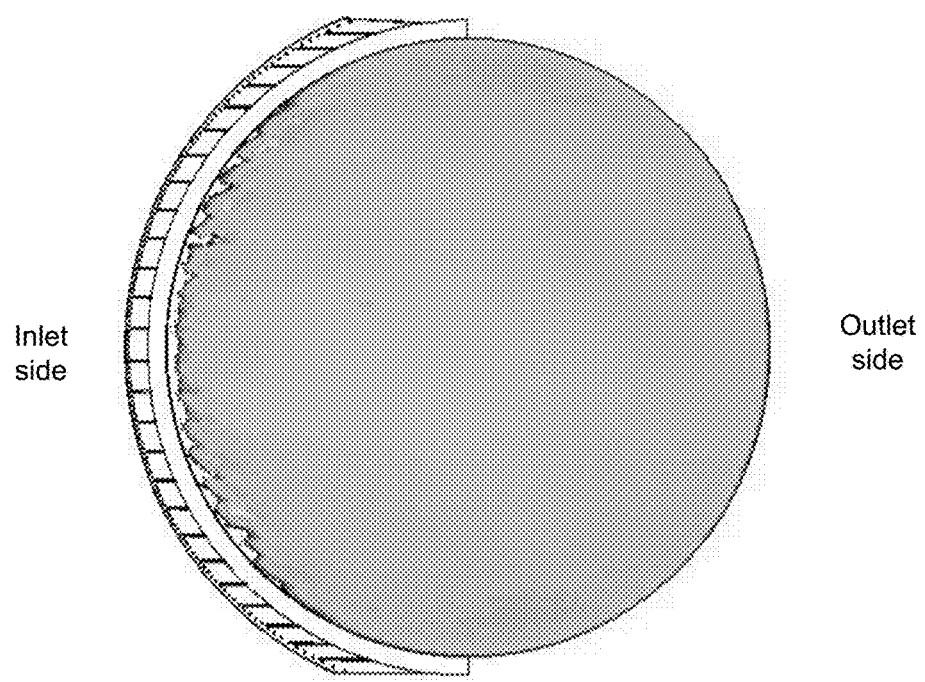

FIG. 16A shows the flow velocity across the face of the wafer in the control design depicted in FIG. 14A. The flow is much faster (depicted by the darker shades) near the outlet 234 of the flow diverter, and much slower (depicted by the lighter shades) on the side opposite the exit. In contrast, FIG. 16B shows that the flow velocity is much more uniform in the case of the current design depicted in FIG. 14B.

Figure 17A:
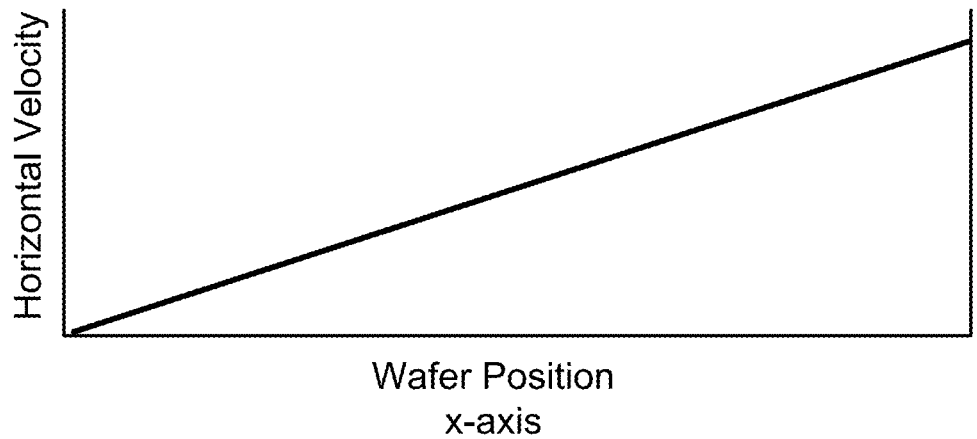
FIGS. 17A-17B are graphs showing the horizontal cross flow velocity during plating vs. wafer position for the apparatus shown in FIGS. 14A-14B, respectively.

FIG. 17A depicts the horizontal velocity across the face of a substrate plated in the control design apparatus shown in FIG. 14A. Notably, the flow velocity starts at zero (at the position opposite the flow diverter outlet) and increases until reaching the outlet 234. Unfortunately, the average flow at the center of the wafer is relatively low in the control embodiments. As a consequence, the jets of catholyte emitted from the channels of the channeled ionically resistive plate 206 predominate hydrodynamically in the center region. The problem is not as pronounced towards the edge regions of the work piece because the rotation of the wafer creates an azimuthally averaged cross flow experience.

Figure 17B:
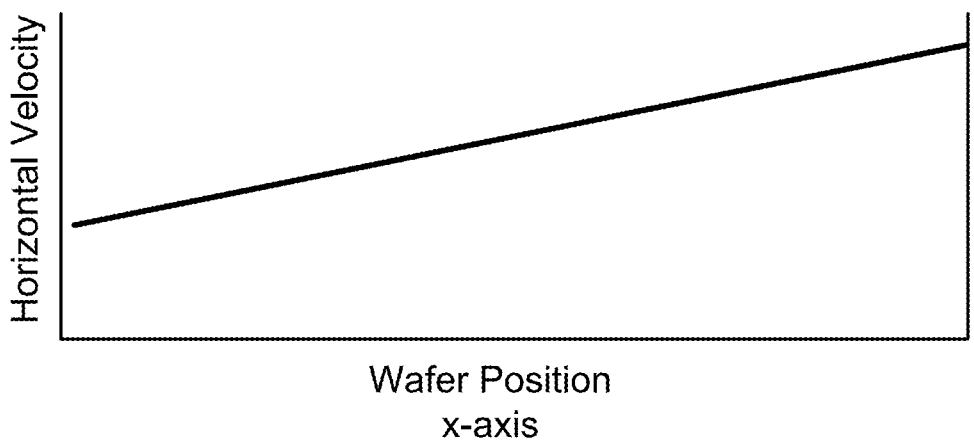

FIG. 17B depicts the horizontal velocity across the face of a substrate plated in the current design shown in FIG. 14B. In this case, the horizontal velocity starts at the inlet 250 at a non-zero value due to the fluid injected from the cross flow injection manifold 222, through the side inlet 250 and into the cross flow manifold 226. Further, the flow rate at the center of the wafer is increased in the current design, as compared to the control design, thereby reducing or eliminating the region of low cross flow near the center of the wafer where the impinging jets may otherwise dominate. Thus, the side inlet substantially improves the uniformity of cross flow rates along the inlet-to-outlet direction, and will result in more uniform plating thickness.

Figure 18A:
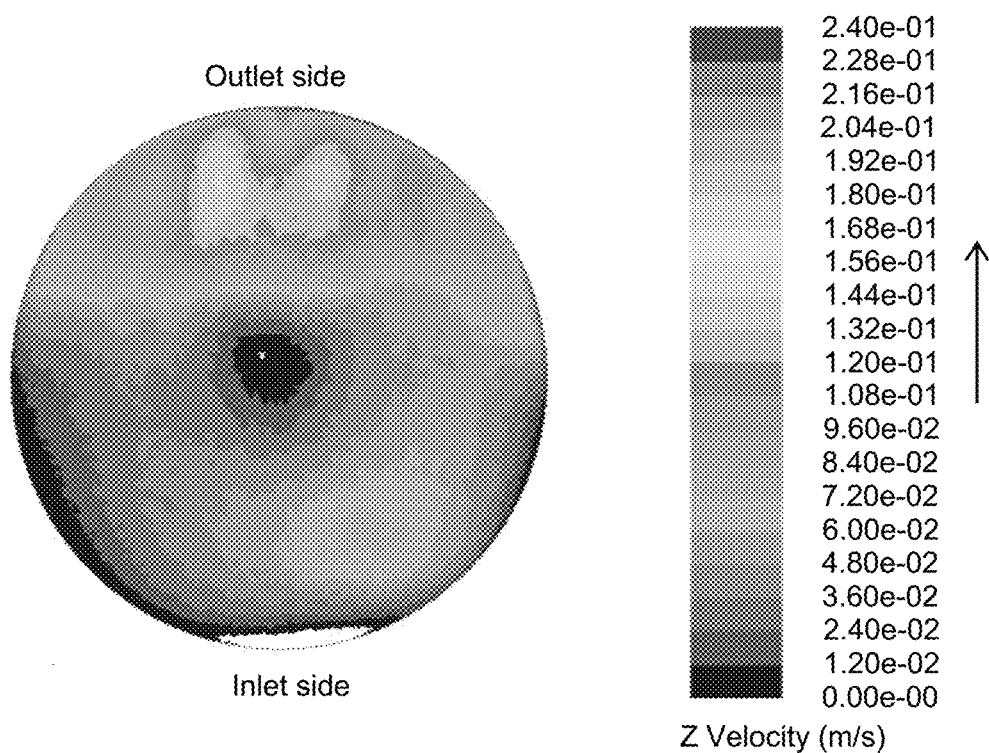
FIGS. 18A-18B show modeling results illustrating the cross flow velocity achieved over different parts of the substrate when no plating fluid is delivered through the cross flow side inlet (18A) and when a certain amount of plating fluid is delivered through the cross flow side inlet (18B).
Figure 18B:
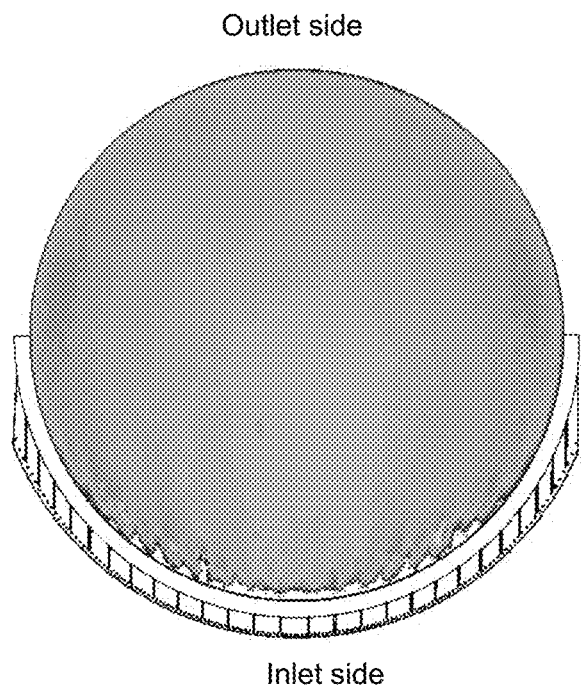

FIG. 18A shows modeling results indicating the cross flow velocity (z-velocity) for a specific control design case where 12 L/min total flow is delivered to the cross flow manifold 226 (all fluid entering the cross flow manifold through the CIRP holes). The cross flow velocity is very non-uniform, as indicated by the many shades of gray/black present in the figure. The flow velocity is lowest near the center of the wafer and towards the side of the wafer opposite the inlet. The flow is highest near the outlet 234. FIG. 18B shows similar modeling results indicating the cross flow velocity for a specific case utilizing the current design with a side inlet 250, where 3 L/min plating fluid is delivered through the holes in the CIRP 206, and 9 L/min plating fluid is delivered directly through the cross flow injection manifold/side inlet 222/250. FIG. 18B shows the very significant improvement in cross flow velocity uniformity that may be achieved using a side inlet 250 for the cross flow manifold 226. Although the flow velocity is slightly higher near the edges of the wafer than near the center of the wafer, this difference is slight compared to the differences seen in the control design in FIG. 18A.

A number of concept and feasibility tests were carried out with hardware implementing the embodiments disclosed herein.

Figure 19A:
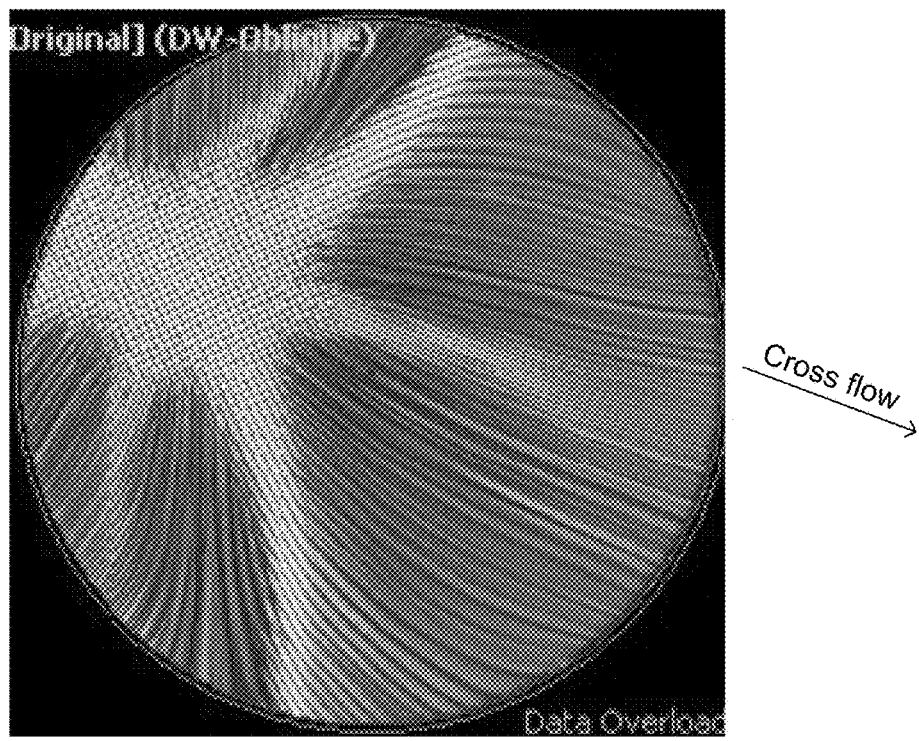
FIGS. 19A-19B show static imprint test results for the cases where no fluid is delivered through the cross flow side inlet (19A), and where a certain amount of fluid is delivered through the cross flow side inlet (19B).
Figure 19B:
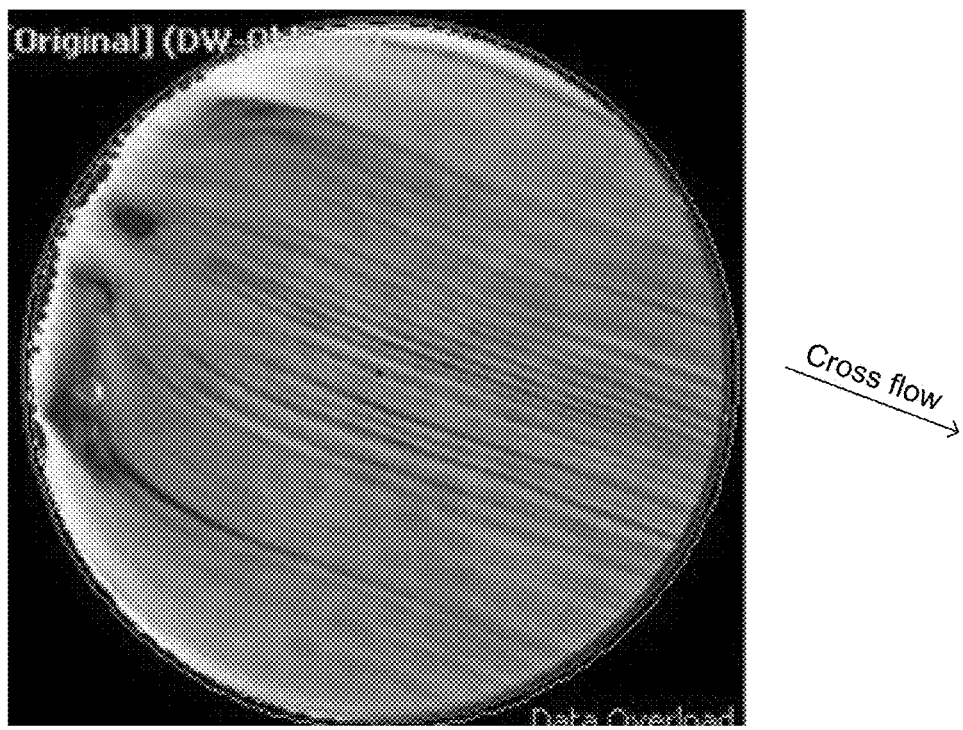

FIGS. 19A-19B show the results of static imprint tests comparing the control (no side inlet) and current (side inlet 250) embodiments. Each test consisted of a 5 minute etch of a 1000 Å copper seed wafer while the plating cup 254 was positioned at a plating position with no rotation. In the case of the control design, as shown in FIG. 19A, the etch pattern shows a very distinct cross hatched pattern, which indicates a region of jetted flow (nil cross flow). As explained above, these regions where the jetted flow dominates over the cross flow are undesirable in terms of plating uniformity. These regions may sometimes be referred to as "dead spots." The static imprint pattern for current embodiment did not reveal any such pattern, as shown in FIG. 19B. The current embodiment with the side inlet 250 also resulted in an area near the inlet 250 where etching was higher (indicated by the darker area towards the left side of the substrate in FIG. 19B), which correlates to an area of turbulent flow.

As mentioned above, in some embodiments, the adjustment of the fluidic adjustment rods 270 allows the operator or controller of the electroplating cell to favor flow to the cross flow injection manifold 222 or to the channeled ionically resistive plate manifold 208.

Figure 20:
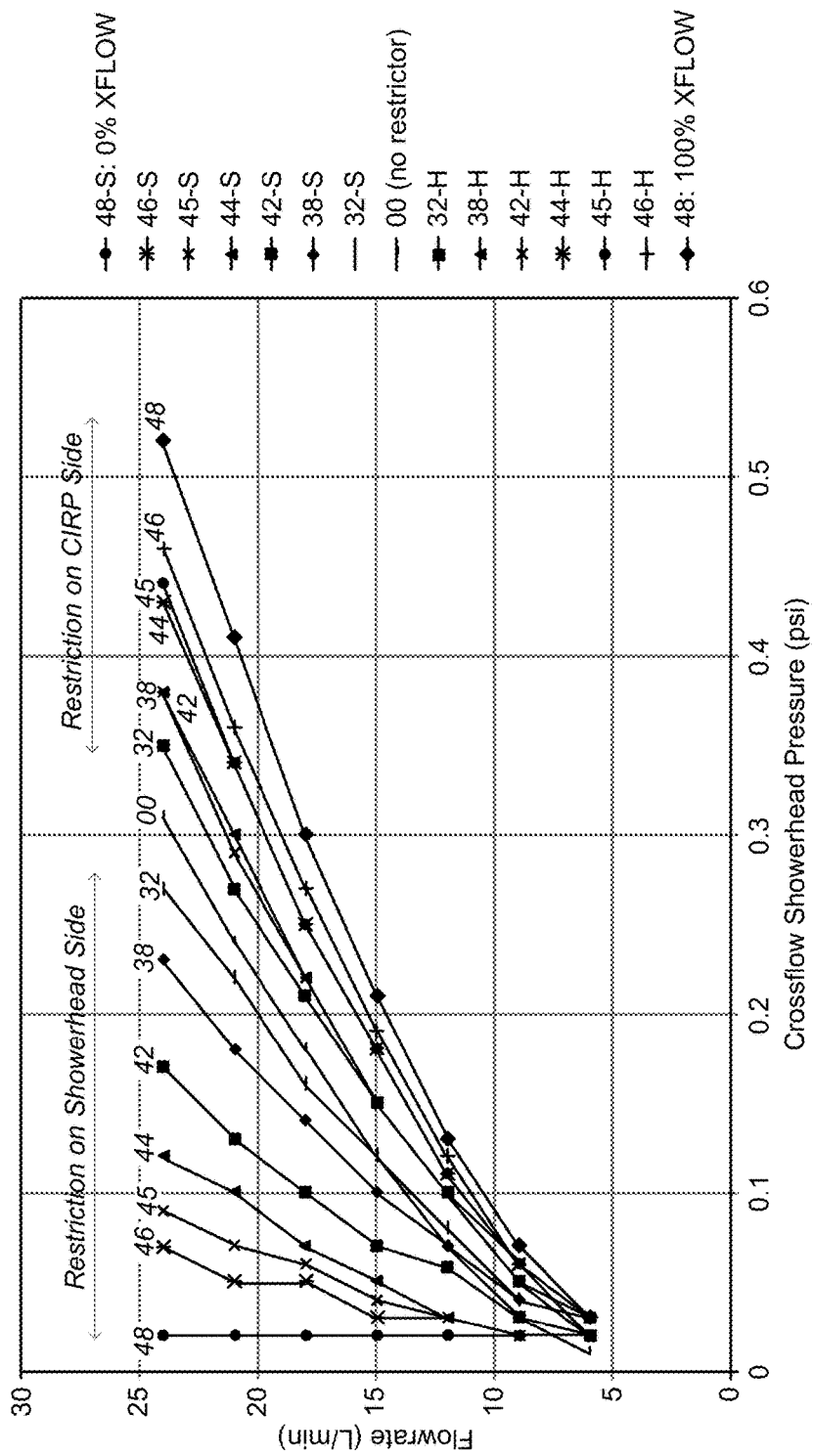
FIG. 20 is a graph showing flowrate vs. cross flow showerhead pressure, where each line was generated using a different set of fluidic adjustment rods restricting flow to either the cross flow injection manifold/showerhead, or to the CIRP manifold/CIRP.

FIG. 20 provides data generated by controlling catholyte flow to the CIRP 206 and cross flow manifolds 226 with the various fluidic adjustment rods 270 in a cell having control rods 270 in each of 12 feeder channels: 6 for the cross flow injection manifold 258 and 6 for the CIRP manifold 262. Each curve in the FIG. 48, 47, etc.) refers to the fluidic adjustment rod 270 diameter in mm. The 48 mm rod was essentially a fully restricting rod while the 32 mm rod was the least restricting rod used in this study (besides the fully open state which is noted as 00). In addition, each curve was generated by installing six rods 270 of the same size in either the cross flow injection manifold feeders 258 or CIRP manifold feeders 262. Furthermore, when the fluidic adjustment rods 270 were installed on the cross flow manifold feeders 258, no fluidic adjustment rods were installed on the CIRP manifold feeders 262, and vice versa. The data shows that by using various sized control rods 270, from which various pressures and flow rates were measured, one can modify the flows from side to side and across the various 12 feeder channels 258 and 262.

Figures 21A, 21B:
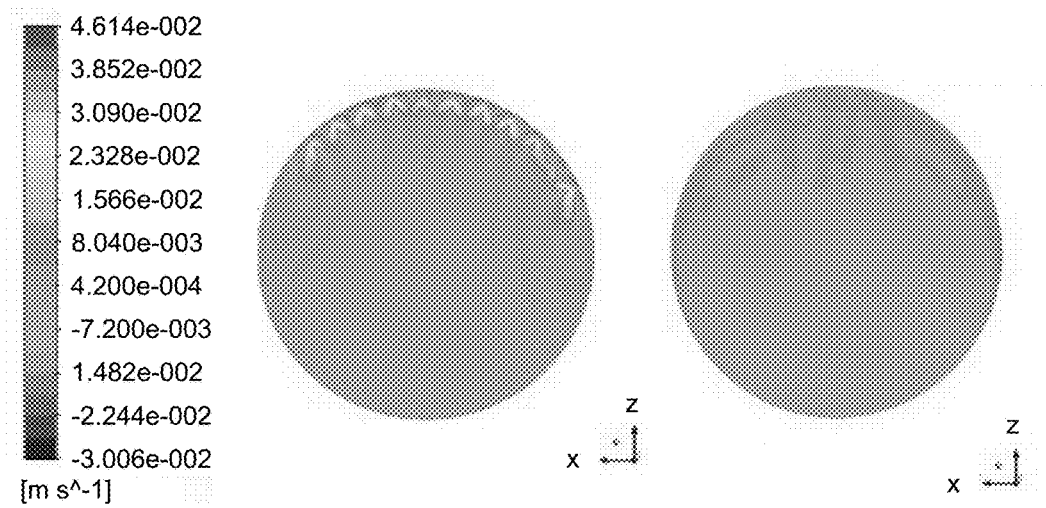
FIGS. 21A-21B show modeling results illustrating the y-velocity (the towards-wafer-velocity) of the flow in the cross flow manifold for two different confinement ring/cross flow side inlet designs.
Figure 21C:
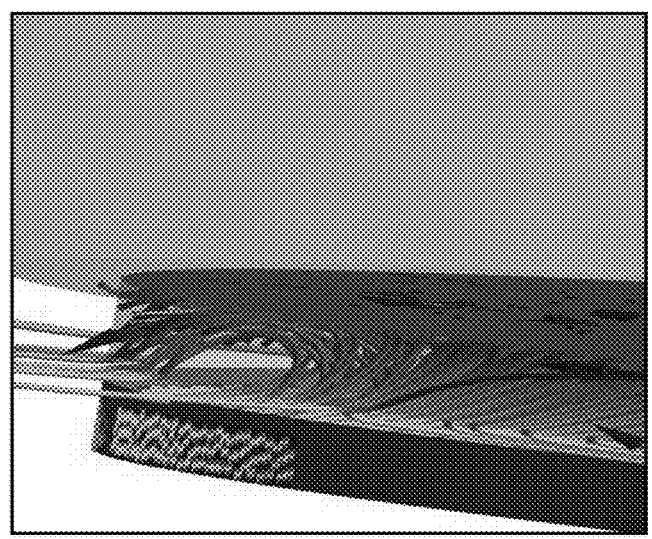
FIG. 21C illustrates modeling results showing the flow pattern achieved in the cross flow manifold for the case shown in FIG. 21A.

FIGS. 21A-21B provide modeling data showing the impinging flow velocity (y-velocity) at different points near the wafer for the two confinement ring 210 setups shown in FIGS. 8A-8B, respectively. The velocity is modeled at a plane 1 mm below the wafer plane. In relation to FIGS. 21A-21B, the cross flow is in the −z direction (top to bottom as depicted). However, the velocity being modeled in this figure is the y-velocity, which is the flow velocity in the direction normal to the CIRP 206, pointing towards the wafer. Flow moving upwards towards the wafer has a positive y-velocity. For the preliminary current design shown in FIG. 8A, where the inlet 250 to the cross flow manifold 226 terminates under the wafer, the flow coming out of the inlet 250 is initially relatively non-uniform, as shown in FIG. 21A. In contrast, for the revised current design shown in FIG. 8B, where the inlet 250 to the cross flow manifold 226 terminates further radially outward (under the cup 254 instead of under the wafer), the flow emanating from the inlet 250 is substantially more uniform. The location where the inlet 250 to the cross flow manifold 226 terminates corresponds to the location where the cross flow confinement ring 210 terminates, in many cases. FIG. 21C shows modeling data illustrating the flow path near the edge of the substrate in the case of the initial design shown in FIG. 8A and modeled in FIG. 21A. It is believed that this flow, which bends upwards and backwards near the inlet, corresponds to the non-uniformities seen near the inlet in FIG. 21A.

Figure 22A:
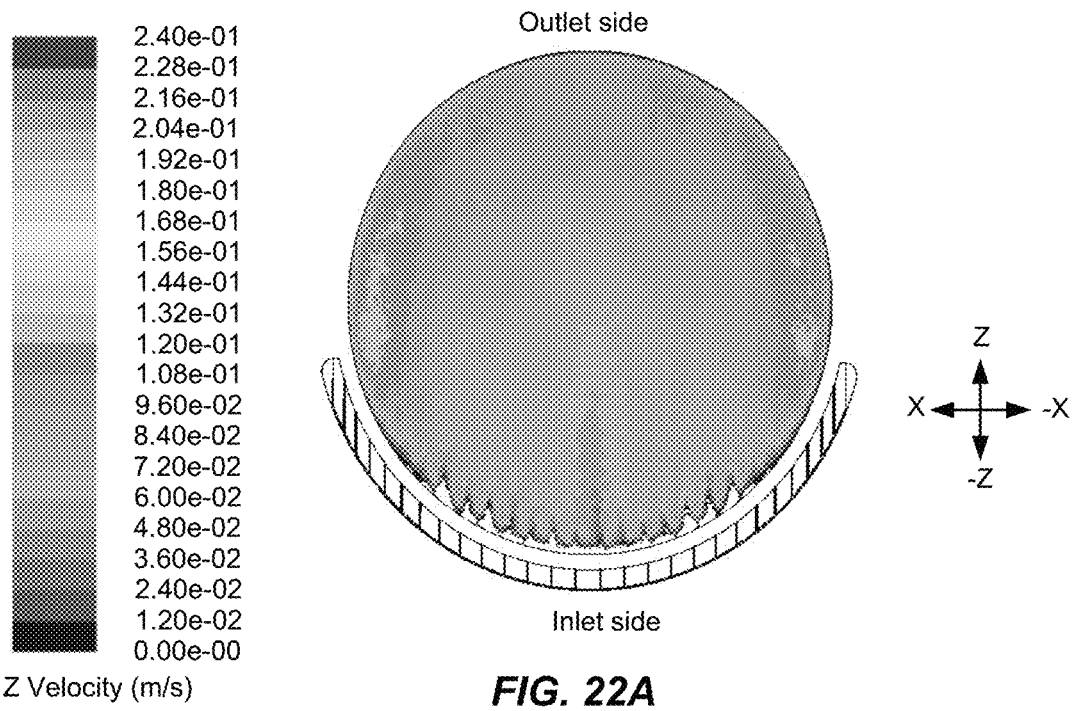
FIGS. 22A-22B illustrate modeling results showing the cross flow velocity for two different arrangements of the showerhead holes.
Figure 22B:
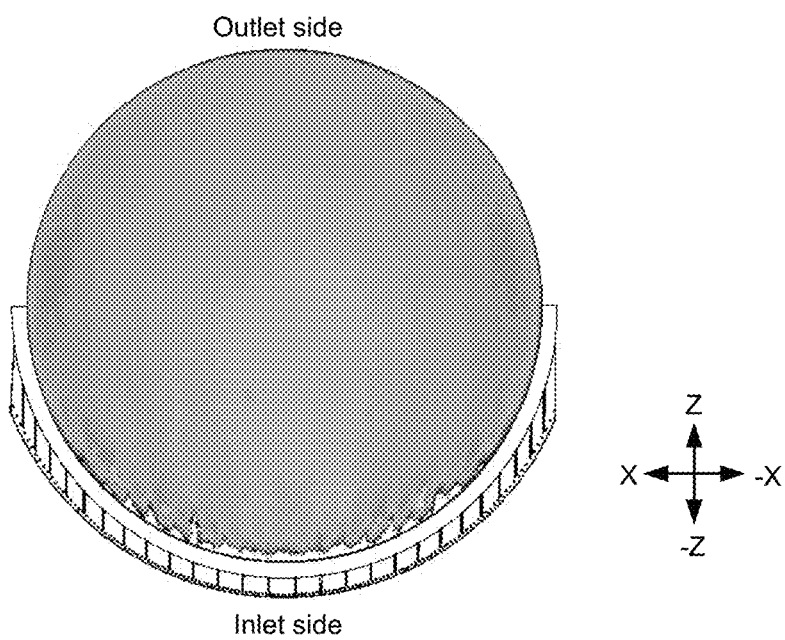

FIGS. 22A-22B illustrate the effect of the angular distribution of cross flow showerhead holes 246 on cross flow uniformity. For both cases, the flow directional fins 266 were positioned in an angularly uniform manner, the cross flow was in the z direction (from the bottom to the top of the page), and the velocity was modeled at a plane 0.2 mm below the wafer plane. Further, for each case, the flow was modeled with 12 L/min total flow, with 9 L/min equally distributed across 139 cross flow showerhead holes 246, and 3 L/min delivered to the CIRP manifold 208.

FIG. 22A depicts the modeled cross flow velocity where the separations between adjacent cross flow showerhead holes 246 are angularly uniform. In this case, the length of the arc between each pair of adjacent showerhead holes 246 is the same. However, the spacing between each pair of holes 246 is non-uniform in the x-direction (the direction perpendicular to the direction of cross flow), because adjacent holes near the center of the inlet will be farther apart compared to adjacent holes near the outer edges of the inlet. This x-direction non-uniformity arises simply due to the projection of angularly uniform holes onto a linear axis. Because the holes 246 near the center of the inlet are farther apart, the cross flow across the center of the electroplating apparatus will be somewhat lower than the cross flow near the edges.

FIG. 22B depicts the modeled cross flow velocity where the separation between adjacent cross flow showerhead holes 246 are not angularly uniform. As compared to the case shown in FIG. 22A, there are more showerhead holes 246 clustered near the center of the inlet 250, and fewer showerhead holes 246 towards the edges of the inlet 250. This results in more uniform separation between adjacent holes 246, as measured in the x-direction (but less uniform separation as measured by the arcs between adjacent holes 246). Because the cross flow originates from these showerhead holes 246 and moves in the z-direction, perpendicular to the x-direction, the uniform spacing of the holes 246 in the x-direction can result in more uniform cross flow velocities across the face of the wafer. Importantly, as compared to the case shown in FIG. 22A, the flow pattern in FIG. 22B is more uniform, and the velocity differences between the center and the edges of the apparatus are minimized.

Other Embodiments

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for electroplating a substrate, the method comprising:
   (a) receiving the substrate in a substrate holder, the substrate being substantially planar, wherein a plating face of the substrate is exposed, and wherein the substrate holder is configured to hold the substrate such that the plating face of the substrate is separated from an anode during electroplating;
   (b) immersing the substrate in electrolyte, wherein a gap of about 10 mm or less is formed between the plating face of the substrate and an upper surface of an ionically resistive element, wherein the ionically resistive element is at least coextensive with the plating face of the substrate, and wherein the ionically resistive element is adapted to provide ionic transport through the ionically resistive element during electroplating;
   (c) flowing electrolyte in contact with the substrate in the substrate holder from a side inlet, into the gap, and out a side outlet, wherein the side inlet and side outlet are positioned proximate azimuthally opposed perimeter locations on the plating face of the substrate, and wherein the side inlet and side outlet are designed or configured to generate cross-flowing electrolyte in the gap during electroplating;
   (d) rotating the substrate holder; and
   (e) electroplating material onto the plating face of the substrate while flowing the electrolyte as in (c).

2. The method of claim 1, wherein the ionically resistive element comprises a cavity that defines, at least partially, a cross flow injection manifold that is arc-shaped and positioned proximate a periphery of the substrate, and wherein the side inlet receives electrolyte from the cross flow injection manifold.

3. The method of claim 1, further comprising positioning a cross flow confinement ring proximate the periphery of the substrate and at least partially between the ionically resistive element and the substrate holder, wherein the cross flow confinement ring at least partially defines a side of the gap.

4. The method of claim 3, wherein the ionically resistive element comprises a cavity that defines, at least partially, a cross flow injection manifold that is arc-shaped and positioned proximate a periphery of the substrate, and wherein the side inlet receives electrolyte from the cross flow injection manifold.

5. The method of claim 1, wherein flowing electrolyte in operation (c) comprises flowing electrolyte at a cross flow velocity of at least about 3 cm/s across a center point on the plating face of the substrate.

6. The method of claim 1, wherein operation (c) further comprises flowing electrolyte from below the ionically resistive element, through the ionically resistive element, into the gap, and out the side outlet, wherein electrolyte exits the ionically resistive element at a velocity of at least about 10 cm/s.

7. The method of claim 1, wherein the side inlet is separated into two or more azimuthally distinct and fluidically separated sections, and wherein the flow of electrolyte to the azimuthally distinct sections of the side inlet are independently controlled.

8. The method of claim 1, wherein the side outlet is separated into two or more azimuthally distinct side outlet sections.

9. The method of claim 8, further comprising flowing electrolyte at different flow rates through at least two of the azimuthally distinct side outlet sections.

10. The method of claim 1, wherein flow directing elements are positioned in the gap, and wherein the flow directing elements cause electrolyte to flow in a substantially linear flow path from the side inlet to the side outlet.

11. The method of claim 10, wherein the flow directing elements are fins.

12. The method of claim 1, wherein a total flow rate of electrolyte into the gap is between about 1-60 L/min.

13. The method of claim 12, wherein the total flow rate of electrolyte into the gap is between about 6-60 L/min.

14. The method of claim 12, wherein the total flow rate of electrolyte into the gap is between about 5-25 L/min.

15. The method of claim 14, wherein the total flow rate of electrolyte into the gap is between about 15-25 L/min.

* * * * *